United States Patent
Funai et al.

[11] Patent Number: 6,162,667
[45] Date of Patent: Dec. 19, 2000

[54] METHOD FOR FABRICATING THIN FILM TRANSISTORS

[75] Inventors: Takashi Funai, Tenri; Naoki Makita, Nara; Yoshitaka Yamamoto, Yamatokoriyama; Tadayoshi Miyamoto; Takamasa Kousai, both of Tenri; Masashi Maekawa, Nara, all of Japan

[73] Assignee: Sharp Kabushiki Kaisha, Japan

[21] Appl. No.: 08/408,869

[22] Filed: Mar. 23, 1995

[30] Foreign Application Priority Data

| Mar. 28, 1994 | [JP] | Japan | 6-057728 |
| Apr. 6, 1994 | [JP] | Japan | 6-068723 |
| Apr. 21, 1994 | [JP] | Japan | 6-083383 |
| Sep. 21, 1994 | [JP] | Japan | 6-227026 |
| Sep. 21, 1994 | [JP] | Japan | 6-227027 |
| Oct. 6, 1994 | [JP] | Japan | 6-243198 |

[51] Int. Cl.$^7$ .......................... H01L 21/00; H01L 27/12; H01L 21/84

[52] U.S. Cl. .......................... 438/166; 438/486; 438/487; 117/8

[58] Field of Search .............................. 437/21, 40 TFT, 437/41 TFT, 101, 233; 117/8; 438/479, 166, 308, 487, 30, 486, FOR 184, FOR 155, FOR 201, FOR 393, FOR 478

[56] References Cited

U.S. PATENT DOCUMENTS

| 5,147,826 | 9/1992 | Liu et al. | 437/233 |
| 5,275,851 | 1/1994 | Fonash et al. | 437/233 |
| 5,481,121 | 1/1996 | Zhang et al. | 257/64 |
| 5,492,843 | 2/1996 | Adachi et al. | 437/21 |
| 5,501,989 | 3/1996 | Takayama et al. | 437/21 |
| 5,529,937 | 6/1996 | Zhang et al. | 437/21 |
| 5,534,716 | 7/1996 | Takemura | 257/72 |
| 5,543,352 | 8/1996 | Ohtani et al. | 438/166 |
| 5,550,070 | 8/1996 | Funai et al. | 437/101 |
| 5,580,792 | 12/1996 | Zhang et al. | 437/10 |
| 5,585,291 | 12/1996 | Ohtani et al. | 437/40 |
| 5,612,250 | 3/1997 | Ohtani et al. | 438/166 |
| 5,643,826 | 7/1997 | Ohtani et al. | 438/166 |
| 5,654,203 | 8/1997 | Ohtani et al. | 438/166 |

FOREIGN PATENT DOCUMENTS

| 62-122172 | 6/1987 | Japan . |
| 3-290924 | 12/1991 | Japan . |
| 4-165613 | 6/1992 | Japan . |
| 5-55142 | 3/1993 | Japan . |
| 94-22921 | 3/1993 | Japan . |
| 5-136048 | 6/1993 | Japan . |
| 6-244205 | 9/1994 | Japan . |
| 6-260651 | 9/1994 | Japan . |
| 6-268212 | 9/1994 | Japan . |
| 94-20596 | 9/1994 | Japan . |
| 95-7160 | 3/1995 | Japan . |

OTHER PUBLICATIONS

Choi et al, "The Effects of Grain Boundary on Excimer–Laser–Crystallized Poly–Si TFT Characteristics", Extended Abstract of Applied Physics Society, vol. 2, 1993.

*Primary Examiner*—Mary Wilczewski
*Attorney, Agent, or Firm*—Nixon & Vanderhye

[57] ABSTRACT

In a fabrication of a semiconductor device, an amorphous semiconductor film is first formed on a substrate having an insulating surface. Then, a minute amount of catalyst elements for accelerating crystallization of the amorphous semiconductor film is supplied to at least a portion of a surface of the amorphous semiconductor film. A heat treatment is further conducted so that the supplied catalyst elements are diffused into the amorphous semiconductor film. Thus, the catalyst elements are introduced uniformly into the amorphous semiconductor film in a very minute amount or at a low concentration, resulting in polycrystallization of at least a portion of the amorphous semiconductor film. Utilizing the thus obtained crystalline semiconductor film on the substrate surface as an active region, a semiconductor device such as a TFT is fabricated. The introduction of the catalyst elements are conducted by various methods such as: a formation of a film containing a minute amount of the catalyst elements; application of a solution containing the catalyst elements in several spin coating cycles; diffusion of the catalyst elements through a buffer layer; dipping into a solution in which the catalyst elements are dissolved or dispersed; or formation of a plating layer containing the catalyst elements.

16 Claims, 26 Drawing Sheets

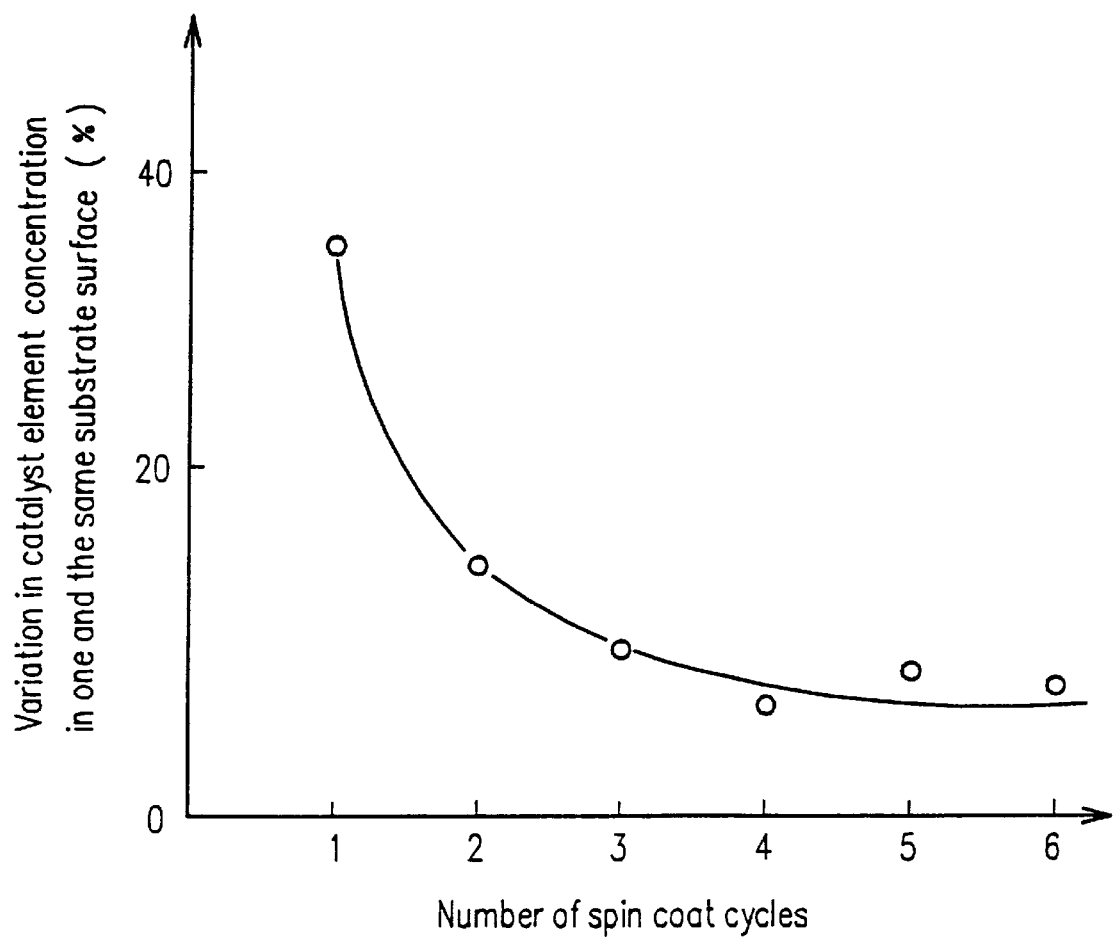

n-TFT     p-TFT

METHOD FOR FABRICATING THIN FILM TRANSISTORS

BACKGROUND OF THE INVENTION

1. Field of the Invention

The present invention relates to a semiconductor device and a method for fabricating the same. In particular, the present invention relates to a semiconductor device using thin film transistors formed on a glass or other insulating substrates and to a method for fabricating the same. More specifically, the present invention relates to a semiconductor substrate having a crystalline silicon film crystallized from an amorphous silicon film formed on a substrate having an insulating surface, to a semiconductor device utilizing the thus obtained crystalline silicon film as an active region, and to a method for fabricating such a semiconductor substrate and a semiconductor device. In particular, such a method is applicable to fabrication of an active matrix type liquid crystal display device, an image sensor, a three-dimensional IC and the like.

2. Description of the Related Art

Recently, it has been attempted to form semiconductor elements having good performance on insulating substrates, made of materials such as glass, or on insulating films which are formed on a surface of a substrate, for realizing large liquid crystal display devices having a high resolution, close-contact type image sensors having a high resolution with high speed, or three-dimensional ICs and the like. In general, thin film transistors (TFTs) are used for driving pixels in active matrix type liquid crystal display devices, image sensors and the like. Generally, the TFTs used in these apparatuses are formed from silicon semiconductor thin films.

Such silicon semiconductor thin films are roughly classified into two types: amorphous silicon (a-Si) semiconductor films and crystalline silicon semiconductor films.

Of these two types, the amorphous silicon semiconductor film is preferred and enjoys general uses because it has a low processing temperature and is easily manufactured using a vapor deposition method, thus lending itself to mass production. Compared to the crystalline silicon semiconductor film, however, the amorphous silicon semiconductor film is inferior in properties such as electrical conductivity. It is therefore strongly desired to establish an efficient fabrication method for TFTs formed from the crystalline silicon semiconductor films to achieve faster response characteristics of the semiconductor devices fabricated from them.

The crystalline silicon semiconductor films currently known include polycrystalline silicon, micro-crystalline silicon, amorphous silicon containing crystalline components, semi-amorphous silicon having an intermediate state between crystalline and amorphous forms, etc. The following three methods are known for the production of these thin film crystalline silicon semiconductors.

(1) A first method in which a crystalline silicon semiconductor film is directly formed in a film deposition step.

(2) A second method in which an amorphous semiconductor film is first formed, followed by laser radiation to crystallize the amorphous silicon film by the laser's optical energy.

(3) A third method in which an amorphous semiconductor film is first formed, followed by application of heat energy to crystallize the amorphous silicon film.

However, the above methods have the following disadvantages.

According to the first method, since the crystallization proceeds during the deposition step, a thick silicon film must be formed to obtain a crystalline silicon film with a large grain size. Consequently, it is technically difficult to form a film having good semiconductor properties uniformly over the entire surface of the substrate. Furthermore, since the film needs to be deposited at high temperatures of 600° C. or more, this introduces disadvantages in cost in that inexpensive glass substrates cannot be used since they have low softening temperatures.

The second method utilizes the crystallization in the melting and solidification processes, and allows the formation of a high-quality silicon film with a small grain size and yet having properly treated grain boundaries. However, with the lasers commonly used today, such as the excimer lasers for example, the processing throughput is low because the effective laser beam radiation area is small. A further disadvantage is that the stability of lasers is not sufficient to uniformly process over the entire surface of a large substrate.

The third method, which crystallizes silicon in solid phase by using heat energy, has an advantage over the first and second methods in that a thin-film crystalline silicon film can be formed uniformly over a large substrate. Examples of this method are disclosed in Japanese Laid-Open Patent Publication Nos. 62-122172, 3-290924, and 4-165613. According to the methods disclosed therein, however, all of the methods require a heat treatment at high temperatures of 600° C. or more for several tens of hours to accomplish crystallization. Therefore, to allow the use of inexpensive glass substrates and to increase the processing throughput, contradicting requirements need to be satisfied simultaneously, i.e, to lower the processing temperature and to accomplish crystallization in a short period of time. Furthermore, since all of these methods utilize the solid-phase crystallization, crystal grains spread in parallel to the substrate surface and crystals having a grain size of a few micrometers may be formed. During this crystal growth process, grain boundaries are formed while the growing crystal grains are colliding with one another, resulting in the grain boundaries having lattice defects. Consequently, the grain boundaries act as carrier traps and as a result, a carrier mobility in the resultant TFTs decreases.

Thus, in order to solve the problems in the crystal grain boundaries utilizing the third method described above, the following fourth and fifth methods have been proposed.

In the fourth method, impurity ions such as silicon ($Si^+$) are introduced into the amorphous silicon film by ion implantation or the like and, by a subsequent heat treatment, a polycrystalline silicon film having crystal grains a size of about a few micrometers is formed (Japanese Laid-Open Patent Publication No. 5-55142). In the fifth method, silicon grains of sizes from 10 to 100 nm are sprayed over the amorphous silicon film with pressurized nitrogen gas, thus forming the crystal nuclei (Japanese Laid-Open Patent Publication No. 5-136048).

In both methods, after selectively introducing foreign substances serving as nuclei of crystal growth in a predetermined region of the amorphous silicon film, crystal growth proceeds using the foreign substances as nuclei by heat treatment, thereby obtaining a crystalline silicon film of a large grain size. Then, a semiconductor device such as a TFT is formed by utilizing the obtained crystalline silicon film.

According to the fourth and fifth methods, introduced foreign substances act only as nuclei for crystal growth.

Thus, the methods are effective for generating the nuclei during the crystal growth and controlling the direction of crystal growth. However, the above described problems in a heat treatment process for crystallization still remain. For example, in the fourth method, crystallization is performed by heat treatment at a temperature of 600° C. for 40 hours. In the fifth method, a heat treatment is performed at a temperature of 650° C. or more. Since the heating is performed at a high temperature as described above, these techniques are effective for a SOI (Semiconductor on Insulator) substrate or a SOS (Semiconductor on Sapphire) substrate. However, it is difficult to apply these techniques to low-cost glass substrates. For example, the distortion temperature for Corning 7059 glass, which is commonly used in active-matrix liquid-crystal display devices, is 593° C. Thus, in the case where a liquid crystal display device having a large area is fabricated using this particular substrate by the above method, the substrate is likely to be deformed by heating at temperature of 600° C. or more.

Furthermore, in connection with the above third method, that is, the method for crystallizing an amorphous silicon film utilizing heating treatment, Japanese Laid-Open Patent Publication No. 6-244205 published on Sep. 2, 1994 and Japanese Laid-Open Patent Publication No. 6-260651 published on Sep. 16, 1994 each discloses that the crystallization process can be realized at a low temperature for a short period of time by introducing heavy metal elements such as nickel, iron, cobalt and platinum into the amorphous silicon film as catalyst elements. Moreover, Japanese Laid-Open Patent Publication No. 6-268212 published on Sep. 22, 1994 teaches the optimum minimum concentration of the catalyst elements in the silicon film in connection with the above methods.

However, there still remain the problems to be solved in order to apply the methods disclosed above to formation of the crystalline silicon film over the large substrate and fabrication of the semiconductor device using the resultant semiconductor substrate.

SUMMARY OF THE INVENTION

A method for fabricating a semiconductor device of the invention includes the steps of: (a) forming an amorphous semiconductor film on a substrate having an insulating surface; (b) supplying a minute amount of a catalyst element for accelerating crystallization of the amorphous semiconductor film to at least a portion of a surface of the amorphous semiconductor film; and (c) conducting a heat treatment so as to introduce the supplied catalyst element into the amorphous semiconductor film in a diffused manner and to polycrystallize at least a portion of the amorphous semiconductor film.

In one embodiment, the step (b) further includes the step of forming a predetermined layer containing a minute amount of the catalyst element on at least a portion of the surface of the amorphous semiconductor film.

In another embodiment, the method further includes, prior to the step (b), the step of forming a buffer layer between the amorphous semiconductor film and the predetermined layer, the buffer layer having an opening at a predetermined position and restraining diffusion of the catalyst element.

In still another embodiment, the method further includes, after the step (b), the step of forming an island region by patterning the predetermined layer, wherein the catalyst element is selectively introduced from the island region of the predetermined layer in the step (c).

In still another embodiment, the predetermined layer is an insulating film which is formed by a spin-on-glass technique. Alternatively, the predetermined layer is an insulating film which is formed by a sputtering technique. Alternatively, the predetermined layer is an insulating film which is formed by an electron beam deposition technique. Alternatively, the predetermined layer is an insulating film which is formed by an electrodeposition technique.

In still another embodiment, a concentration of the catalyst element in the predetermined layer is in a range of $1 \times 10^{18}$ to $1 \times 10^{20}$ atoms/cm$^3$.

In still another embodiment, the step (b) further includes the step of forming a photosensitive material containing a minute amount of the catalyst element in an island pattern on the surface of the amorphous semiconductor film, wherein the catalyst element is selectively introduced from the islandized photosensitive material in the step (c).

In still another embodiment, wherein the amorphous semiconductor film is an amorphous silicon film.

In still another embodiment, the catalyst element is at least one element selected from a group consisting of Ni, Co, Pd, Pt, Fe, Cu, Ag, Au, In, Sn, P, As and Sb.

In still another embodiment, the step (b) further includes the step of applying a solution containing the catalyst element onto at least a portion of the surface of the amorphous semiconductor film by a plurality of spin coat cycles. Preferably, the method further includes the steps of, prior to the step (b): forming a buffer layer for restraining diffusion of the catalyst element on the surface of the amorphous semiconductor film; and forming an opening at a predetermined position of the buffer layer, wherein the solution is applied to a region of the amorphous semiconductor region which is exposed through the opening.

In still another embodiment, the method further includes the step of forming a semiconductor device on the crystalline semiconductor film, at least a portion of which is polycrystallized, so that a carrier moving direction is substantially parallel to a crystal growth direction of the amorphous semiconductor film. Alternatively, the method further includes the step of forming a semiconductor device on the crystalline semiconductor film, at least a portion of which is polycrystallized, so that a carrier moving direction is substantially perpendicular to a crystal growth direction of the amorphous semiconductor film.

In still another embodiment, the method further includes the step of forming a thin film transistor utilizing the crystalline semiconductor film, at least a portion of which is polycrystallized, as an active region.

In still another embodiment, the method further includes, after the step (a), the step of forming a buffer layer for preventing diffusion of the catalyst element on the amorphous semiconductor film, wherein a thin film containing the catalyst element is formed on the buffer layer in the step (b), and the catalyst element is diffused into the amorphous semiconductor film through the buffer layer in the step (c).

In still another embodiment, the catalyst element is selectively introduced into a predetermined region of the amorphous semiconductor film through the buffer layer in the step (c), thereby selectively crystallizing the predetermined region of the amorphous silicon film, and crystal growth proceeds in a direction substantially parallel to a surface of the substrate in a periphery of the predetermined region of the amorphous semiconductor film, thereby forming a lateral crystal growth region.

In still another embodiment, the method further includes, after the step (c), the step of radiating a laser light or an intense light onto the crystallized semiconductor film so as to improve crystallinity thereof.

In still another embodiment, the buffer layer is formed of a silicon oxide film or a silicon nitride film. Preferably, the silicon oxide film or the silicon nitride film is formed by conducting thin film oxidation or thin film nitridization of the surface of the amorphous semiconductor film.

In still another embodiment, the thin film is formed by a deposition technique.

In still another embodiment, the step (b) further includes the step of exposing at least a portion of the amorphous semiconductor film or an underlaying film thereof to an alkaline solution in which the catalyst element is dissolved or dispersed.

In still another embodiment, the catalyst element is selectively introduced into a predetermined region of the amorphous semiconductor film in the step (c), thereby selectively crystallizing the predetermined region of the amorphous semiconductor film, and crystal growth proceeds in a direction substantially parallel to a surface of the substrate in a periphery of the predetermined region of the amorphous semiconductor film, thereby forming a lateral crystal growth region.

In still another embodiment, the method further includes, after the step (c), the step of radiating a laser light or an intense light onto the crystallized semiconductor film so as to improve crystallinity thereof.

In still another embodiment, the exposing step further includes the step of dipping the substrate into the alkaline solution.

In still another embodiment, the method further includes, following the exposing step, the step of washing the exposed portion of the amorphous semiconductor film exposed to the alkaline solution with pure water.

In still another embodiment, the step (b) further includes the step of exposing the surface of the amorphous semiconductor film to a plating solution containing the catalyst element so as to form a thin film plated layer of the catalyst element on at least a portion of the surface of the amorphous semiconductor film.

In still another embodiment, the method further includes, prior to the plating step, the step of forming a mask layer having an opening at a predetermined position on the amorphous silicon film, wherein the thin film plated layer is selectively formed on a predetermined region of the amorphous semiconductor film, which is exposed through the opening in the plating plate, and in the step (c), the catalyst element is selectively introduced into the predetermined region of the amorphous semiconductor film, thereby selectively crystallizing the predetermined region of the amorphous semiconductor film, and crystal growth proceeds in a direction substantially parallel to a surface of the substrate in a periphery of the predetermined region of the amorphous semiconductor film, thereby forming a lateral crystal growth region. Preferably, the plating solution is an electroless plating solution containing the catalyst element. Preferably, the mask layer is formed of a photosensitive resin.

In still another embodiment, a plating rate of the amorphous semiconductor film in the plating step is 3 nm/minute or less.

In still another embodiment, the method further includes, after the step (c), the step of radiating a laser light or an intense light onto the crystallized semiconductor film so as to improve crystallinity thereof.

According to another aspect of the invention, a method for fabricating a semiconductor substrate includes: a step of forming an amorphous semiconductor film on a substrate having an insulating surface; a first introduction step of applying a solution containing a catalyst element for accelerating crystallization of the amorphous semiconductor film onto at least a portion of a surface of the amorphous silicon film by one spin coat cycle; a first heat treatment step of heating the amorphous semiconductor film at a first heating temperature lower than a temperature at which the amorphous semiconductor film begins to be crystallized; a second introduction step of re-applying the solution containing the catalyst element onto at least a portion of the surface of the amorphous silicon film by at least one spin coat cycle; and a second heat treatment step of heating the amorphous semiconductor film at a second heating temperature higher than the temperature at which the amorphous semiconductor film begins to be crystallized.

Preferably, the first heating temperature is in a range of 200 to 480° C. Preferably, the second heating temperature is in a range of 550 to 580° C.

In one embodiment, a concentration of the catalyst element contained in the solution during the first introduction step is set to be lower than a concentration required for causing crystallization of the amorphous semiconductor film.

In another embodiment, the method further includes the step of forming a semiconductor device on the crystalline semiconductor film, at least a portion of which is polycrystallized, so that a carrier moving direction is substantially parallel to a crystal growth direction of the amorphous semiconductor film. Alternatively, the method further includes the step of forming a semiconductor device on the crystalline semiconductor film, at least a portion of which is polycrystallized, so that a carrier moving direction is substantially perpendicular to a crystal growth direction of the amorphous semiconductor film.

In still another embodiment, the method further includes the step of forming a thin film transistor utilizing the crystalline semiconductor film, at least a portion of which is polycrystallized, as an active region.

According to still another aspect of the invention, a method for fabricating a semiconductor device includes the steps of: (a) forming an amorphous semiconductor film on a substrate having an insulating surface; (b) depositing a thin film containing a minute amount of a catalyst element for accelerating the amorphous semiconductor film so that the thin film is in contact with at least a portion of one of an upper surface and a lower surface of the amorphous semiconductor film; (c) conducting a heat treatment so as to introduce the catalyst element from the thin film into the amorphous semiconductor film in a diffused manner and to crystallize at least a portion of the amorphous semiconductor film; (d) radiating a laser light or an intense light on the crystallized semiconductor film so as to improve crystallinity thereof; and (e) forming a semiconductor device using the crystallized semiconductor film as an active region.

In one embodiment, the thin film is in contact with a predetermined region of the amorphous semiconductor film by selective deposition in the step (b), and crystal growth proceeds in a direction substantially parallel to the surface of the substrate in a periphery of the predetermined region of the amorphous semiconductor film in the step (c), thereby forming a lateral crystal growth region.

In another embodiment, a distance between a deposition source containing the catalyst element and the substrate is set to 20 cm or more in the step (b).

In still another embodiment, the deposition is performed while providing a shielding plate between a deposition source containing the catalyst element and the substrate in the step (b), the shielding plate preventing a large amount of the catalyst element from being deposited on the substrate.

In still another embodiment, the catalyst element is at least one element selected from a group consisting of Ni, Co, Pd, Pt, Fe, Cu, Ag, Au, In, Sn, P, As and Sb.

A semiconductor device of the invention includes: a substrate having an insulating surface; and an active region obtained by crystallization of an amorphous semiconductor film formed on the insulating surface of the substrate, wherein the active region contains a catalyst element for accelerating the crystallization of the amorphous semiconductor film, and the catalyst element is introduced into the amorphous semiconductor film by a predetermined method.

In one embodiment, the catalyst element is selectively introduced into a predetermined region of the amorphous semiconductor film, and the active region is a portion of a lateral crystal growth region generated by crystal growth which is caused in a substantially parallel to the surface of the substrate in a periphery of the predetermined region of the amorphous semiconductor film.

In another embodiment, the crystallized semiconductor film has crystallinity improved by radiation of a laser light or an intense light.

In still another embodiment, the catalyst element is at least one element selected from a group consisting of Ni, Co, Pd, Pt, Fe, Cu, Ag, Au, In, Sn, P, As and Sb.

In still another embodiment, a concentration of the catalyst element in the active region is in a range of $1 \times 10^{15}$ to $1 \times 10^{19}$ atoms/cm$^3$.

In still another embodiment, the catalyst element is introduced into the amorphous semiconductor film by thermal diffusion from a thin film containing the catalyst element through a buffer layer for restraining diffusion of the catalyst element. Preferably, the buffer layer has a diffusion coefficient with respect to the catalyst element which is one-tenth or less of that of the amorphous semiconductor film. Preferably, the buffer layer is formed of a silicon oxide film or a silicon nitride film.

In still another embodiment, the catalyst element is introduced into the amorphous semiconductor film by exposing the amorphous semiconductor film or an underlaying film thereof to an alkaline solution containing the catalyst element.

In still another embodiment, the catalyst element is adsorbed onto the surface of the amorphous semiconductor film in an ionic state.

In still another embodiment, a pH value of the alkaline solution is in a range of 8 to 14. Preferably, a pH value of the alkaline solution is in a range of 9 to 12.

In still another embodiment, the alkaline solution contains an aqueous ammonia as a main component. Alternatively, the alkaline solution is a mixture of an aqueous ammonia and a hydrogen peroxide solution.

In still another embodiment, the catalyst element is introduced into the amorphous semiconductor film by a plating treatment. Preferably, the plating treatment is an electroless plating treatment in which the amorphous silicon film acts as a reaction catalyst.

According to another aspect of the invention, in a semiconductor device, an active region, formed of a semiconductor film having crystallinity, is formed on a substrate having an insulating surface, wherein the active region is obtained by crystal growth due to heat treatment, and laser light irradiation or intense light irradiation after introducing a minute amount of a catalyst element for accelerating crystallization of an amorphous semiconductor film into at least a portion of the amorphous semiconductor film by a deposition technique.

In one embodiment, the catalyst element is selectively introduced into a predetermined region of the amorphous semiconductor film, and the active region is obtained by crystal growth caused in a direction substantially parallel to the surface of the substrate in a periphery of the predetermined region of the amorphous semiconductor film due to the heat treatment, and the laser light irradiation or the intense light irradiation.

In another embodiment, the catalyst element is at least one element selected from a group consisting of Ni, Co, Pd, Pt, Fe, Cu, Ag, Au, In, Sn, P, As and Sb.

In still another embodiment, a concentration of the catalyst element in the active region is in a range of $1 \times 10^{16}$ to $1 \times 10^{19}$ atoms/cm$^3$.

Thus, the invention described herein makes possible the advantages of providing (1) a method for fabricating a semiconductor device, in which a crystal-line semiconductor film is formed on a substrate by uniformly introducing catalyst elements for accelerating crystallization of an amorphous semiconductor film into an entire surface of the amorphous semiconductor film at a low concentration or with a minute amount, (2) a method for fabricating a semiconductor device, which is capable of uniformly introducing catalyst elements at a low concentration into a substrate having a large area and forming a crystalline silicon film of high quality, which has higher crystallinity than that obtained by a conventional heat treatment, on the substrate with high stability and reproductivity by heat treatment at 600° C. or less for a short period of time, (3) a method for fabricating a semiconductor device, in which a thin film transistor is formed by using the obtained crystalline semiconductor film as an active region, and (4) a semiconductor device fabricated in accordance with the above-mentioned methods.

These and other advantages of the present invention will become apparent to those skilled in the art upon reading and understanding the following detailed description with reference to the accompanying figures.

BRIEF DESCRIPTION OF THE DRAWINGS

FIG. 9 is a graph showing a relationship between the number of spin coat cycles and variation in a concentration of catalyst elements in one and the same substrate surface.

DESCRIPTION OF THE PREFERRED EMBODIMENTS

Figure 1A:
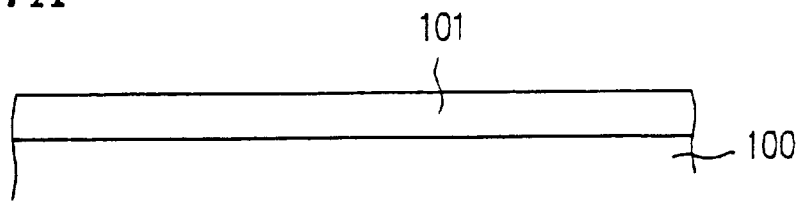
FIGS. 1A through 1E are cross-sectional views illustrating a method for fabricating a semiconductor device according to Example 1 of the present invention.

Before explaining the preferred embodiments of the present invention, a method for fabricating a crystalline silicon thin film, proposed by the inventors of the present invention, will be explained. The method achieves reductions both in the processing temperature necessary for crystallization and in the treatment time and which minimizes influences of the grain boundaries. It should be noted here that this proposed method is a technique that constitutes the basis for the present invention as the method to solve, to some extent, the aforementioned disadvantages of the conventional techniques. The similar methods are disclosed in Japanese Laid-Open Patent Publication Nos. 6-244205, 6-260651 and 6-268212, as described above.

This proposed method achieves drastic improvements both in a nucleus generation speed in the early stage of crystallization and in a nucleus growth speed in subsequent stages by introducing Ni, Pd, Pb or other impurity metal elements into an amorphous silicon film as nuclei for crystal growth. With this method, sufficient crystallinity can be obtained by heat treatment for four hours at temperatures not higher than 580° C., for example, 550° C.; something which has not been possible with the conventional techniques.

The mechanism for the method is as follows. First, crystal nuclei with the impurity metal elements as their nuclei are generated in the early stage of the heating process. After that, the impurity metal elements act as catalysts to accelerate the crystallization, and the crystal growth proceeds rapidly. In this sense, such impurity metal elements are hereinafter referred to as the catalyst elements.

While the crystalline silicon films obtained by crystallizing amorphous silicon films using ordinary solid-phase growth methods have a twin crystal structure, the crystalline silicon film obtained by accelerating the crystallization using the catalyst elements, as described above, is formed from numerous needle-like or column-like crystals. Furthermore, an internal structure of each of the needle-like or column-like crystals is in an ideal single crystalline state.

Furthermore, by introducing the catalyst elements into selected regions of the substrate, crystalline silicon films and amorphous silicon films can be formed selectively in respectively designated regions on the same substrate. When the heat treatment is further continued, a phenomenon occurs where the crystallized regions laterally grow toward the surrounding amorphous regions from the regions in which the catalyst elements are selectively introduced, i.e., in directions parallel to the substrate surface. These crystallized regions grown in the lateral directions are hereinafter referred to as the lateral growth regions.

In the lateral growth regions, the needle-like or column-like crystals extend along the growth direction in parallel to the substrate surface, and no grain boundaries exist in the growth direction. Therefore, by forming TFT channel regions using the lateral growth regions, high-performance TFTs can be formed. More specifically, when the TFTs are fabricated by using such lateral growth regions as their active regions, a field-effect mobility improves by a factor of about 1.2, compared to that of the TFTs that use crystalline silicon films formed by the ordinary solid-phase growth techniques.

While there exist the needle-like or column-like crystals extending along one growth direction in the lateral crystal growth regions, crystal nuclei are generated in a random manner in the region into which the catalyst elements are directly introduced. Thus, the former lateral crystal growth region has remarkably excellent crystallinity as compared with the latter region to which the catalyst elements are introduced.

During the lateral crystal growth, the catalyst elements contributing to crystallization are present at the tips of the needle-like or column-like crystals, that is, the tips of the regions where crystals grow. In other words, if the catalyst elements effectively function for crystallization, the catalyst elements are present only in the crystal growing regions where the crystals are in the process of growing, and are scarcely present in the lateral crystal growth regions where the crystallization is completed. Thus, the concentration of the catalyst elements in the crystalline silicon film which has laterally grown is reduced by about one digit or more as compared with that of the region which is crystallized by directly introducing the catalyst elements. With this process, the catalyst elements in the crystalline silicon film are prevented from adversely affecting characteristics of a semiconductor element to be formed. Consequently, using the thus obtained lateral crystal growth region as an active region of a semiconductor device has great advantages.

Furthermore, by exposing the crystallized semiconductor film to laser or other intense light after crystallization, the crystallinity thereof further improves, and a higher mobility can be obtained. That is, when the lateral growth regions are exposed to the laser or other intense light, the grain boundaries are treated in concentrated manner because of the difference in melting points between the crystalline silicon film and the amorphous silicon film. In the crystalline silicon films formed by the ordinary solid-phase growth methods, where such films have the twin crystal structure, untreated portions will remain as crystal defects in the grain boundaries after the exposure to laser or other intense light. By contrast, the lateral growth regions crystallized by introducing the catalyst elements as described above are formed from the needle-like or column-like crystals, and the internal structure thereof is in the single crystalline state. Therefore, when the grain boundaries are treated by the exposure to laser or other intense light, a crystalline silicon film substantially in a single crystalline state can be obtained.

With the above described techniques, it is possible to obtain TFTs having high performance while reducing the heating temperature during the crystallization and reducing the time period for treatment in the lateral crystal growth technique. Furthermore, the TFTs for various requirements can be separately fabricated on one and the same substrate.

The following methods can be applied as a method for introducing the catalyst elements into the amorphous silicon film.

(a) After depositing a compound film made of catalyst elements and silicon or a catalyst element film on the amorphous silicon film by sputtering or the like, the catalyst elements are diffused in the amorphous silicon film by heating. The catalyst element film or the compound film thereof may be directly deposited on the surface of the amorphous silicon. Alternatively, after forming a mask for selective introduction, the catalyst element film or the compound film may be deposited by using the mask.

(b) After depositing catalyst elements on the surface of the amorphous silicon film by performing plasma treatment in a plasma chamber having an electrode made of the catalyst elements, the catalyst elements are diffused in the amorphous silicon film by heat treatment. The catalyst element film or the compound film thereof may be directly deposited on the surface of the amorphous silicon. Alternatively, after forming a mask for selective introduction, the catalyst element film or the compound film may be deposited by using the mask. Specifically, in the plasma treatment, for example, the catalyst element film or the compound film thereof is deposited on the amorphous silicon film by producing plasma in a nitride atmosphere or an oxygen atmosphere using materials containing the catalyst elements for an electrode of a plasma CVD device.

(c) The catalyst elements are introduced into the amorphous silicon film by ion doping. The catalyst elements may be directly introduced, or may be introduced by using a mask after forming the mask for selective introduction.

The catalyst elements serve to accelerate polycrystallization of the amorphous silicon film as described above. On the other hand, however, existence of a large amount of the above-explained catalyst elements in the semiconductor film is not preferable since it may have adverse affects on the reliability and electrical stability of a semiconductor element and a semiconductor device which is to be formed using the thus obtained crystallized semiconductor film. For example, the leak current during OFF period is increased in TFTs produced with the high concentration of the catalyst elements, thereby deteriorating the TFT characteristics.

In other words, while the above described catalyst elements for accelerating the crystallization such as nickel are necessary for crystallization of the amorphous silicon film, it is preferred that the amount of the catalyst elements contained in the crystallized silicon film remains as small as possible. In order to attain the above objective, it is necessary to select the catalyst elements having a strong tendency of being inert in the crystalline silicon film as well as to reduce the amount of the catalyst elements introduced to be as small as possible so as to achieve crystallization with the minimum introduction amount. For these purposes, it is necessary to precisely control the amount of the catalyst elements to be introduced as well as to control the amount of the catalyst elements so that the introduction amount becomes uniform in the substrate during the introduction step. Moreover, it is essential to secure the stability (repeatability) of the amount of the catalyst elements to be introduced between different substrates, that is, minimize variation in introduction amounts of catalyst elements between the different substrates to be treated.

Furthermore, since the crystal growth rate depends upon the introduction concentration of the catalyst elements, variation may occur in the crystal growth state in one and the same substrate surface if the silicon is polycrystallized in the state where the catalyst elements have not been uniformly introduced into the entire substrate. If the TFTs are fabricated with the substrate having variation, TFT characteristics may also vary. This may cause the critical problem in the case where a liquid crystal display device and the like, which strongly requires uniformness of TFT characteristics in one and the same surface, is fabricated.

In view of the above points, there are the following two important factors in connection with the introduction of the catalyst elements into the amorphous silicon film: an introduction amount is extremely small; and an introduction amount can be controlled so as to be uniform over a large area. Each of the aforementioned introduction methods is examined as follows from the above two viewpoints. In the case of the method shown in (a), it is technically difficult to uniformly control the thickness of the film deposited by sputtering over a large area. The method shown in (b) is fundamentally the same as the sputtering of (a), and therefore, it is technically difficult to sufficiently control a thickness of the film to be deposited. In the case of the method in (c), the amount of introduced catalyst elements are small. Hence, it is difficult to accurately control an introduction amount with a conventional method.

As described above, it is difficult to introduce a minute amount of the catalyst elements for accelerating the crystallization into the amorphous silicon film while precisely controlling a minute introduction amount thereof.

Furthermore, in the case where nickels are used as the catalyst elements, the crystallization is examined in detail in the process for fabricating a crystalline silicon film by introducing nickels into the deposited amorphous silicon film by a plasma treatment method, as the method (b) described above. As a result, the following facts are discovered.

(1) In the case where nickels are introduced into the amorphous silicon film, nickels reach a considerably deep portion in the amorphous silicon film before the commencement of a heat treatment.

(2) In the early stage of the crystal growth, the growth nuclei are generated from the surface of the region in which nickels are introduced.

(3) When the laser light is radiated on the crystalline silicon film which is crystallized by introducing nickels into the amorphous silicon film by plasma treatment, excessive nickels are precipitated on the surface of the crystalline silicon film.

From the above facts, it is concluded that all of the nickels introduced by plasma treatment do not function effectively. In other words, even if the amount of introduced nickels is large, some of the nickels will not sufficiently function as catalysts for the crystallization.

Furthermore, it can be seen that the location at which the nickels actually function as catalysts in the low temperature crystallization process is a contacting point or a contacting face where nickels and silicon are in contact with each other. In consideration of the above fact, the introduced nickels need to diffuse in an atomic form in as minute an amount as possible.

Thus, an important point in the above process is to introduce nickels in the atomic form at a concentration as low as possible to such an extent that the low-temperature crystallization is realized, only into the vicinity of the surface of the amorphous silicon film.

In view of the above discussions, an introduction method in which the catalyst elements deeply enter the amorphous silicon film is not suitable. The formation of the thin film by sputtering according to the above (a) and the introduction of the catalyst elements by ion implantation according to the above (c) have the same problems as that of the plasma treatment described above.

A vacuum deposition method is available as a method for forming the catalyst elements as a thin film and capable of introducing the catalyst element only into the vicinity of the surface of the amorphous silicon film alone. However, the amount of catalyst elements necessary for crystallizing the amorphous silicon film correspond to an extremely thin film (thickness: 1 nm or less) which is invisible to the naked eye. In the introduction of the catalyst elements into the amorphous silicon film, it is extremely difficult to precisely control the introduced amount having such a low concentration by the vacuum deposition.

Furthermore, as another method for effectively introducing an extremely minute amount of the catalyst elements for accelerating the crystallization, such as nickels and the like, only into the vicinity of the surface of the amorphus silicon film; a spin coat method for applying a solution, in which the catalyst elements are dissolved, onto a surface of the amorphous silicon film by a spinner is available. In this method, the solution in which the catalyst elements are dissolved is applied onto the surface of the amorphous silicon film generally with one spin coat process. It is possible to easily control the amount of introduced nickels into the amorphous silicon film by controlling the nickel concentration in the solution. It is also possible to introduce just a necessary and minimum amount of the catalyst elements for crystallization. Furthermore, in the case where the laser light is radiated onto the crystalline silicon film thus crystallized, nickels are not precipitated. As a result, a crystalline silicon film of good quality is obtained. Furthermore, a vacuum apparatus is not required.

However, the above method for applying the solution in which the catalyst elements are dissolved onto the surface of the amorphous silicon film with a spinner has a problem that uniformness of the amount of catalyst elements to be introduced in the substrate is insufficient for the following reasons.

In this method using the spinner, if the catalyst element is, for example, nickel; then a nickel salt such as nickel nitride or nickel acetate is used as a solution and water or ethanol is used as a solvent. In the case where the solvent is spin-coated onto the surface of the amorphous silicon film, the actual treatment is not spin coat in the strict sense. The catalyst elements in the solution are precipitated on the surface of the amorphous silicon film by a dried state generated with spin. Thus, the reaction which actually occurs in the method is not "application". More precisely, the catalyst elements present in a form of ions in the solution are precipitated on the surface of the amorphous silicon film and left thereon. With this method, unevenly dried solution leads to unevenness in the amount of introduced catalyst elements, and further to unevenness in crystallinity of the crystalline silicon film obtained by heating. The uniformness herein includes the macro-unevenness of the crystallinity due to effect of the spinner and the micro-unevenness due to minute residual drops of water (of the order of micrometers) during a drying process.

In this method, with what degree of uniformity the solution containing the catalyst elements dropped on the surface of the amorphous silicon film is dried by the spinner, while being in contact with the surface, is an important factor. Therefore, wettability of the solution with respect to the surface of the amorphous silicon film becomes important. Accordingly, additional steps such as thin-film oxidation of the surface of the amorphous silicon film are required to improve the wettability. In addition, since parameters affecting the amount of the introduced metal elements are further increased, stability of the treatment is lowered.

As a specific treatment for carrying out the method, there exist various methods such as a method for uniformly applying the solution with a spinner and for drying the solution, a method for directly dipping the substrate into the solution and drying the solution by an air knife and the like. In any case, however, the macro-unevenness of the actual amount of the introduced metal element is ±10–20% in the substrate having a side of 127 mm long.

Furthermore, in the case where the catalyst elements are selectively introduced into the amorphous silicon film by the above method so as to laterally grow the crystallized regions, the following new problems are generated.

As a mask layer for selectively introducing the catalyst elements into the amorphous silicon film, a silicon oxide film is generally used. For example, with the above method, the catalyst elements are selectively introduced into the region of the amorphous silicon film which is exposed inside a through hole of the silicon oxide film (an opening of the mask layer) by applying the catalyst elements on the entire surface of the substrate via the mask layer and subsequently heating the substrate. With this method, however, the catalyst elements, which are present in the surface of the silicon oxide film (mask layer) other than the opening, gradually diffuse into the silicon oxide film in accordance with time. Thus, if the heating is continued over a certain period of time, the catalyst elements reach the amorphous silicon film even below the silicon oxide film, i.e., the region which should be masked, and the crystal nuclei are generated there at random. In particular, if the silicon oxide film as the mask layer is thinned for some reason, the catalyst elements reach the amorphous silicon film below the thinned region of the silicon oxide film, resulting the crystallized region with the nuclei generated at random and with an uncontrolled growth direction. If there are pin holes in the silicon oxide film serving as the mask layer, the catalyst elements reach the amorphous silicon film via the pin holes, and therefore, the nuclei may be generated at random.

In other words, although the crystal growth direction is attempted to be controlled by selectively introducing the catalyst elements using the mask layer, a crystalline silicon film region, in which the crystal grain boundaries are not controlled at all, may be formed in the amorphous silicon film on the surface of the substrate by the catalyst elements which pass through the region of the mask layer other than a predetermined through hole (an opening of the mask layer ). Thus, if the above technique for laterally growing the crystallized region of the amorphous silicon film is applied to the mass production, there is a possibility that a serious problem is developed in aspects of reproducibility and uniformity due to the above reasons, and therefore, the yield will be disadvantageously lowered.

The method for applying the solution in which the catalyst elements are dissolved using the spinner is the most effective method for selectively introducing the catalyst elements under the present conditions. However, in the subsequent step of the formation of the crystalline silicon film of high quality in lateral crystal growth, the difference in levels of the pattern, such as each of the through hole provided in the mask layer (opening of the mask layer), greatly affects the spinner operation. Consequently, unevenness in the substrate, which is a disadvantage of the method, may appear in a more conspicuous manner.

As described above, if the degree of unevenness in the amount of introduced catalyst elements is large in the substrate, there appear the regions where crystal growth does not occur due to the localized lack of the catalyst elements, the region where a lateral crystal growth range does not reach the predetermined region on which the element to be formed, and on the contrary, the region in which the catalyst elements are present so excessively that characteristics of the semiconductor device to be formed are affected. Thus, in the case where several tens of thousands of TFTs are to be fabricated on a substrate as in the fabrication process of an active matrix substrate of a liquid crystal display device, it is difficult to uniformly fabricate those TFTs by the above methods.

A further reduction in cost and a further enlargement of the area of the semiconductor device to be formed have been demanded, and a method for fabricating a semiconductor device, which is so excellent in uniformness and stability that the method can be applied to a glass substrate having a side of 400 mm long or more, has been requested. However, it is difficult to meet such a requirement with the conventional methods.

Hereinafter, the present invention made by the inventors in view of the above-explained study of the inventors will be described by way of example with reference to the accompanying drawings. However, the present invention is not limited by the following examples.

EXAMPLE 1

FIGS. 1A through 1E are cross-sectional views showing a method for fabricating a semiconductor device in accordance with a first example of the present invention.

Initially, as shown in FIG. 1A, a base coat film 101 made of silicon dioxide having a thickness of approximately 200 nm is deposited by using a sputtering apparatus onto a cleaned substrate 100 having an insulating surface, for example, a cleaned glass substrate. A required thickness of the base coat film 101 varies depending on the surface condition of the substrate 100. If the surface of the substrate 100 is sufficiently flat and the concentration of ions, such as sodium ions or the like, which adversely affect the semiconductor characteristics is sufficiently low, the formation of the base coat film 101 may be omitted. On the contrary, if the substrate 100 has a rough surface having scratches and therefore is not sufficiently flat, the base coat film 101 is required to be deposited so as to have a thickness greater than the above-mentioned dimension.

Figure 1B:
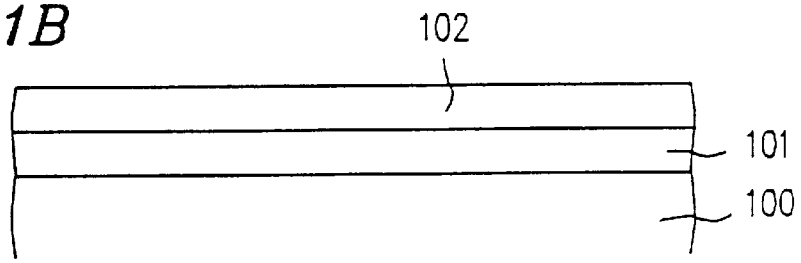

Next, as shown in FIG. 1B, by chemical vapor phase deposition (CVD) or sputtering, an amorphous silicon film 102 is deposited on the base coat film 101 so as to have a thickness of about 30 to 100 nm.

Figure 1C:
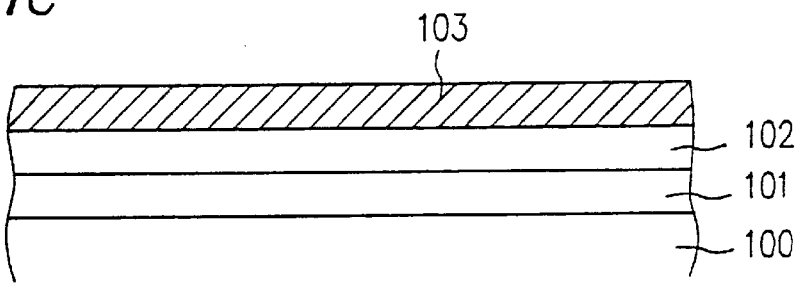
Figure 1D:
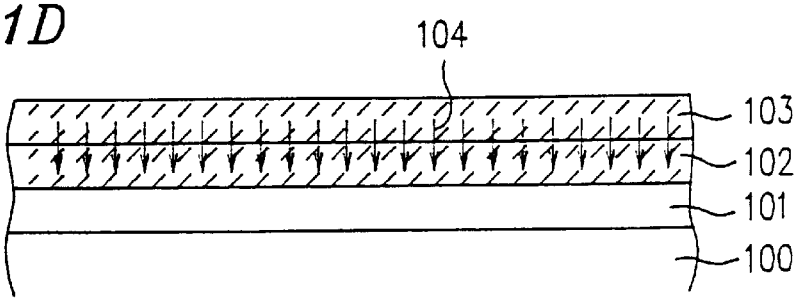

Then, as shown in FIG. 1C, a silicon dioxide film 103, in which a minute amount of nickels have been mixed as catalyst elements for accelerating the crystallization of the amorphous silicon film 102, is deposited on the amorphous silicon film 102 to a thickness of 100 nm or more, by using a sputtering apparatus, a spin-on-glass (SOG) technique, an electron beam (EB) deposition technique and the like. As a method for mixing nickels, in the case where the silicon dioxide film 102 is formed by using the sputtering apparatus or an EB deposition apparatus, it is sufficient to use a target member in which nickels are mixed at a concentration of about 1 to 100 ppm. In the case where the silicon dioxide film 102 is formed by using an SOG technique, it is sufficient to use a solvent in which nickels are dissolved at a concentration of about 1 to 100 ppm in the form of a nitrate or an acetate.

Then, the whole substrate 100, on which the base coat film 101, the amorphous silicon film 102 and the silicon dioxide film 103 are successively deposited as described above, is subjected to a heat treatment at a temperature of 520 to 580° C., preferably, about 550° C. With this heat treatment, as indicated with arrows 104 in FIG. 1D, nickels are diffused into the amorphous silicon film 102 from the silicon dioxide film 103 while the polycrystallization proceeds in the amorphous silicon film 102.

Figure 1E:
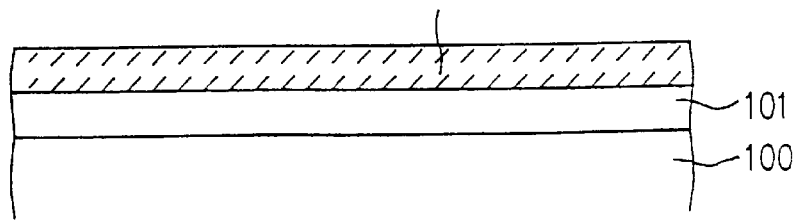

After the heat treatment is completed, the silicon dioxide film 103, in which nickels are mixed, is removed by etching. With this process, as shown in FIG. 1E, a semiconductor substrate on which a polycrystalline silicon film 105 is formed can be obtained.

In the above description, nickels are used as the catalyst elements for accelerating the crystallization of the amorphous silicon film 102. However, a similar result can be obtained by using any one element selected from a group which consists of Ni, Co, Pd, Pt, Fe, Cu, Ag, Au, In, Sn, P, As and Sb, or a combination of a plurality of the elements.

As the film 103 to which a minute amount of the catalyst elements for accelerating the crystallization are added, inorganic films such as a silicon nitride film, a tantalum oxide film or an alumina film may be used other than the above-mentioned silicon dioxide film.

Alternatively, as the film 103 to which a minute amount of the catalyst elements for accelerating the crystallization are added, an organic film, which is formed by electrodeposition, may be used. In such a case, after depositing a film by using an electrolytic solution in which the catalyst elements are dissolved in the form of a nitrate or an acetate, the first heat treatment at a temperature of approximately 200 to 300° C. is conducted so as to introduce the catalyst elements into the amorphous silicon film 102 from the organic film. Thereafter, after removing the organic film, the whole substrate is subjected to the second heat treatment at a temperature of 520 to 580° C., preferably about 550° C. With this process, even if the organic film is used as a film to which a minute amount of the catalyst elements for accelerating the crystallization of the amorphous silicon film 102 are added, the polycrystalline silicon film 105 similar to that obtained in the above case where the inorganic film is used can be obtained.

Hereinafter, the mechanism for introducing the catalyst elements into the amorphous silicon film 102 at a low concentration according to this example will be described.

In this example, as a source of supply of the catalyst elements, the layer 103 in which a minute amount of the catalyst elements are mixed is formed on the amorphous silicon film 102. In this case, the catalyst element is introduced into the amorphous silicon film 102 in the form of thermal diffusion. A diffusion rate F is expressed by the following equation (1).

$$F = -D \cdot (\partial N / \partial X) \quad (1)$$

where the differential calculation part $(\partial N/\partial X)$ in the equation (1) represents a concentration gradient of the catalyst elements. D is a diffusion coefficient and is given by the following equation (2) having a temperature as its only variable.

$$D = D_o \cdot \exp(-E_a/kT) \quad (2)$$

where $D_o$, $k$ and $E_a$ are constants, and T is a temperature in Kelvin.

Based on the above equations (1) and (2), the introduction amount of the catalyst elements are determined by three factors, that is, a concentration of the catalyst elements in the layer in which a minute amount of the catalyst elements are mixed, a temperature of the heat treatment, and a time period of the heat treatment.

Among the above-mentioned three factors, the temperature of the heat treatment affects the diffusion rate of the impurity, and the time period of the heat treatment affects the diffusing range of the impurity. Thus, if the concentration of the catalyst element in the layer is constant, it is possible to control the amount of the crystal elements to be introduced into the amorphous silicon film by controlling the temperature and the time period of the heat treatment while realizing good controllability and reproducibility.

The diffusion rate F of the catalyst element is also greatly affected by the concentration gradient D. The larger the concentration gradient is, the larger the diffusion rate is, and vice versa. Therefore, if the catalyst element concentration in the film used as a diffusion source is high, the concentration gradient and the diffusion rate are also high. Hence, a larger amount of the catalyst elements move. On the contrary, if the concentration of the catalyst elements in the film used as the diffusion source is low, the concentration gradient and the diffusion rate are also low. Hence, only a small amount of catalyst elements move.

As described above, it is possible to hold the diffusion rate of the catalyst elements to a low level by limiting the concentration of the catalyst elements in the film used as a diffusion source to a low level. It is also possible to more strictly control the introduction amount of the catalyst elements by a combination of a control of the diffusion by a temperature and a time period of the heat treatment and the control of the concentration of the catalyst elements.

Thus, it is possible to precisely control the introduction amount of the catalyst elements for accelerating the crystallization of the amorphous silicon film 102 by introducing the catalyst elements into the amorphous silicon film 102 according to this example. With this process, it is possible to introduce a necessary and minimum amount of the catalyst elements with good controllability. Therefore, by using a polycrystalline silicon film formed according to this example, the formation of high performance TFTs having a high mobility and a high ON/OFF ratio can be realized with a low-temperature process whose maximum process temperature is approximately 550° C.

In the case where the SPC treatment with heating is conducted on the amorphous silicon film by introducing the catalyst elements into the entire surface of the amorphous silicon film 102, the concentration of the catalyst elements in the silicon film is required to be $1 \times 10^{18}$ atom/cm$^3$ at minimum in order to accelerate the crystal growth by allowing the catalyst elements for accelerating the crystallization of the amorphous silicon film 102 to effectively act.

Figure 2:
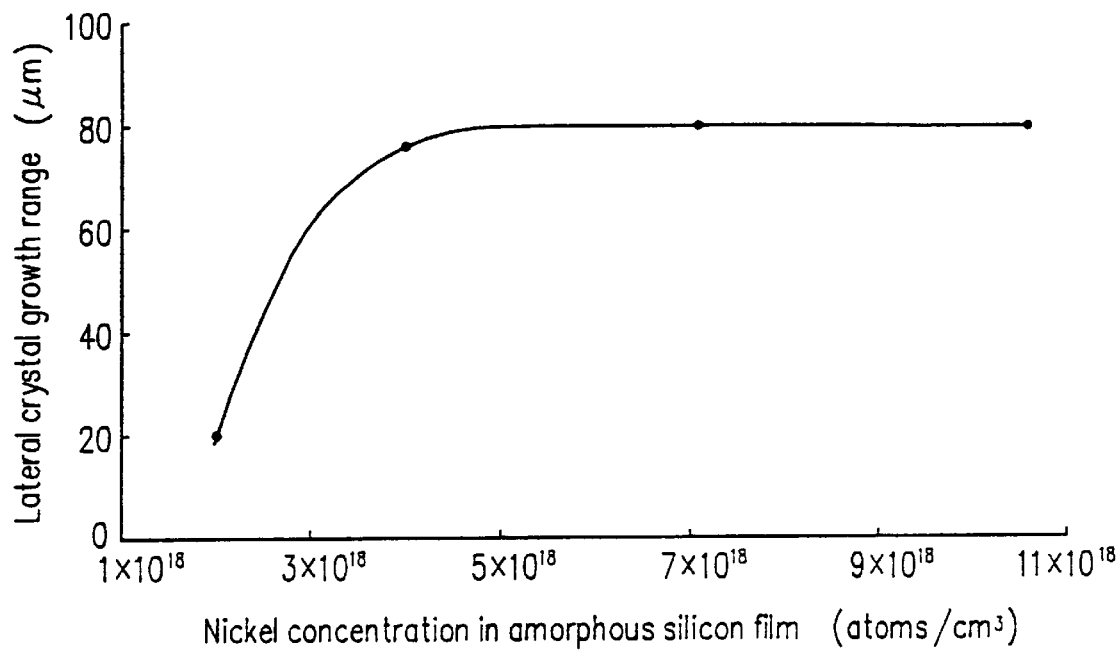
FIG. 2 is a graph showing a relationship between a nickel concentration in an amorphous silicon film and a lateral crystal growth range.

On the other hand, in the case where the SPC treatment is conducted by selectively introducing the catalyst elements into the silicon film, the obtained lateral crystal growth range depends, as shown in FIG. 2, on the concentration of the catalyst elements in the region of the amorphous silicon film 102 into which the catalyst elements is selectively introduced (the selective introduction region). It is desirable that TFTs are formed in the lateral crystal growth region in order to obtain high performance TFTs, effectively utilizing the crystal which is laterally grown by the SPC treatment. For example, since TFTs used for a liquid crystal display device have a length in a conduction direction of approximately 30 to 80 $\mu$m, the lateral crystal growth range is required to be 80 $\mu$m at minimum.

Thus, in order to obtain a sufficient lateral crystal growth range, the concentration of the catalyst elements in the selective introduction region of the amorphous silicon film 102 is required to be, as seen from FIG. 2, about $4 \times 10^{18}$ atom/cm$^3$ or more.

Figure 3A:
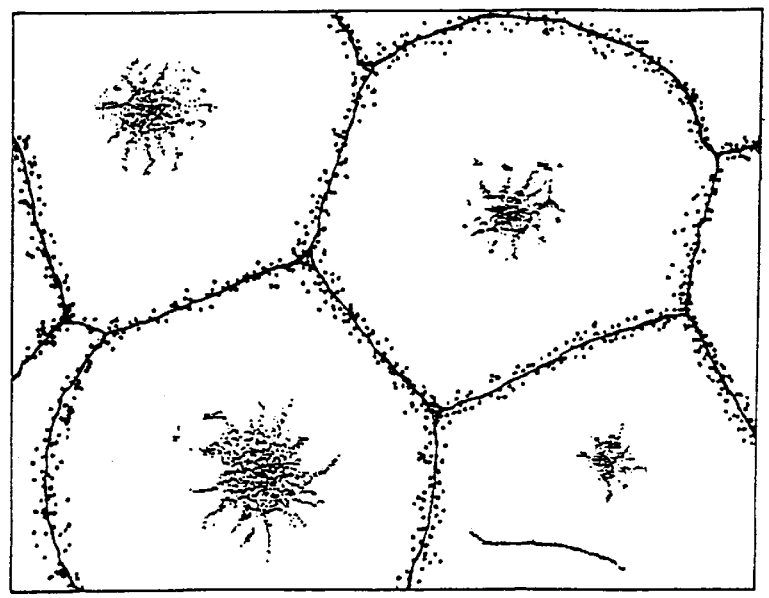
FIG. 3A is a schematic view illustrating precipitation of catalyst elements on a surface of a silicon film due to laser radiation.

On the other hand, in the case where the introduced concentration of the catalyst elements is approximately $1 \times 10^{20}$ atom/cm$^3$, when donor/acceptor ions are activated by laser irradiation after the implantation thereof, as schematically shown in FIG. 3A, the catalyst elements are precipitated on the surface of the silicon film (the region where the catalyst elements are precipitated is indicated by dotted portions). This may cause a leak current in TFTs.

From the above examination, it is desirable that the concentration of the catalyst elements in the amorphous silicon film is $1 \times 10^{18}$ to $1 \times 10^{20}$ atom/cm$^3$.

In order to introduce the catalyst elements, for example, nickels, into the amorphous silicon film 102 within the above concentration range, in the case where $NiSi_x$ ($0.4 \leq x \leq 2.5$) is used as the layer 103 serving as a supply source, it is desirable that the layer having a thickness of approximately 2 nm is formed. When the $NiSi_x$ layer is used, nickels which adhere to the surface of the amorphous silicon film 102 are immediately combined with silicon to be silicide in the early stage of deposition.

Figure 3B:
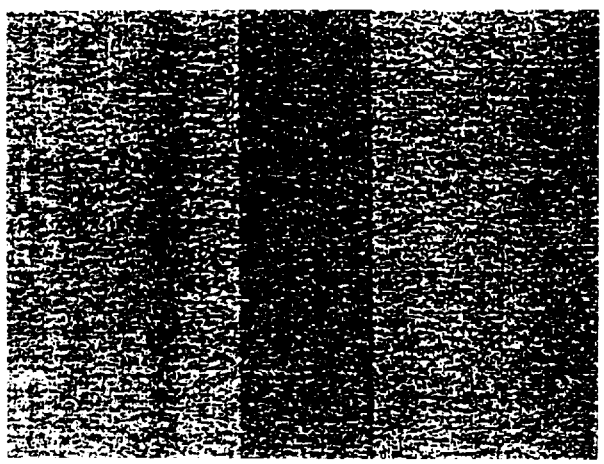
FIGS. 3B through 3G show surface states of the amorphous silicon film after BHF treatment.
Figure 3C:
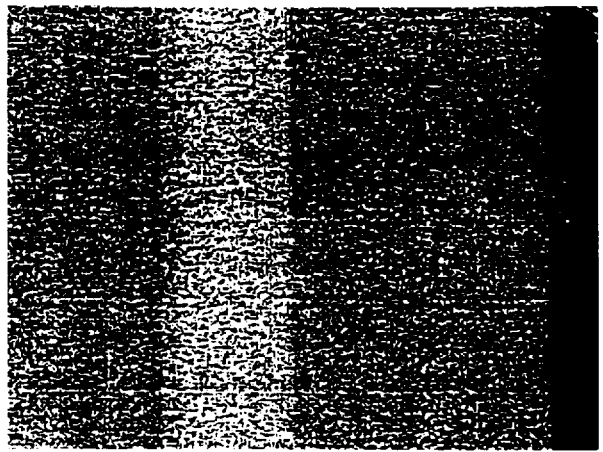
Figure 3D:
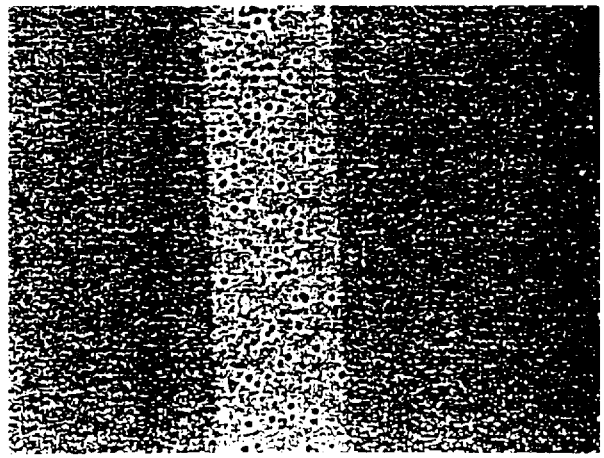
Figure 3E:
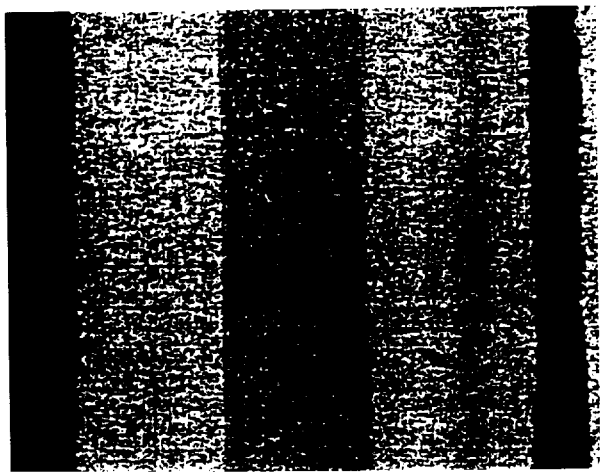
Figure 3F:
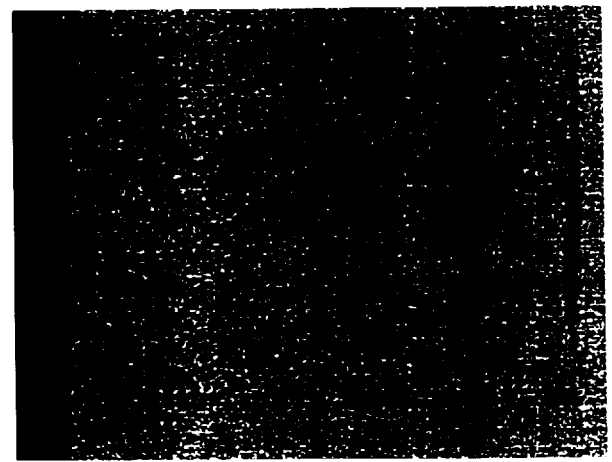
Figure 3G:
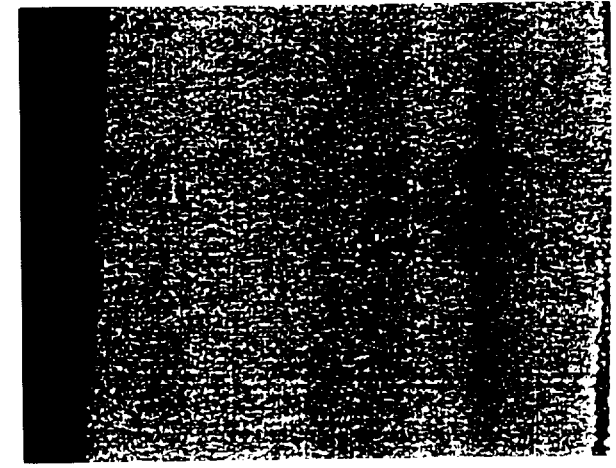

Furthermore, from the viewpoint of anti-etching resistance of the silicon film, the resistance of the polycrystalline silicon film, which is obtained by selectively introducing nickels and then conducting the SPC treatment, against a hydrofluoric acid buffer solution (anti-BHF resistance) is examined. Specifically, nickels are introduced into the amorphous silicon film at $1 \times 10^{19}$ atoms/cm$^3$ through the mask layer for the selective introduction. Thereafter, the amorphous silicon film is immersed into BHF, in which 50% HF and 40% $NH_4F$ is mixed at a ratio of 1:10, for a predetermined period of time. During this period of time, change in the surface conditions of the amorphous silicon film is observed. FIGS. 3B through 3D show the case where nickels are introduced by the conventional plasma treatment. FIGS. 3E through 3G show the case where nickels are introduced by diffusion according to the present invention.

When nickels are introduced by the plasma treatment, anti-BHF resistance is poor, and the polysilicon film is more damaged as the etching time elapses, as shown in FIGS. 3B through 3D. According to the diffusion method of the present invention, on the other hand, as shown in FIGS. 3E through 3G, changes are hardly seen in the surface of the polycrystalline silicon film even if the BHF treatment time period elapses.

Furthermore, the surface state of the silicon film after carrying out the step of forming a contact hole in the TFT fabrication process is observed.

Figure 3H:
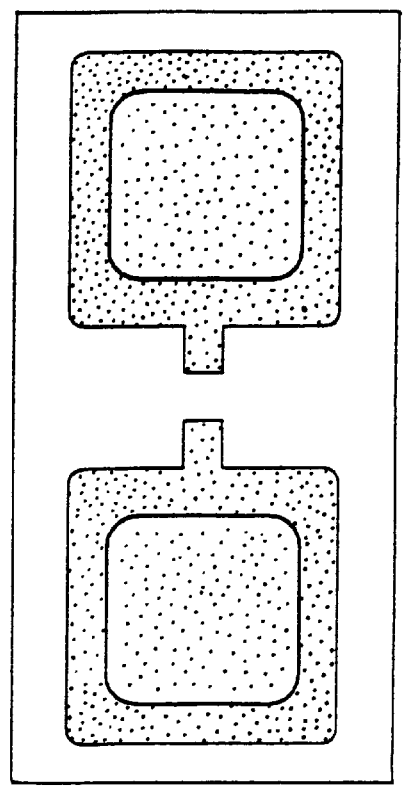
FIGS. 3H and 3I show surface states of the amorphous silicon film immediately after a contact hole is formed.
Figure 3I:
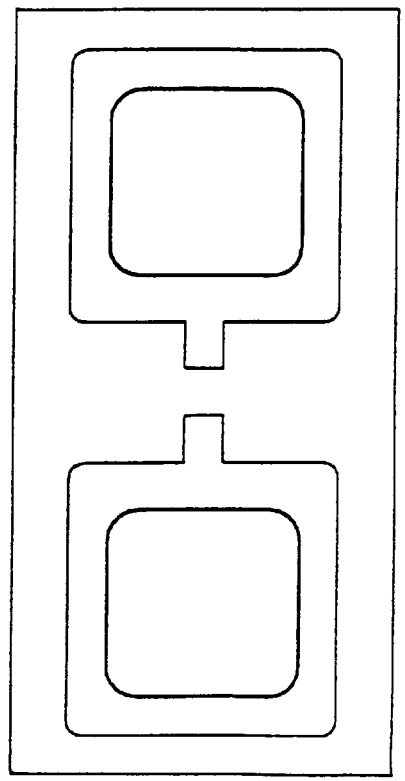

In the case of the polycrystalline silicon film in which nickels are introduced by the conventional plasma technique, the surface of the silicon film which is exposed within the opening of a contact hole is roughed due to etching, as shown in FIG. 3H. On the other hand, in the case of the polycrystalline silicon film in which nickels are introduced by the diffusion method according to this example, the surface does not have such roughness as shown in FIG. 3I. FIGS. 3H and 3I show the surface immediately after the contact hole is formed in the case where nickels are introduced at a concentration of $1 \times 10^{19}$ atoms/cm$^3$.

As described above, if nickels are introduced by the plasma technique, there is a possibility that nickels having high energy are plunged into the amorphous silicon film to cause damage. However, such damage can be prevented from being generated by using a method according to this example.

EXAMPLE 2

FIGS. 4A through 4G are cross-sectional views showing a method for fabricating a semiconductor device in accordance with a second example of the present invention.

Figure 4A:
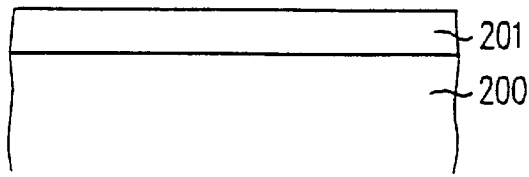
FIGS. 4A through 4G are cross-sectional views illustrating a method for fabricating a semiconductor device according to Example 2 of the present invention.
Figure 4E:
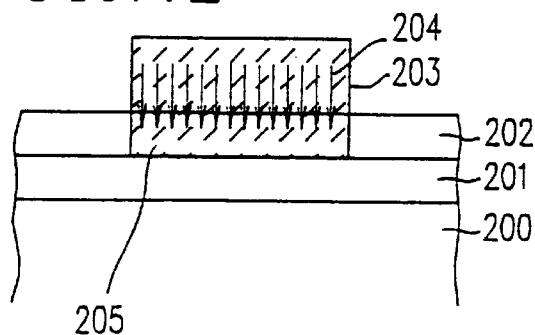

Initially, as shown in FIG. 4A, a base coat film 201 made of silicon dioxide having a thickness of approximately 200 nm is deposited by using a sputtering apparatus onto a cleaned substrate 200 having an insulating surface, for example, a cleaned glass substrate. A required thickness of the base coat film 201 varies depending on the surface condition of the substrate 200. If the surface of the substrate 200 is sufficiently flat and the concentration of ions, such as sodium ions, which adversely affect the semiconductor characteristics is sufficiently low, the formation of the base coat film 201 may be omitted. On the contrary, if the substrate 200 has a rough surface having scratches and therefore is not sufficiently flat, the base coat film 201 is required to be deposited so as to have a thickness greater than the above-mentioned dimension.

Figure 4B:
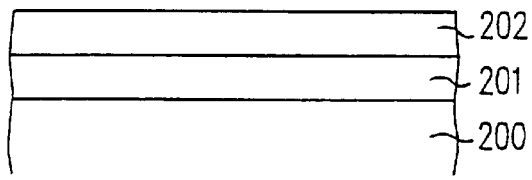

Next, as shown in FIG. 4B, by chemical vapor phase deposition (CVD) or sputtering, an amorphous silicon film 202 is deposited on the base coat film 201 so as to have a thickness of about 30 to 100 nm.

Figure 4F:
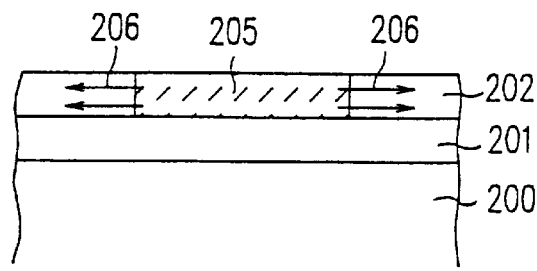
Figure 4C:
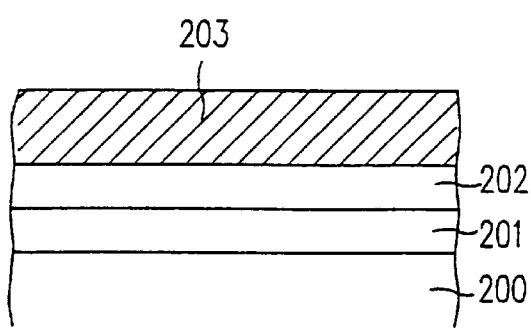

Then, as shown in FIG. 4C, a photosensitive material 203 such as a photosensitive polyimide or a photosensitive resist, in which a minute amount of nickels have been mixed as a catalyst element for accelerating the crystallization of the amorphous silicon film 202, is applied onto the amorphous silicon film 202. As a method for mixing nickels, it is sufficient to dissolve nickels at a concentration of about 1 to several hundreds ppm in the form of a nitrate or an acetate.

Figure 4G:
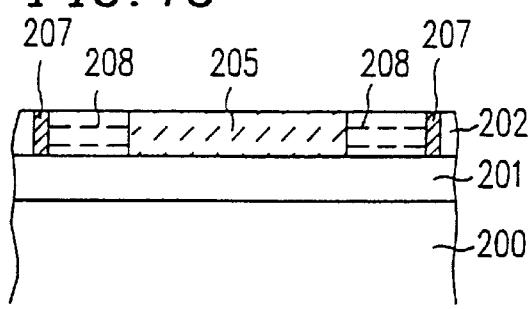
Figure 4D:
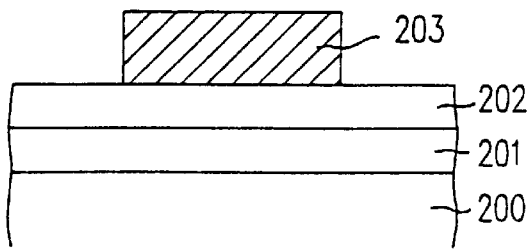

Next, as shown in FIG. 4D, the applied photosensitive material layer 203 is formed into an island pattern by photolithography.

Next, the whole substrate 200, on which the base coat film 201, the amorphous silicon film 202, and the photosensitive material layer 203 having the island pattern are successively formed, is subjected to a heat treatment at a temperature of approximately 200 to 300° C. With this heat treatment, nickels are selectively diffused into the amorphous silicon film 202 from the islandized photosensitive material layer 203 as shown by arrows 204 in FIG. 4E, thereby forming a region 205, in which nickels have been selectively introduced, in the amorphous silicon film 202.

Next, as shown in FIG. 4F, the photosensitive material layer 203 is removed. Subsequently, the whole substrate 200 on which the base coat film 201 and the amorphous silicon film 202 are successively formed is subjected to a heat treatment at temperatures of 520 to 580° C., preferably, at about 550° C. By this heat treatment, the region 205, in which a minute amount of nickels have been selectively introduced, is preferentially polycrystallized. As the heat treatment is further continued, the polycrystallization proceeds from the polycrystallized region 205 to the peripheral region in directions substantially parallel to the surface of the substrate 200 as indicated with arrows 206 in FIG. 4F. After the heat treatment is completed, as shown in FIG. 4G, the silicon film 202, which was originally in an amorphous state, includes the preferentially crystallized region 205 in which nickels have been selectively introduced, polycrystallized regions 208 in the periphery thereof, and tips of the polycrystallized regions 208, that is, regions 207 present at the crystal growth ends in which the nickel concentration is a little higher than that of the other regions.

In the above description, nickel is used as the catalyst elements for accelerating the crystallization of the amorphous silicon film 202. However, a similar result can be obtained by using any one element selected from a group which consists of Ni, Co, Pd, Pt, Fe, Cu, Ag, Au, In, Sn, P, As and Sb, or a combination of a plurality of the elements.

EXAMPLE 3

FIGS. 5A through 5H are cross-sectional views showing a method for fabricating a semiconductor device in accordance with a third example of the present invention.

Figure 5A:
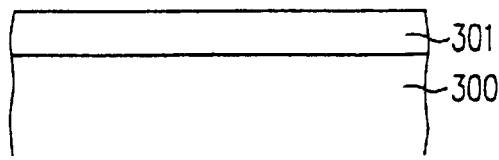
FIGS. 5A through 5H are cross-sectional views illustrating a method for fabricating a semiconductor device according to Example 3 of the present invention.

Initially, as shown in FIG. 5A, a base coat film 301 made of silicon dioxide having a thickness of approximately 200 nm is deposited by using a sputtering apparatus onto a cleaned substrate 300 having an insulating surface, for example, a cleaned glass substrate. A required thickness of the base coat film 301 varies depending on the surface condition of the substrate 300. If the surface of the substrate 300 is sufficiently flat and a concentration of ions, such as sodium ions, which adversely affect the semiconductor characteristics is sufficiently low, the formation of the base coat film 301 may be omitted. On the contrary, if the substrate 300 has a rough surface having scratches and therefore is not sufficiently flat, the base coat film 301 is required to be deposited so as to have a thickness greater than the above-mentioned dimension.

Figure 5E:
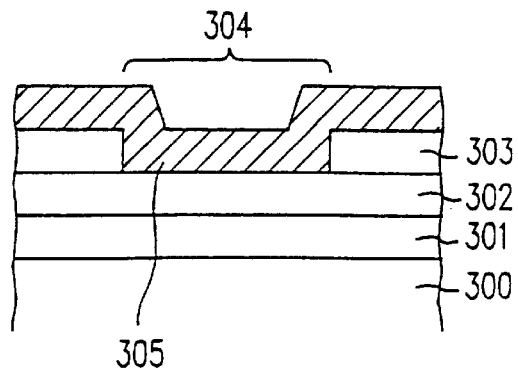
Figure 5B:
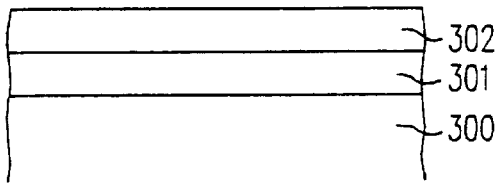
Figure 5F:
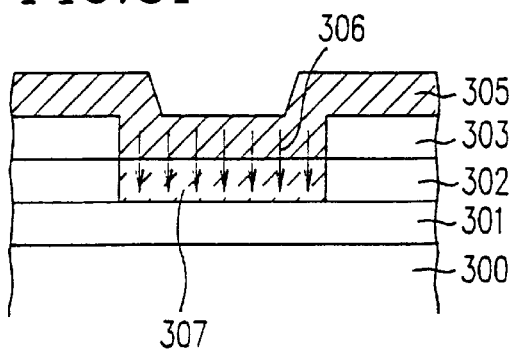

Next, as shown in FIG. 5B, by chemical vapor phase deposition (CVD) or sputtering, an amorphous silicon film 302 is deposited on the base coat film 301 so as to have a thickness of about 30 to 100 nm.

Figure 5C:
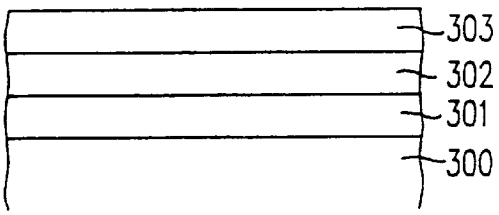
Figure 5G:
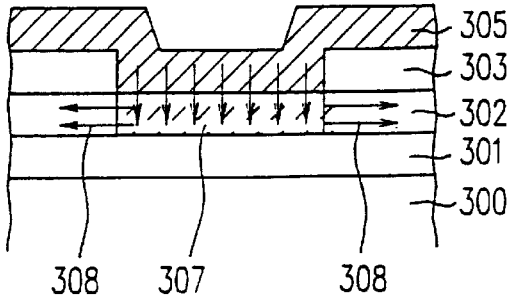

Then, as shown in FIG. 5C, a mask layer 303, for example, a silicon dioxide film, which is used for selectively diffusing the catalyst elements for accelerating the polycrystallization of the amorphous silicon film 302 in the amorphous silicon film 302, is deposited on the amorphous silicon film 302 by sputtering or the like so as to have a thickness of about 100 nm. The mask layer 303 is not particularly limited to the silicon dioxide film. Other materials can be used as long as insulating films which can be relatively easily removed by etching are obtained. There are no absolutely necessary conditions for the thickness of the mask layer 303. A thickness of the mask layer is not limited to the above value as long as the catalyst elements do not pass through the mask layer 303 other than a predetermined region and do not diffuse into the amorphous silicon film 302 in the subsequent process.

Figure 5D:
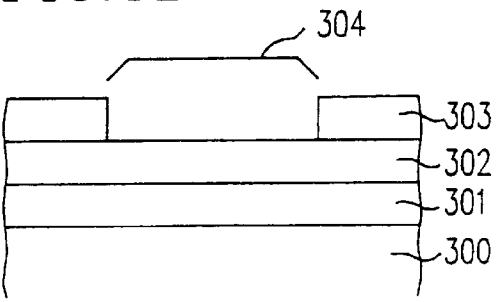
Figure 5H:
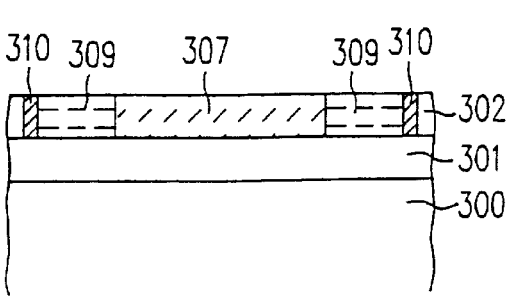

Next, as shown in FIG. 5D, an opening is provided in the mask layer 303. The opening 304 is used for selectively introducing the catalyst elements into the amorphous silicon film 302.

Next, as shown in FIG. 5E, a film 305, in which a minute amount of nickels have been introduced as the catalyst elements for accelerating the crystallization of the amorphous silicon film 302, is deposited so as to cover the mask layer 303. In the opening 304 provided in the mask layer 303, the film 305 is deposited on the surface of the amorphous silicon film 302 which is exposed through the opening 304.

Next, the whole substrate 300, on which the base coat film 301, the amorphous silicon film 302, the mask 303 and the film 305 are successively deposited, is subjected to a heat treatment at 520 to 580° C., preferably, at 550° C. With this heat treatment, nickels are selectively diffused from the film 305 into the amorphous silicon film 302 via the opening 304 of the mask layer 303 as shown by arrows 306 in FIG. 5F, thereby forming a region 307, in which nickels have been selectively introduced, in the amorphous silicon film 302. The region 307, in which nickels have been selectively introduced, is preferentially polycrystallized. As the heat treatment is further continued, the polycrystallization proceeds from the polycrystallized region 307 to the peripheral region in the directions substantially parallel to the surface of the substrate 300 as indicated with arrows 308 in FIG. 5G.

After the heat treatment is completed, the mask layer 303 and the film 305 are removed. With this process, a semiconductor substrate having the polycrystalline silicon film on the surface is obtained. At this point, the silicon film 302, which was originally in an amorphous state, includes the preferentially crystallized region 307 in which nickels have been selectively introduced, polycrystallized regions 309 in the periphery thereof, and tips of the polycrystallized regions 309, that is, regions 310 present at the crystal growth ends in which the nickel concentration is a little higher than that of the other regions.

In the above description, nickel is used as the catalyst element for accelerating the crystallization of the amorphous silicon film 302. However, a similar result can be obtained by using any one element selected from a group which consists of Ni, Co, Pd, Pt, Fe, Cu, Ag, Au, In, Sn, P, As and Sb, or a combination of a plurality of the elements.

As the film 305, to which the catalyst elements for accelerating the crystallization is added, inorganic films such as a silicon dioxide film, a silicon nitride film, a tantalum oxide film or an alumina film may be used as in the first example.

Alternatively, as the film 305, to which the catalyst elements for accelerating the crystallization is added, an organic film which is formed by electrodeposition may be used. In such a case, after depositing the film by using an electrolytic solution in which the catalyst elements are dissolved in the form of a nitrate or an acetate, the first heat treatment is conducted at 200 to 300° C. so as to introduce the catalyst elements from the organic film into the amorphous silicon film 102. Thereafter, after removing the organic film, the whole substrate is subjected to the second heat treatment at 520 to 580° C., preferably, at about 550° C. With this process, even if the organic film is used as the film 305 to which a minute amount of the catalyst elements for accelerating the crystallization of the amorphous silicon 302 is added, a similar polycrystalline silicon film can be obtained as that obtained in the above case where the inorganic film is used.

EXAMPLE 4

FIGS. 6A through 6G are cross-sectional views showing a method for fabricating a semiconductor device in accordance with a fourth example of the present invention.

Figure 6A:
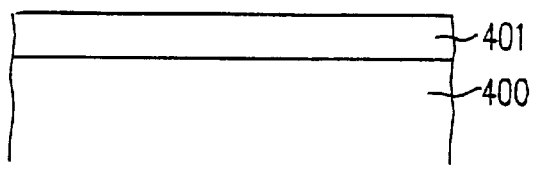
FIGS. 6A through 6G are cross-sectional views illustrating a method for fabricating a semiconductor device according to Example 4 of the present invention.
Figure 6E:
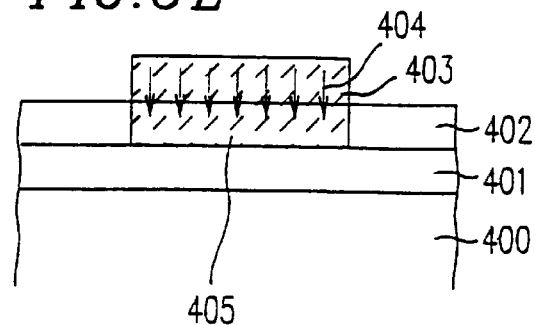

Initially, as shown in FIG. 6A, a base coat film 401 made of silicon dioxide of a thickness of approximately 200 nm is deposited by using a sputtering apparatus onto a cleaned substrate 400 having an insulating surface, for example, a cleaned glass substrate. A required thickness of the base coat film 401 varies depending on the surface condition of the substrate 400. If the surface of the substrate 400 is sufficiently flat and a concentration of ions, such as sodium ions, which adversely affect the semiconductor characteristics is sufficiently low, the formation of the base coat film 401 may be omitted. On the contrary, if the substrate 400 has a rough surface having scratches and therefore is not sufficiently flat, the base coat film 401 is required to be deposited so as to have a thickness greater than the above-mentioned dimension.

Figure 6B:
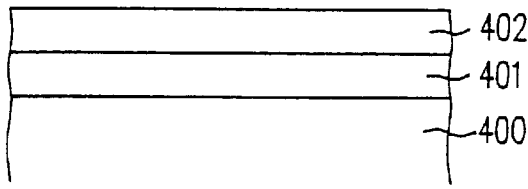
Figure 6F:
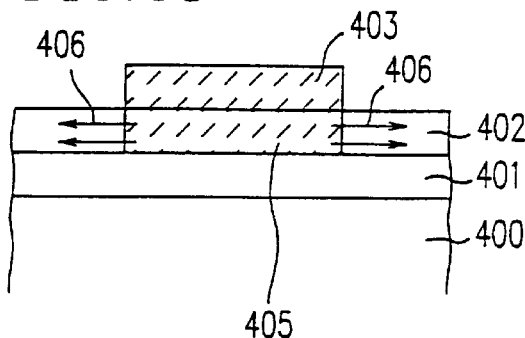

Next, as shown in FIG. 6B, by chemical vapor phase deposition (CVD) or sputtering, an amorphous silicon film 402 is deposited on the base coat film 401 so as to have a thickness of about 30 to 100 nm.

Figure 6C:
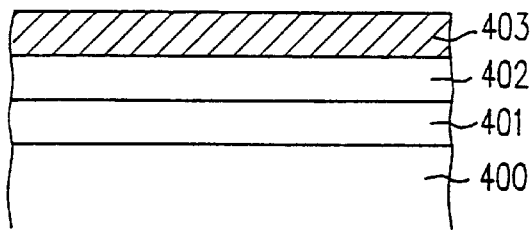
Figure 6G:
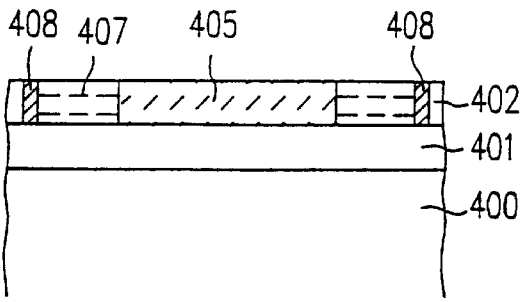
Figure 6D:
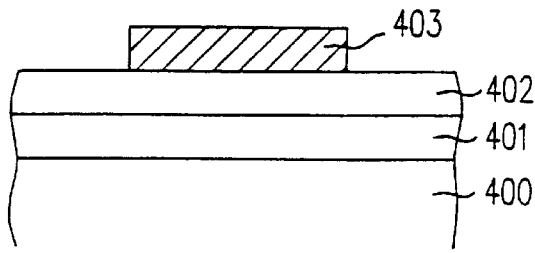

Then, as shown in FIG. 6C, a film 403, in which a minute amount of nickels have been mixed as the catalyst elements for accelerating the polycrystallization of the amorphous silicon film 402, is deposited on the amorphous silicon film 402. Then, as shown in FIG. 6D, the deposited film 403 is formed into an island pattern by photolithography.

Next, the whole substrate 400, on which the base coat film 401, the amorphous silicon film 402, and the islandized film 403 are successively formed, is subjected to a heat treatment at a temperature of approximately 520 to 580° C., preferably at 550° C. With this heat treatment, nickels are selectively diffused into the amorphous silicon film 402 from the film 403 as indicated with arrows 404 in FIG. 6E, thereby forming a region 405, in which nickels have been selectively introduced, in the amorphous silicon film 402. The region 405, in which a minute amount of nickels have been selectively introduced, is preferentially polycrystallized. As the heat treatment is further continued, the polycrystallization proceeds from the polycrystallized region 405 to the peripheral region in directions substantially parallel to the surface of the substrate 400 as indicated with arrows 406 in FIG. 6F.

After the heat treatment is completed, the islandized film 403 is removed. With this process, a semiconductor substrate having the polycrystalline silicon film thereon is obtained. At this point, the silicon film 402, which was originally in an amorphous state, includes the preferentially crystallized region 405 in which nickels have been selectively introduced, polycrystallized regions 407 in the periphery thereof, and tips of the polycrystallized regions 407, that is, regions 408 present at the ends of crystal growth in which nickel concentration is a little higher than that of the other regions.

In the above description, nickel is used as the catalyst element for accelerating the crystallization of the amorphous silicon film 402. However, a similar result can be obtained by using any one element selected from a group which consists of Ni, Co, Pd, Pt, Fe, Cu, Ag, Au, In, Sn, P, As and Sb, or a combination of a plurality of the elements.

As the film 403 to which the catalyst elements for accelerating the crystallization are added, inorganic films such as a silicon dioxide film, a silicon nitride film, a tantalum oxide film or an alumina film may be used as in the first example.

Alternatively, as the film 403 to which the catalyst elements for accelerating the crystallization are added, an organic film which is formed by electrodeposition may be used. In such a case, after depositing the film by using an electrolytic solution in which the catalyst elements is dissolved in the form of a nitrate or an acetate, the first heat treatment is conducted at 200 to 300° C. so as to introduce the catalyst elements from the organic film into the amorphous silicon film 402. Thereafter, after removing the organic film, the whole substrate is subjected to the second heat treatment at 520 to 580° C., preferably, at about 550° C. With this process, even if the organic film is used as the film 403 to which a minute amount of the catalyst elements for accelerating the crystallization of the amorphous silicon 402 is added, a polycrystalline silicon film similar to that obtained in the case where the above inorganic film is used can be obtained.

In any of the above-mentioned Examples 1 through 4, the insulating base coat film is further formed on the substrate having an insulating surface. However, the present invention is not limited to the above structure. For example, the formation of the base coat film may be omitted, and an amorphous silicon film to be polycrystallized may be directly formed on the substrate made of insulating material. Alternatively, the base coat film may be formed on the surface of the substrate made of materials other than insulating materials, , for example, a silicon substrate, so as to render the surface of the substrate insulating. Then an amorphous silicon film to be polycrystallized may be deposited on the thus obtained insulating surface.

As described above, a "substrate having an insulating surface" in the above and following descriptions indicates a substrate made of an insulating material, or a substrate on which an insulating film is formed.

EXAMPLE 5

Figure 7:
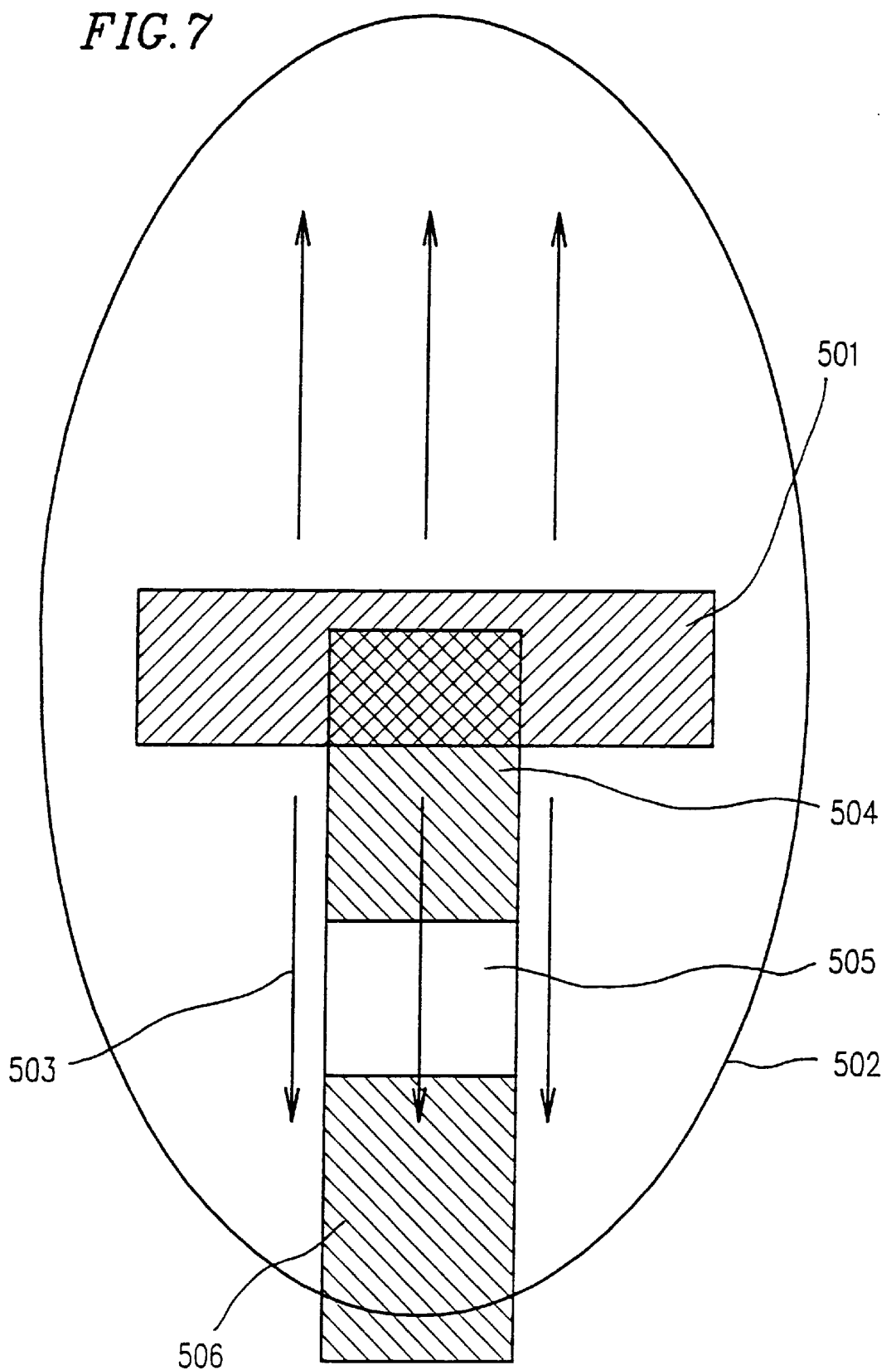
FIG. 7 is a top plan view illustrating a semiconductor substrate on which a TFT is formed according to Example 5 of the present invention.

FIG. 7 is a plan view showing an upper face of a semiconductor substrate on which a TFT is fabricated according to a method for fabricating a semiconductor device of the present invention as a fifth example of the present invention. Specifically, a polycrystalline silicon film is formed on the semiconductor substrate according to a method for fabricating a semiconductor device, which is described above as Examples 1 to 4, and a TFT is formed by using the thus obtained semiconductor substrate.

The catalyst elements for accelerating the crystallization of the amorphous silicon film, for example, nickels, are selectively introduced into a rectangular region 501. Thereafter, a heat treatment is conducted, so that the region 501, in which nickels have been selectively introduced, is first crystallized. As the heat treatment is further continued, the crystallization proceeds from the region 501, in which nickels have been selectively introduced, to the peripheral region as indicated with arrows 503. When the heat treatment is completed, a lateral crystal growth region 502 is formed. Since the specific steps of the process have been described above in detail as Examples 1 through 4, the description thereof is herein omitted.

For forming a TFT in the lateral crystal growth region 502 in which the crystallization proceeds, source/drain regions 504 and 506 and a channel region 505 are placed as shown in FIG. 7 with respect to the crystal growth directions indicated with the arrows 503 in Example 5. With this arrangement, a carrier moving direction and the crystal growth directions 503 accord with each other, and therefore, crystal grain boundaries do not exist with respect to the carrier moving direction. Thus, a TFT having a high mobility is realized.

For forming a TFT, it is desired that the channel region 505 and the region 501, in which nickels have been selectively introduced, do not overlap with each other as shown in FIG. 7.

In the above description, nickel is used as the catalyst element for accelerating the crystallization of the amorphous silicon film. However, a similar result can be obtained by using any one element selected from a group which consists of Ni, Co, Pd, Pt, Fe, Cu, Ag, Au, In, Sn, P, As and Sb, or a combination of a plurality of the elements.

EXAMPLE 6

Figure 8:
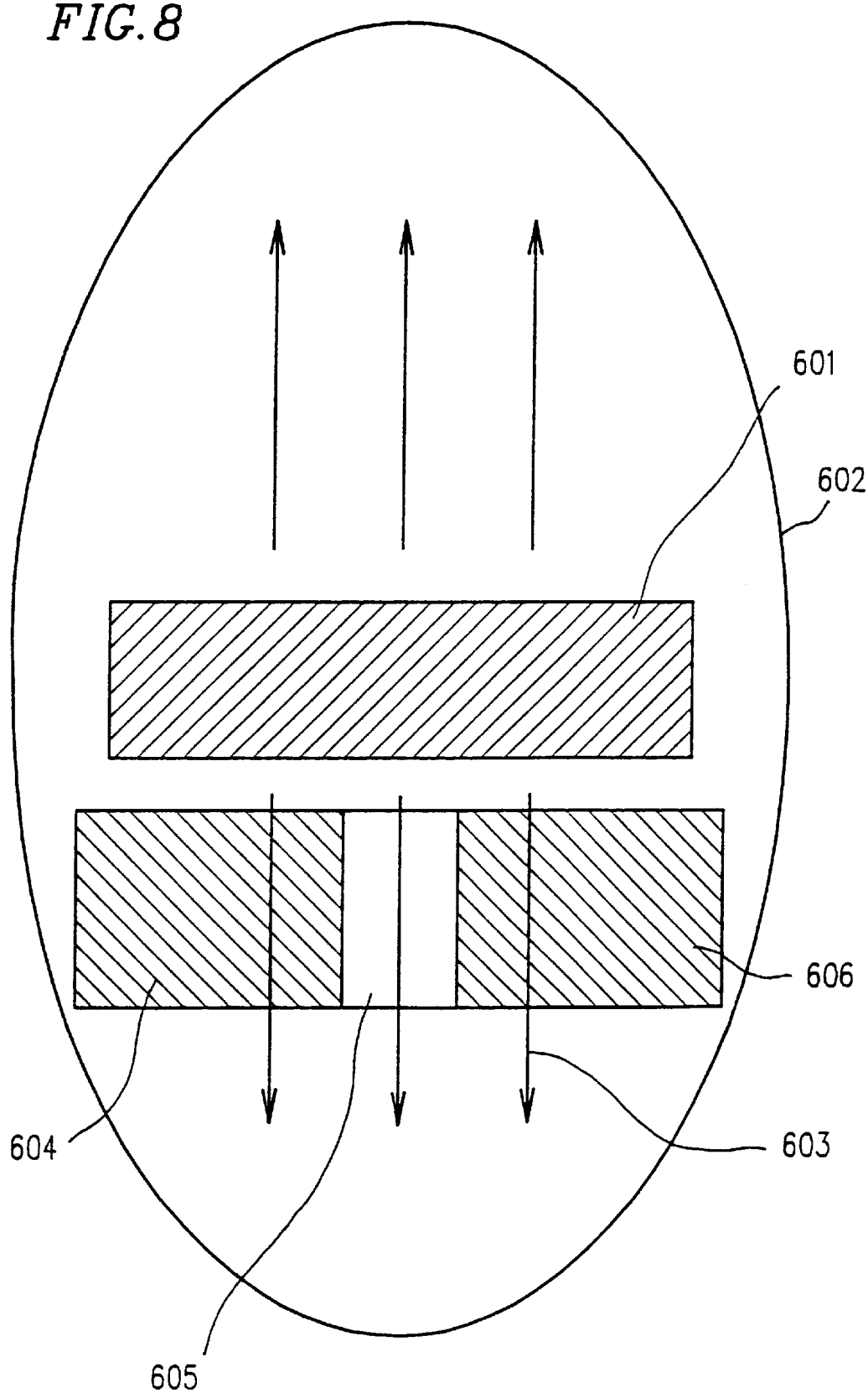
FIG. 8 is a top plan view illustrating a semiconductor substrate on which a TFT is formed according to Example 6 of the present invention.

FIG. 8 is a plan view showing an upper face of a semiconductor substrate on which a TFT is fabricated according to a method for fabricating a semiconductor device of the present invention as a sixth example of the present invention. Specifically, a polycrystalline silicon film is formed on the semiconductor substrate according to a method for fabricating a semiconductor device, which is described above as Examples 1 to 4, and a TFT is formed by using the thus obtained semiconductor substrate.

The catalyst elements for accelerating the crystallization of the amorphous silicon film, for example, nickels, are selectively introduced into a rectangular region 601. Thereafter, a heat treatment is conducted, so that the region 601, in which nickels have been selectively introduced, is first crystallized. As the heat treatment is further continued, the crystallization proceeds from the region 601, in which nickels have been selectively introduced, to the peripheral region as indicated with arrows 603. When the heat treatment is completed, a lateral crystal growth region 602 is formed. Since the specific steps of the process have been described above in detail as Examples 1 through 4, the description thereof is herein omitted.

For forming a TFT in the lateral crystal growth region 602 in which the crystallization proceeds, source/drain regions 604 and 606 and a channel region 605 are placed as shown in FIG. 8 with respect to the crystal growth directions indicated with arrows 603 in Example 6. With this arrangement, a carrier moving direction and the crystal growth directions 603 cross each other. Thus, carriers move across a number of crystal grain boundaries. As a result, the resistance between the source and the drain increases. Although the mobility is lowered with the increase in resistance, the trap density of the grain boundaries at edges of the drain region, which may degrade the characteristics during the TFT operation, is reduced. As a result, a TFT having a large ON/OFF ratio can be realized.

For forming a TFT, it is desirable that the channel region 605 and the region 601, in which nickels have been selectively introduced, do not overlap with each other, as shown in FIG. 8.

In the above description, nickel is used as the catalyst element for accelerating the crystallization of the amorphous silicon film. However, a similar result can be obtained by using any one element selected from a group which consists of Ni, Co, Pd, Pt, Fe, Cu, Ag, Au, In, Sn, P, As and Sb, or a combination of a plurality of the elements.

As described above, with a method for fabricating a semiconductor substrate having a crystalline silicon film according to the present invention, which is described as Examples 1 through 4, the maximum process temperature can be held to about 550° C., and a concentration of the catalyst elements in the crystalline silicon film to be obtained can be strictly controlled. The catalyst elements can be uniformly introduced into a substrate having a large area. Furthermore, it is possible to control the direction of crystal growth.

With these characteristics, TFTs having a high ON/OFF ratio, a low leak current and a high mobility can be supplied. Furthermore, the maximum temperature in the process is held to about 550° C. and a heating time period for crystallization is reduced. Thus, plate glasses having a distortion point of about 650° C., which can currently be mass produced, can be used as substrates. As a result, a direct-view type driver monolithic liquid crystal display device having a large screen can be mass-produced.

Since it is possible to uniformly introduce the catalyst elements into the substrate having a large area, the size of substrate to be used in mass production is not limited. This can lower the cost for fabricating large-scale semiconductor devices such as active-matrix type TFT-LCD by using the polycrystalline silicon substrates.

Furthermore, since it is possible to control the direction of crystal growth, it is also possible to simultaneously fabricate TFTs having different conductive characteristics on the same substrate according to a fabrication method of a semiconductor device of the present invention as described in Examples 5 and 6. For example, when an active-matrix type TFT-LCD is produced, a TFT, which constitutes a peripheral driving circuit portion requiring a large mobility, is formed so that the carrier moving direction during operation and the crystal growth direction of the crystalline silicon film are parallel to each other. On the other hand, a TFT in a pixel region, where the leak current need to be limited to a small value, is formed so that the carrier moving direction during operation and the crystal growth direction of the crystalline silicon film perpendicularly cross each other. With this arrangement, it is possible to place TFTs which have characteristics required for the respective regions of the formed circuits.

Thus, according to the present invention, the mass production of large-scale semiconductor devices can be realized at low fabrication cost.

EXAMPLE 7

In a method for fabricating a semiconductor device according to Example 7 of the present invention, a solution containing the catalyst elements is applied on the surface of the amorphous silicon film by a plurality of spin coat cycles, thereby adding a minute amount of the catalyst elements on the surface of the amorphous silicon film.

More specifically, an amorphous silicon film is deposited on a surface having an insulating surface, or a substrate whose surface is covered with an insulating film. A minute amount of solution containing the catalyst elements for accelerating the crystallization is applied onto the surface of the amorphous silicon film by a plurality of spin coat process cycles. The amorphous silicon film is polycrystallized by heat treatment, and a semiconductor substrate having the polycrystalline silicon film is obtained. A TFT is formed by utilizing the thus obtained amorphous silicon film of the semiconductor substrate as an active region, thereby obtaining a semiconductor device. Since a minute amount of the solution containing the catalyst elements is added by a plurality of spin coat process cycles in this method, it is possible to control the introduction of the catalyst elements so that the catalyst elements are uniformly introduced in the amorphous silicon film at a low concentration.

Hereinafter, the uniform introduction of the catalyst elements into the amorphous silicon film at a low concentration according to Example 7 will be described.

FIG. 9 is a graph showing the relationship between the number of the spin coat cycles and the variation in the concentration of the catalyst elements in one and the same face of the substrate. Specific numerical values of the statistics of data are shown also in Table 1. FIG. 9 and Table 1 show the data obtained in the case where nickel is used as a catalyst element, the solution whose nickel concentration is 100 ppm is applied onto the amorphous silicon film through a predetermined number of spin coat cycles, and then a heat treatment is conducted at 550° C. for 16 hours.

TABLE 1

| Number of spin coat cycles | Crystal growth range ($\mu$m) | | | | |
| --- | --- | --- | --- | --- | --- |
| | Average value AVE | Maximum value MAX | Minimum value MIN | Standard deviation STD | Variation STD/AVE (%) |
| 1 | 47.5 | 74.0 | 20.6 | 18.2 | 38.3 |
| 2 | 56.6 | 69.4 | 29.3 | 9.9 | 17.5 |
| 3 | 64.4 | 76.3 | 45.3 | 7.2 | 11.2 |
| 4 | 70.1 | 76.6 | 56.9 | 5.4 | 7.7 |
| 5 | 59.5 | 68.3 | 42.7 | 5.9 | 9.9 |
| 6 | 68.9 | 74.4 | 52.5 | 6.3 | 9.1 |

In a method including a spin coat process, a containing nickels is applied onto the surface of the amorphous silicon provided for the surface of the substrate. After the substrate on which the solution is applied is rotated for approximately 10 seconds at a low speed, for example, at 50 to 100 rpm, the substrate is held as it is for 1 to 2 minutes. Thereafter, the substrate is further rotated at a high speed such as 2000 rpm for about 120 seconds so as to dry the applied solution. An opening for selectively introducing the catalyst elements is formed on the substrate.

As is apparent from Table 1 and FIG. 9, as the number of the spin coat cycles is increased, the variation in the amount of introduced catalyst elements in the surface of the substrate is reduced. As a result, the uniform introduction of the catalyst elements is realized. When only one spin coat cycle is conducted, variation in the introduced amount becomes large. The reason therefor is considered as follows: The amount of nickels to be introduced cannot be sufficiently controlled from various reasons such as difficulty in supplying nickels to the corners of the opening due to bubbles locally entering the opening or a variation in the condition of the opening itself. As a result, insufficient crystal growth is caused. If the number of spin coat cycles is increased, the problems as described above are solved, resulting in improvement in the uniformness of the amount of introduced catalyst elements.

Further, as is understood from FIG. 9 and the data of Table 1, two through four spin coat cycles are desirably conducted. Even if the number is further increased, further improvement in effect would not be expected.

FIGS. 10A through 10E are diagrammatic views illustrating respective steps of a method for fabricating a semiconductor device according to Example 7.

Figure 10A:
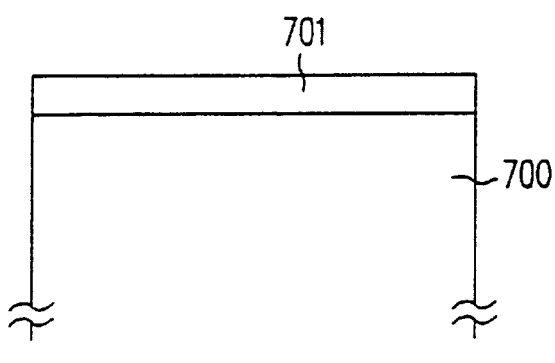
FIGS. 10A through 10E are cross-sectional views illustrating a method for fabricating a semiconductor device according to Example 7 of the present invention.
Figure 10D:
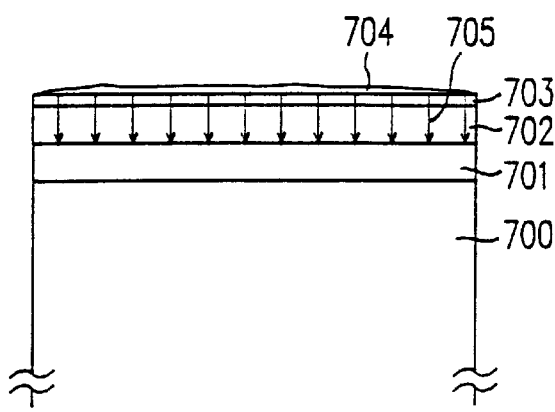

Initially, as shown in FIG. 10A, a base coat film 701 made of silicon dioxide having a thickness of approximately 100 nm is deposited by using a sputtering apparatus onto a cleaned substrate 700 having an insulating surface, for example, a cleaned glass substrate. The substrate 700 typically has a dimension of 127 mm×127 mm.

A required thickness of the base coat film 701 varies depending on the surface condition of the substrate 700. If the surface of the substrate 700 is sufficiently flat and a concentration of ions, such as sodium ions, which adversely affect the semiconductor characteristics is sufficiently low, the formation of the base coat film 701 may be omitted. On the contrary, if the substrate 700 has a rough surface having scratches and therefore is not sufficiently flat, the base coat film 701 is required to be deposited so as to have a thickness greater than the above-mentioned dimension.

Figure 10B:
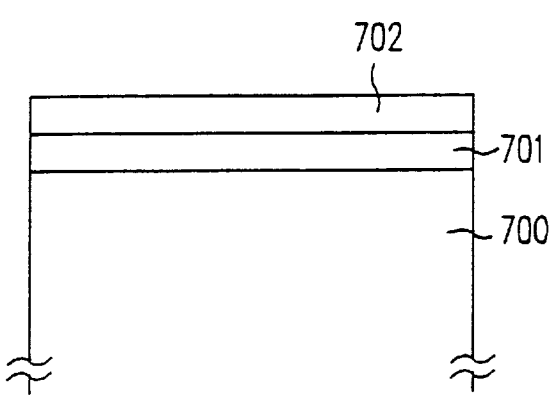

Next, as shown in FIG. 10B, by chemical vapor phase deposition (CVD) or sputtering, an amorphous silicon film 702 is deposited on the base coat film 701 so as to have a thickness of about 100 nm.

Figure 10E:
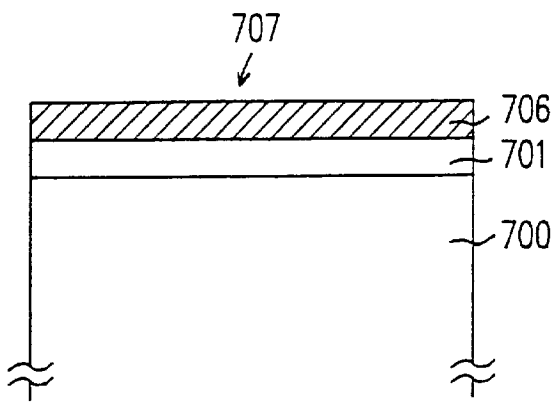
Figure 10C:
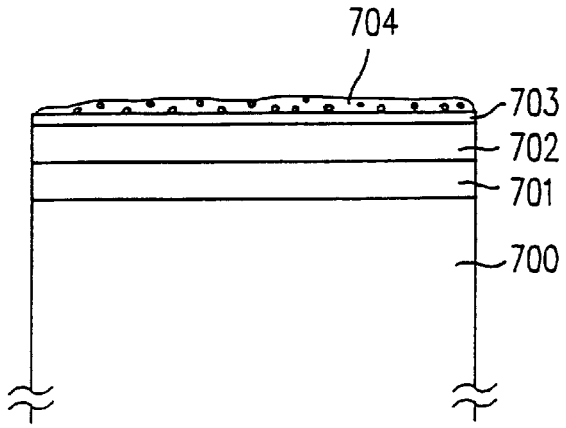

Then, as shown in FIG. 10C, an oxide film 703 used for adding a minute amount of nickels as catalyst elements is formed on the amorphous silicon film 702 by using a hydrogen peroxide solution. A thickness of the oxide film 703 is typically about 2 nm. The oxide film 703 is for improving the wettability and uniformly introducing the catalyst elements in the amorphous silicon film when the spin coat process is conducted with a solution 704 containing the catalyst elements.

Subsequently, the solution 704 containing nickel ions as the catalyst elements at a concentration of 100 ppm is applied onto the surface of the oxide film 703 by conducting two spin coat cycles. With this process, a minute amount of nickel ions alone serving as catalyst elements for accelerating polycrystallization of the amorphous silicon film 702 are added onto the oxide film 703. In the case where a solvent having good wettability with the amorphous silicon film 702, such as isopropyl alcohol, is used as a solvent of the solution 704, the formation of the above described oxide film 703 is unnecessary. A solvent contained in the solution 704 is not limited to one kind. It is also possible to use different solvents in the first spin coat cycle and the second spin coat cycle.

In the above description, nickels are used as the catalyst elements for accelerating the crystallization of the amorphous silicon film 702. However, a similar result can be obtained by using any one element selected from a group which consists of Ni, Co, Pd, Pt, Fe, Cu, Ag, Au, In, Sn, P, As and Sb, or a combination of a plurality of the elements.

Regarding the application with the spin coat step, the solution 704 containing nickel is applied onto the surface of the oxide film 703. Next, after the substrate 700 on which the solution is applied is rotated for approximately 10 seconds at a low speed, for example, at 50 to 100 rpm, the substrate is held as it is for 1 to 2 minutes. Thereafter, the substrate is further rotated at a high speed such as 2000 rpm for about 120 seconds so as to dry the applied solution 704.

After conducting the spin coat process, the whole substrate 700, on which the base coat film 701, the amorphous silicon film 702 and the oxide film 703 are successively formed, is subjected to a heat treatment at 550° C. As a result, as indicated with arrows 705 in FIG. 10D, nickel, which is added to the oxide film 703, diffuses in the amorphous silicon film 702 simultaneously with the progress in polycrystallization of the amorphous silicon film 702.

After the heat treatment is completed, the oxide film 703 is removed. With this process, a semiconductor substrate 707 having a polycrystalline silicon film 706 thereon as shown in FIG. 10E is obtained. Thereafter, a TFT utilizing the obtained polycrystalline silicon film 706 as an active region is formed in the substrate 707 by a known method.

EXAMPLE 8

FIGS. 11A through 11G are diagrammatic views illustrating respective steps of a method for fabricating a semiconductor device according to Example 8.

Figure 11A:
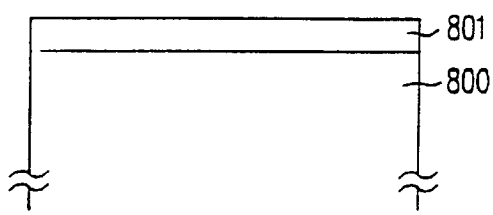
FIGS. 11A through 11G are cross-sectional views illustrating a method for fabricating a semiconductor device according to Example 8 of the present invention.

Initially, as shown in FIG. 11A, a base coat film 801 made of silicon dioxide having a thickness of approximately 100 nm is deposited by using a sputtering apparatus onto a cleaned substrate 800 having an insulating surface, for example, a cleaned glass substrate. The substrate 800 typically has a dimension of 127 mm×127 mm.

A required thickness of the base coat film 801 varies depending on the surface condition of the substrate 800. If the surface of the substrate 800 is sufficiently flat and a concentration of ions, such as sodium ions, which adversely affect the semiconductor characteristics is sufficiently low, the formation of the base coat film 801 may be omitted. On the contrary, if the substrate 800 has a rough surface having scratches and therefore is not sufficiently flat, the base coat film 801 is required to be deposited so as to have a thickness greater than the above-mentioned dimension.

Figure 11B:
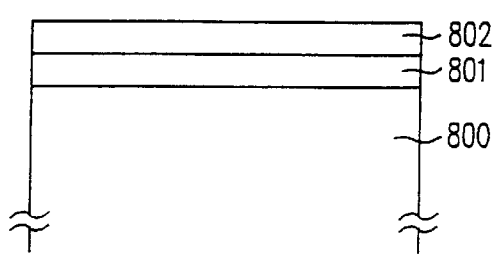

Next, as shown in FIG. 11B, by chemical vapor phase deposition (CVD) or sputtering, an amorphous silicon film 802 is deposited on the base coat film 801 so as to have a thickness of about 100 nm.

Figure 11C:
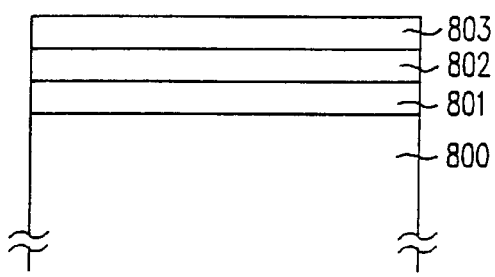

Then, as shown in FIG. 11C, as a mask layer 803 for preventing the catalyst elements for accelerating polycrystallization of the amorphous silicon film 802 from diffusing into the amorphous silicon film 802, for example, a silicon dioxide film is deposited onto the amorphous silicon film 802 by sputtering and the like so as to have a thickness of about 50 nm. The mask layer 803 is not particularly limited to the silicon dioxide film. Other materials can be used as long as the catalyst element is prevented from diffusing into the amorphous silicon film 802. A thickness of the mask layer 803 is not limited by absolute and necessary conditions, and is not limited to the above value as long as the catalyst elements do not pass through the mask layer 803 excluding a predetermined region, diffusing in the amorphous silicon film 802 in the subsequent process.

Figure 11D:
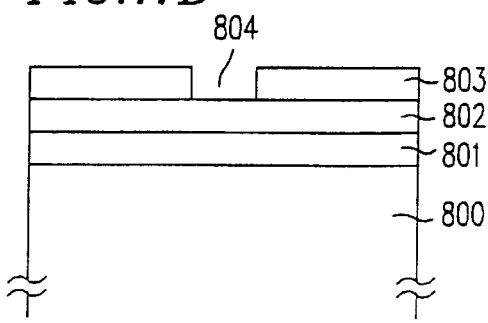

Next, as shown in FIG. 11D, an opening 804 is provided in the mask layer 803 by photolithography. The opening 804 is used for selectively introducing the catalyst elements into the amorphous silicon film 802.

Figure 11E:
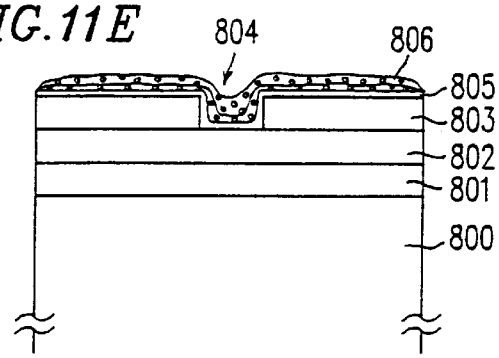
Figure 11F:
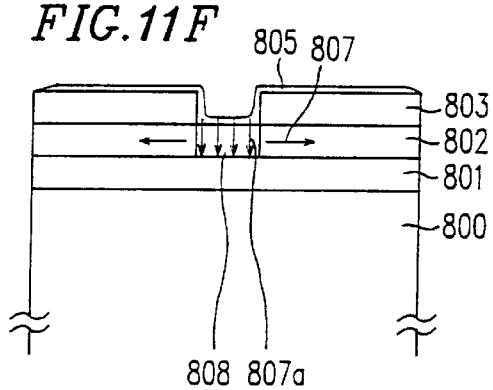
Figure 11G:
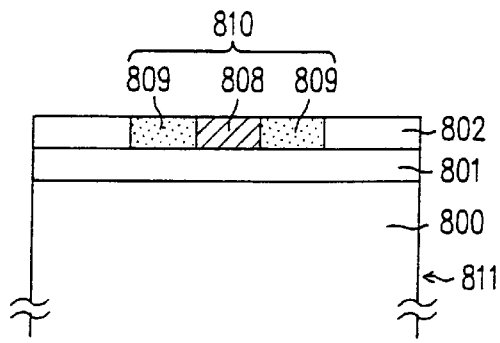

Furthermore, as shown in FIG. 11E, an oxide film 805 is formed so as to cover the mask layer 803. The oxide film 805 is formed by using a hydrogen peroxide solution and typically has a thickness of about 2 nm. As for the opening 804 provided in the mask layer 803, the oxide film 805 is deposited on the surface of the amorphous silicon film 802 which is exposed through the opening 804. The oxide film 805 is provided for improving the wettability of a solution 806 and uniformly introducing the catalyst elements in the amorphous silicon film when the spin coat process is conducted with the solution 806 containing the catalyst elements.

Subsequently, the solution 806 containing nickel ions as catalyst elements at a concentration of 100 ppm is applied onto the surface of the oxide film 805 by conducting three spin coat cycles. With this process, a minute amount of nickel ions alone serving as the catalyst elements for accelerating polycrystallization of the amorphous silicon film 802 are added onto the oxide film 805. In the case where a solvent having good wettability with the amorphous silicon film 802, such as isopropyl alcohol, is used as a solvent of the solution 806, the formation of the above described oxide film 805 is unnecessary. A solvent contained in the solution 806 is not limited to one kind. It is also possible to use different solvents in the respective first to third spin coat cycles.

In the above description, nickels are used as the catalyst elements for accelerating the crystallization of the amorphous silicon film 802. However, a similar result can be obtained by using any one element selected from a group which consists of Ni, Co, Pd, Pt, Fe, Cu, Ag, Au, In, Sn, P, As and Sb, or a combination of a plurality of the elements.

As the application with the spin coat step, the solution 806 containing nickel is applied to the surface of the oxide film 805. Next, after the substrate 800, on which the solution is applied, is rotated for approximately 10 seconds at a low speed, for example, at 50 to 100 rpm, the substrate is held as it is for 1 to 2 minutes. Thereafter, the substrate is further rotated at a high speed such as 2000 rpm for about 120 seconds so as to dry the applied solution 806.

After conducting the spin coat process, the whole substrate 800, on which the base coat film 801, the amorphous silicon film 802, the mask 803 and the oxide film 805 are successively formed, is subjected to a heat treatment at 550° C. As a result, as indicated with arrows 807a in FIG. 11F, nickel diffuses from the oxide film 805 in the amorphous silicon film 802 through the opening 804 of the mask layer 803, so that a region 808, in which nickels have been selectively introduced, is formed in the amorphous silicon film 802. The region 808, in which nickels have been selectively introduced, is preferentially polycrystallized. As the heat treatment is further continued, the polycrystallization proceeds from the polycrystallized region 808 toward the peripheral region in directions substantially parallel to the surface of the substrate 800 as indicated with arrows 807 in FIG. 11F.

After the heat treatment is completed, the oxide film 803 and the oxide film 805 are removed. With this process, a semiconductor substrate 811 having a polycrystalline silicon film 810 thereon is obtained. The silicon film 802, which was originally in an amorphous state, includes the region 808 in which nickels have been selectively introduced so as to be preferentially polycrystallized and polycrystallized regions 809 in the peripheral area thereof.

Thereafter, a TFT utilizing the obtained polycrystalline silicon film 810 as an active region is formed in the substrate 811 by a known method.

In Example 8, as described above, it is possible to uniformly introduce a minute amount of the catalyst elements by the selective introduction thereof into the amorphous silicon film 802 through the opening 804 provided for the mask layer 803. Utilizing the thus obtained polycrystalline silicon film 810 as an active region, a TFT having a low leak current and an excellent operation characteristic can be obtained. Moreover, since the amount of introduced catalyst elements is uniform in the substrate surface, variation in the substrate surface in the crystal growth state is small. As a result, variation in operation of the obtained TFTs in the substrate surface is also reduced.

EXAMPLE 9

Hereinafter, a method for fabricating a semiconductor device according to Example 9 of the present invention will be described.

In Example 9, the steps until the state shown in FIG. 10B in Example 7 or the state shown in FIG. 11D in Example 8 is obtained are the same as those in Examples 7 and 8. Therefore, the description thereof is herein omitted.

Under these states, an oxide film is deposited on the formed amorphous silicon film, and a solution containing nickel ions as the catalyst elements at a concentration of 25 ppm is applied onto the surface of the substrate by conducting two spin coat cycles. With this process, a minute amount of nickel ions alone serving as the catalyst elements for accelerating the polycrystallization of the amorphous silicon film is added onto the oxide film. The above oxide film is provided for improving the wettability of solution and for uniformly adding the catalyst elements when the spin coat is conducted with a solution containing the catalyst elements. In the case where a solvent having good wettability with the amorphous silicon film, for example isopropyl alcohol, is used as a solvent of the solution, the formation of the above described oxide film is unnecessary.

A concentration of nickel ions in the solution is set at 25 ppm, with which the crystallization of the amorphous silicon film is not started. This intends to prevent crystal nuclei from being generated and the crystal growth from proceeding in the region other than the region in which nickel ions have been selectively introduced so as to be first crystallize the region.

Next, the whole substrate is subjected to a heat treatment at 450° C. once. With this heat treatment, nickel ions acting as the catalyst elements diffuse, and the lack of nickel ions at the tip portions of the crystal growth is complemented. In the above description, nickels are used as the catalyst elements for accelerating the crystallization of the amorphous silicon film. However, a similar result can be obtained by using any one element selected from a group which consists of Ni, Co, Pd, Pt, Fe, Cu, Ag, Au, In, Sn, P, As and Sb, or a combination of a plurality of the elements.

Thereafter, a solution containing nickel ions at 100 ppm is applied onto the oxide film by conducting the spin coat process, thereby adding a minute amount of nickel ions alone to the oxide film. Then, the whole substrate is subjected to a heat treatment at 550° C. again so as to proceed the crystallization of the amorphous silicon film in a direction substantially parallel to the surface of substrate.

In the above process, while the first heat treatment is conducted for the purpose of diffusing nickel ions, the second heat treatment is conducted for the purpose of proceeding polycrystallization of the amorphous silicon film. If crystallization occurs during the first heat treatment, addition of nickel ions and a heat treatment in subsequent process do not have advantageous effects. Therefore, it is necessary to set a temperature of the first heat treatment at a temperature at which the crystallization is commenced or lower, that is, in the range of 200 to 480° C. On the other hand, a temperature of the second heat treatment needs to be set at a temperature at which the crystallization is commenced or higher, that is, in the range of 480 to 580° C.

After the heat treatment is completed, the mask layer and the oxide film are removed. With this process, a semiconductor substrate having the polycrystalline silicon film thereon is obtained. Thereafter, utilizing the obtained polycrystalline silicon film as an active region, a TFT is formed in the substrate by a known method.

Figure 12:
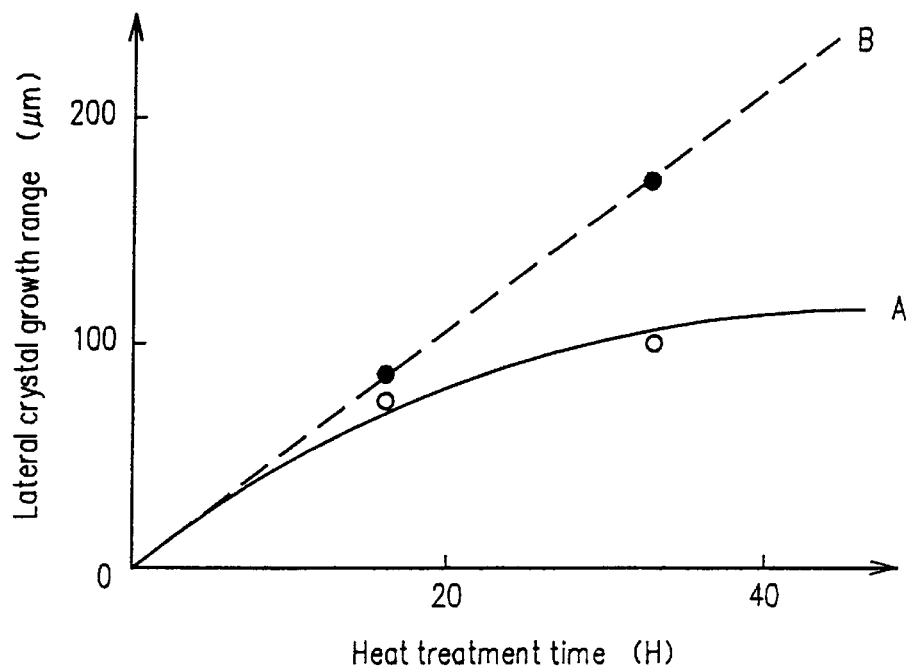
FIG. 12 is a graph showing a relationship between a heating treatment time and a lateral crystal growth range.

FIG. 12, which is a graph showing the relationship between the time period of the heat treatment and the crystal growth range in polycrystallization, shows the data obtained in the case where nickels serving as the catalyst elements are introduced into the amorphous silicon film by spin coat process. Some specific numerical values of data shown in FIG. 12 are also shown in Table 2.

TABLE 2

| Treatment method | Heat treatment time | Growth range |
| --- | --- | --- |
| A | 16 H | 74.3 μm |
|   | 32 H | 101.7 μm |
| B | 16 H | 88.6 μm |
|   | 32 H | 170.9 μm |

In FIG. 12 and Table 2, a solution containing nickel ions at 100 ppm is applied by one spin coat process, and then a heat treatment is conducted at 550° C. in a treatment method A (indicated with a solid line A in FIG. 12). On the other hand, in a treatment method B (indicated with a dashed line B in FIG. 12), a plurality of spin coat cycles are conducted as in above Example 9.

As is apparent from FIG. 12 and Table 2, the crystal growth range in the polycrystallization process tends to be saturated in the treatment method A when a predetermined heat treatment time period is exceeded. On the other hand, in the treatment method B, the crystal growth range is not saturated and tends to increase with elapse in the heat treatment time period.

Figure 13A:
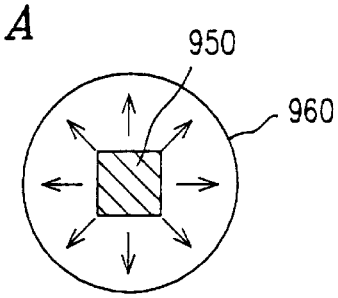
FIGS. 13A and 13B schematically show states of lateral crystal growth according to Example 9 of the present invention.
Figure 13B:
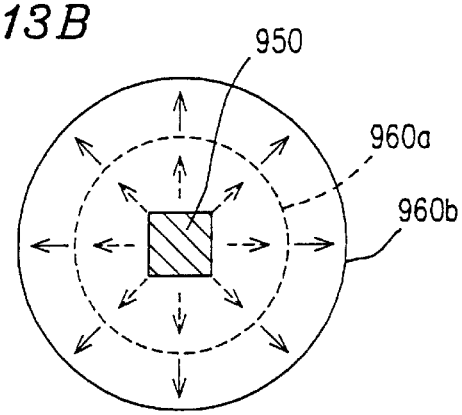

The above results are described with reference to FIGS. 13A and 13B. In the case of the treatment method A, as shown in FIG. 13A, the lateral crystal growth from a region 950, in which nickels have been selectively introduced, is terminated when the amount of nickel ions in the crystal growth ends become insufficient. Thus, a lateral crystal growth region 960 of a certain size is formed. On the other hand, in the case of the treatment method B, as shown in FIG. 13B, nickel ions selectively introduced into the region 950 by the first spin coat process are diffused to a certain region 960a by the first heat treatment. By repeating spin coat process and heat treatment, nickel ions diffuse in the amorphous silicon film, thereby complementing the lack of nickel ions at the tips of crystal growth. Thus, the crystallization substantially parallel to the surface of substrate proceeds more certainly, and a lateral growth region 960b, which is larger than that obtained with the treatment method A as shown in FIG. 13A, is obtained.

As described above, in Examples 7 to 9 of the present invention, a minute amount of solution containing the catalyst elements for accelerating the crystallization is added to the surface of the amorphous silicon film deposited on the substrate by a plurality of spin coat cycles, and then, the whole substrate is subjected to a heat treatment. With this treatment, TFTs of high performance can be obtained by a low-temperature process with the maximum process temperature kept at about 550° C. Since a low concentration of the catalyst elements can be strictly controlled, it is possible to introduce the catalyst elements of a minute amount. Furthermore, it is possible to uniformly introduce the catalyst elements over the entire surface of the amorphous silicon film on the substrate and improve the uniformness of crystal growth.

In particular, when the catalyst elements are introduced after providing the mask layer on the amorphous silicon film, it is possible to selectively provide the polycrystalline silicon film region of good quality and the region remaining amorphous. Furthermore, when a TFT is formed utilizing the obtained polycrystalline silicon film as an active region, deterioration of the operation characteristics of the TFT, in which a leak current increases during OFF period, is prevented from occurring. As a result, a TFT having a large ON/OFF ratio, a low leak current and a high mobility can be obtained. Moreover, since variation in crystal growth state in the substrate surface can be restrained, the variation in TFT characteristics in the substrate surface can be also prevented.

In the plurality of spin coat cycles for introducing the catalyst elements, after the first spin coat cycle, a heat treatment is conducted at a temperature equal to or lower than the temperature at which the crystallization of the amorphous silicon film is commenced, so as to sufficiently diffuse the catalyst elements. After the subsequent second spin coat cycle, it is possible to obtain a longer crystal growth range with a shorter time period in the polycrystallization process by conducting the heat treatment at a temperature equal to or higher than the temperature at which crystallization of the amorphous silicon is commenced. Furthermore, it is possible to effectively and certainly diffuse the catalyst elements by setting a concentration of the catalyst elements in the solution in the first spin coat cycle to a such low value that the crystallization does not occur, and further setting the temperature of the first heat treatment process in the range of 200 to 480° C. Furthermore, by setting a temperature in the second heat treatment temperature in the range of 550 to 580° C., uniform crystallization can be realized in a better state.

Furthermore, since the maximum temperature of processing is held to about 550° C. and the time period for crystallization by heat treatment is shortened, plate glasses having a strain point of about 650° C., which can currently be mass produced, can be used as substrates. As a result, a direct view type driver monolithic liquid crystal display device having a large screen can be mass-produced.

Since it is possible to uniformly introduce the catalyst elements into the substrate having a large area, the size of substrate to be used in mass production is not limited. This can lower the cost for fabricating large-scale semiconductor devices such as active-matrix type TFT-LCD by using the polycrystalline silicon substrates.

Furthermore, since it is possible to control the direction of crystal growth, it is also possible to simultaneously fabricate TFTs having different conductive characteristics on the same substrate according to a fabrication method of a semiconductor device of the present invention as described in Examples 5 and 6. For example, when an active-matrix type TFT-LCD is produced, a TFT, which constitutes a peripheral driving circuit portion requiring a large mobility, is formed so that the carrier moving direction during operation and the crystal growth direction of the crystalline silicon film are parallel to each other. On the other hand, a TFT in a pixel region, where the leak current need to be limited to a small value, is formed so that the carrier moving direction during operation and the crystal growth direction of the crystalline silicon film cross each other. With this arrangement, it is possible to place TFTs which have characteristics required for the respective regions of the formed circuits.

Thus, according to the present invention, the mass production of large-scale semiconductor devices can be realized at low fabrication cost.

EXAMPLE 10

In Example 10 of the present invention, for introducing catalyst elements for accelerating crystallization of the amorphous silicon film, a thin film containing the catalyst elements is formed on an amorphous silicon film by vapor deposition. Hereinafter, a method for fabricating a device for fabricating a semiconductor in Example 10 will be described with reference to FIGS. 14A to 14E. In the following description, an n-type TFT is formed on a glass substrate.

TFTs obtained in Example 10 below are applicable not only to a driver circuit and a pixel portion of an active matrix-type liquid crystal display device but also to a device in which a CPU is formed on the same substrate. Moreover, these TFTs can be used not only for liquid crystal display apparatuses but also to all of the semiconductor devices generally referred to as thin film integrated circuits.

Figure 14A:
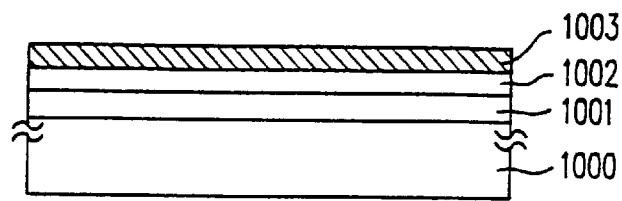
FIGS. 14A through 14E are cross-sectional views illustrating a method for fabricating a semiconductor device according to Example 10 of the present invention.

First, as shown in FIG. 14A, a base coat film 1001 made of silicon oxide having a thickness of about 200 nm is deposited on the glass substrate 1000 by, for example, sputtering. Next, by low-pressure CVD or plasma CVD, an intrinsic (I-type) amorphous silicon film 1002 is deposited to a thickness of 25 to 100 nm, for example, to 80 nm.

Next, an extremely thin film 1003 made of nickel is formed by vacuum deposition. A surface density of nickel on the substrate is preferably in the range of $1 \times 10^{11}$ to $1 \times 10^{14}$ atoms/cm$^3$. As specific treatment conditions, for example, a shielding plate made of SUS having a mesh pattern is placed between a deposition source (target of nickel) and a substrate, and deposition is conducted for 5 seconds with a degree of vacuum during deposition set to $1 \times 10^{-4}$ Pa and a distance between the deposition source and the substrate at 20 cm. In this case, the surface density of nickels to be obtained is about $1 \times 10^{12}$ atoms/cm$^3$.

In a strict sense, when the distance between the deposition source and the substrate is set to 20 cm, a reference plane of the substrate is the surface of the amorphous silicon film 1002 on the substrate 1000. However, since the base coat film 1001 and the amorphous silicon film 1002 are thin, no disadvantages are brought even if these thicknesses are neglected and the above distance is set regarding the surface of the substrate 1000 as a reference plane. In the case where treatment conditions such as kinds of catalyst elements, the shape and the presence of a shielding plate, a degree of vacuum, and a treatment time period differ from the above-mentioned conditions, the distance between the substrate and the deposition source may be changed from the above value, i.e., 20 cm.

Next, the substrate 1000, on which the above layers are successively deposited, is subjected to a heat treatment in a hydrogen reducing atmosphere or an inert gas atmosphere at 520 to 580° C. for several hours to several tens of hours to crystallize the amorphous silicon film 1002. Specifically, for example, a heat treatment is conducted at 550° C. for 8 hours. By this heat treatment, nickels 1003 deposited on the surface of the amorphous silicon film 1002 act as nuclei for crystal growth so as to cause the crystallization of the amorphous silicon film 1002 in a direction perpendicular to the substrate 1000, thereby forming a crystalline silicon film 1002a. Furthermore, since nickels uniformly diffuse into the silicon film simultaneously with the crystallization, a nickel concentration in the crystalline silicon film 1002a is typically $6 \times 10^{17}$ atoms/cm$^3$.

Figure 14B:
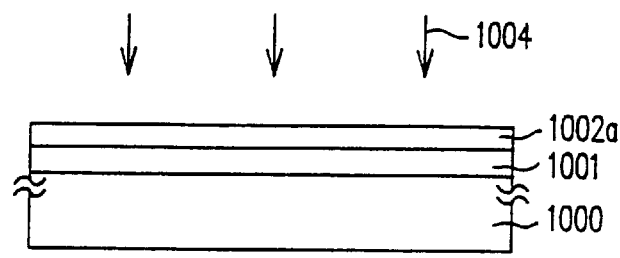

Next, in order to improve the crystallinity of the crystalline silicon film 1002a, an XeCl excimer laser light 1004 (wavelength: 308 nm, pulse width: 40 ns) is radiated as shown in FIG. 14B. The irradiation conditions of the laser light are as follows. A substrate temperature during radiation is in the range of 200 to 450° C., for example, 400° C. An energy density of the laser light is in the range of 200 to 400 mJ/cm$^2$, for example, 300 mJ/cm$^2$. Lasers other than the XeCl laser may also be used.

Figure 14C:
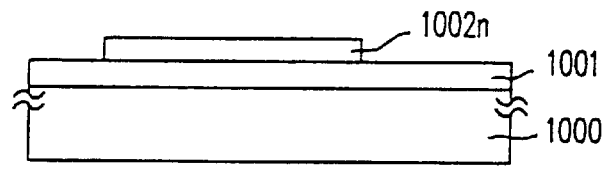

Next, as shown in FIG. 14C, patterning is performed on the crystalline silicon film 1002a so as to remove undesired portions, thereby isolating elements from each other. With this process, an island region 1002n formed of a crystalline silicon film serving as an active region (source/drain regions and a channel region) of a TFT, that is, a region on which a device is to be formed (see FIG. 10D) in the subsequent process, is formed.

Figure 14D:
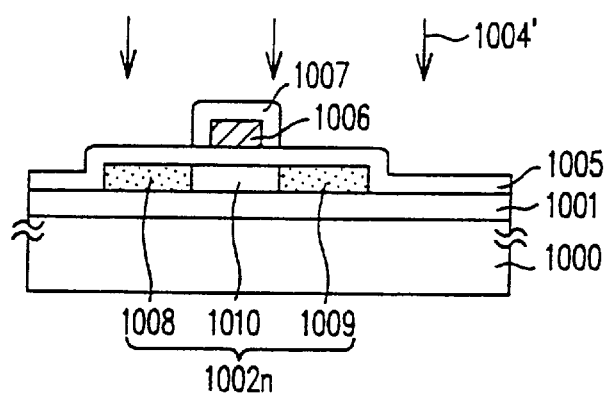

Next, as shown in FIG. 14D, a silicon oxide film is deposited to a thickness of 20 to 150 nm, for example, 100 nm as a gate insulating film 1005 (a silicon oxide film) so as to cover the island region 1002n. The gate insulating film (silicon oxide film) 1005 is formed by decomposing and depositing TEOS (Tetra EthOxy Silane) and oxygen with RF plasma CVD while maintaining a substrate temperature at 150 to 600° C., preferably, 300 to 450° C. Alternatively, the gate insulating film (silicon oxide film) 1005 is formed by decomposing and depositing TEOS and an ozone gas with a low pressure CVD or a normal pressure CVD while maintaining a substrate temperature at 350 to 600° C., preferably, 400 to 550° C.

Next, in order to improve bulk characteristics of the gate insulating film 1005 itself and interface characteristics between the crystalline silicon film 1002n and the gate insulating film 1005, an annealing treatment is performed in an inert gas atmosphere at a temperature in the range of 400 to 600° C. for 30 to 60 minutes. Thereafter, by sputtering, an aluminum film having a thickness in the range of 400 to 800 nm, for example, 600 nm, is deposited. The aluminum film is patterned so as to form a gate electrode 1006.

Next, the gate electrode 1006 is anodized so as to form an oxide layer 1007 thereon. The anodizing is carried out by immersing the substrate into, for example, an ethylene glycol solution containing tartaric acid at 1 to 5%, raising an applied voltage to 220 V while keeping a constant current, and holding the substrate in such a state for an hour. A thickness of the obtained oxide film 1007 is typically 200 nm. The oxide film 1007 is used for forming an offset gate region during an ion doping process described below. Thus, by properly controlling parameters of the above anodizing process to control the thickness of the oxide layer 1007, it is possible to determine a length of the offset gate region. Moreover, by forming the oxide film 1007, it is possible to prevent hillocks from being generated on the aluminum film constituting the gate oxide film 1006 in the subsequent process.

Subsequently, the region 1002n on which a device is to be formed is doped with phosphorus acting as an n-type impurity by ion doping, utilizing the gate electrode 1006 and the oxide layer 1007 formed thereon as masks. Specifically, phosphine ($PH_3$) is used as a doping gas, an accelerating voltage is in the range of 60 to 90 kV for example, 80 kV, and a dose amount is in the range of $1 \times 10^{15}$ to $8 \times 10^{15}$ $cm^{-2}$, for example, $2 \times 10^{15}$ $cm^{-2}$. The regions 1008 and 1009 which are doped with the impurities by the ion doping process are later to be source/drain regions of a TFT, and a region 1010 which is masked with the gate electrode 1006 and the oxide layer 1007 so as to prevent the region being doped with the impurities is later to be a channel region of a TFT.

Next, annealing is performed by radiating a laser light 1004' so as to activate the doped impurities and, at the same time, to improve the crystallinity of the portion where crystallinity is deteriorated by the above ion doping process. For example, the XeCl excimer laser (wavelength: 308 nm, pulse width: 40 ns) can be used, and the light is radiated with an energy density in the range of 150 to 400 $mJ/cm^2$, preferably, 250 $mJ/cm^2$. A sheet resistance of the thus formed regions 1008 and 1009, in which phosphorus acts as an n-type impurity, is typically in the range of 200 to 800 $\Omega/\square$. Lasers other than the XeCl laser can also be used.

Figure 14E:
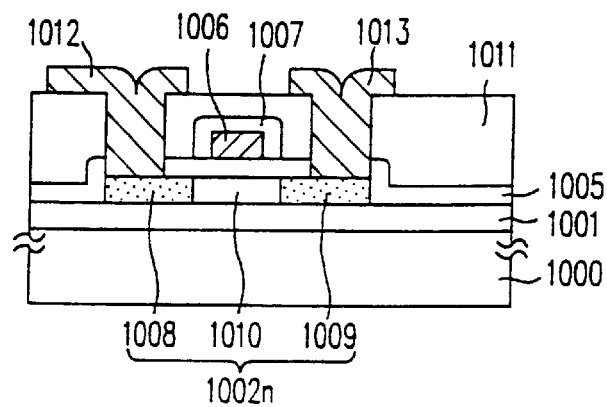

Next, as shown in FIG. 14E, a silicon oxide film or a silicon nitride film having a thickness of 600 nm is deposited as an interlayer insulating film 1011. In the case where the silicon oxide film is used, TEOS and oxygen are decomposed and deposited by plasma CVD. Alternatively, TEOS and ozone are decomposed and deposited by low pressure CVD or normal pressure CVD. With this process, the excellent interlayer insulating film 1011, which can sufficiently cover the difference in levels on the surface of the substrate, is deposited. Alternatively, when the interlayer insulating film 1011 is formed by using a silicon nitride film deposited by plasma CVD using $SiH_4$ and $NH_3$ as material gases, it is possible to supply hydrogen atoms to the interface between the crystalline silicon film (active region) 1002n and the gate insulating film 1005. This has the effect of reducing unpaired bonds present in the crystalline silicon film 1002n, realizing the improvement in TFT characteristics.

Next, a contact hole is formed through the interlayer insulating film 1011. Electrodes/wirings 1012 and 1013 of a TFT formed of metal materials, for example, of multi-layered films of titanium nitride and aluminum, are formed and connected to the source/drain regions 1008 and 1009. As the last step, then, annealing is performed in a hydrogen atmosphere of 1 atm. at 350° C. for 30 minutes, thereby completing a TFT.

In the thus formed TFT in Example 10, the base coat film 1001 made of silicon oxide for preventing the diffusion of impurities from the substrate 1000 is formed on the glass substrate 1000, as can be seen in the cross-sectional view shown in FIG. 14E. The active region 1002n formed from a crystalline silicon film having the source/drain regions 1008 and 1009 and the channel region 1010 is formed on the base coat film 1001, and the gate insulating film 1005 made of silicon oxide is formed on the active region 1002n. The gate electrode 1006 formed from an aluminum film is formed so as to face the channel region 1010. On the surface of the gate electrode 1006, the oxide film 1007 formed by anodizing is provided. The interlayer insulating film 1011 made of silicon oxide and silicon nitride is formed so as to cover the oxide film 1007. The electrodes/wirings 1012 and 1013, which is formed of metal materials, for example, of double-layered films of titanium nitride and aluminum, are further formed on the interlayer insulating film 1011, and are electrically connected to the source/drain regions 1008 and 1009 through the contact hole formed in the gate insulating film 1005 and the interlayer insulating film 1011.

The thus fabricated TFT of Example 10 can be used in a peripheral driver circuitry, a switching element in a pixel region, or a thin film integrated circuit in which a CPU is constituted. In the case where the TFT of Example 10 is used as an element for switching a pixel electrode, one of the electrodes/wirings 1012 and 1013 is connected to an pixel electrode formed from a transparent conductive film such as ITO, and a signal is inputted from the other electrode/wiring. In the case where the TFT of Example 10 is used in a thin film integrated circuit, another contact hole is formed on the gate electrode 1006 and a necessary wiring connected to the gate electrode 1006 is formed.

The thus fabricated n-type TFT exhibits good characteristics such as a field-effect mobility in the range of 120 to 150 $cm^2/Vs$, an S value in the range of 0.2 to 0.4 V/figure, and a threshold voltage in the range of 2 to 3 V. The variation in characteristics among a number of TFTs formed on one and the same substrate 1000 is ±12% in terms of the field-effect mobility and ±8% or less in terms of the threshold voltage. Thus, a number of TFTs excellent in the uniformness and stability in characteristics can be formed. Herein, the S value represents a rise coefficient in a subthresh region of TFT. Specifically, in a graph showing the relationship between the gate voltage and the drain current, a gradient of the graph at the point where the drain current rapidly rises is represented as a change in the gate voltage for an increase in the drain current for one digit.

EXAMPLE 11

Also in Example 11 of the present invention, in order to introduce catalyst elements for accelerating crystallization of an amorphous silicon film, a thin film containing the catalyst elements is formed on the amorphous silicon film by vapor deposition. Hereinafter, a method for fabricating a device for fabricating a semiconductor in Example 11 will be described with reference to FIGS. 15A to 15F. In the following description, a p-type TFT is formed on a glass substrate.

Figure 15A:
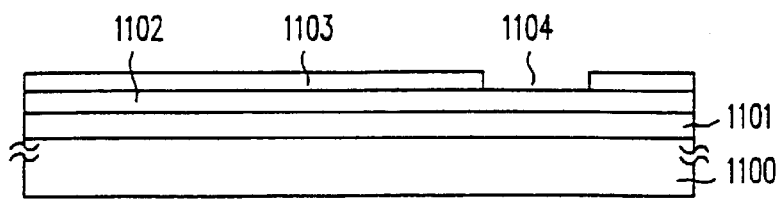
FIGS. 15A through 15F are cross-sectional views illustrating a method for fabricating a semiconductor device according to Example 11 of the present invention.

First, as shown in FIG. 15A, a base coat film 1101 made of silicon oxide having a thickness of about 200 nm is deposited on the glass substrate 1100 by, for example, sputtering. Next, by low-pressure CVD or plasma CVD, an intrinsic (I-type) amorphous silicon film 1102 is deposited to a thickness of 25 to 100 nm, for example, to 80 nm.

Next, a mask layer 1103 is formed from an insulating thin film having a thickness of about 50 nm, which is formed from, for example, a silicon oxide film or a silicon nitride film. Furthermore, a predetermined region of the mask 1103 is selectively removed, and a slit-like opening 1104 is formed.

Figure 16A:
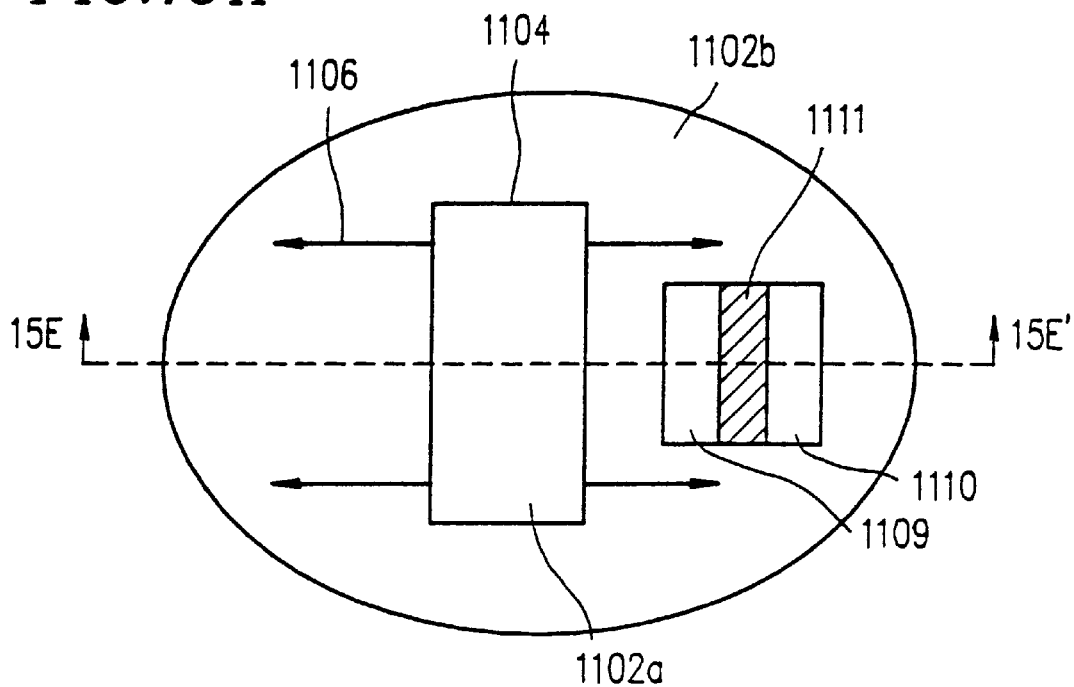
FIGS. 16A and 16B are top plan views illustrating a semiconductor substrate on which a TFT is formed according to Example 11 of the present invention.

FIG. 16A shows the upper surface of the substrate through which the opening 1104, whose cross-section is shown in FIG. 15A, is formed. The amorphous silicon film 1102 is exposed in the portion corresponding to the opening 1104, and the remaining region is masked.

Figure 15B:
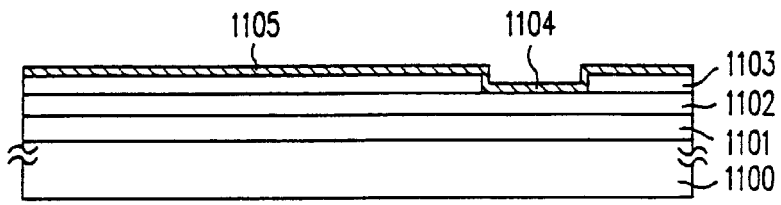

After the mask layer 1103 is formed, as shown in FIG. 15B, an extremely thin film 1105 made of nickel is formed by vacuum deposition. A surface density of nickel on the substrate is preferably in the range of $5 \times 10^{10}$ to $5 \times 10^{13}$ atoms/cm³. As specific treatment conditions, for example, deposition is conducted for 5 seconds, with a degree of vacuum during deposition set to $1 \times 10^{-4}$ Pa and a distance between the deposition source and the substrate set to 40 cm. In this case, the surface density of nickels to be obtained is about $2 \times 10^{13}$ atoms/cm³. Over the opening 1104, the deposited nickel film 1105 is in contact with the amorphous silicon film 1102 which is exposed through the opening 1104. As a result, a minute amount of nickels are selectively introduced into the region of the amorphous silicon film 1102, which corresponds to the opening 1104.

Next, the substrate 1100, on which the above layers are successively deposited, is subjected to a heat treatment in a hydrogen reducing atmosphere or in an inert gas atmosphere so as to crystallize the amorphous silicon film 1102. Specifically, the heat treatment is conducted, for example, at 550° C. for 16 hours. With this heat treatment, the region (corresponding to the opening 1104) of the amorphous silicon film 1102, in which a minute amount of nickels have been selectively introduced, is crystallized in a direction perpendicular to the substrate 1100, thereby forming a crystalline silicon film 1102a (see FIG. 15C). Furthermore, since nickels uniformly diffuse into the silicon film simultaneously with the crystallization, a nickel concentration in the crystalline silicon film 1102a is typically $4 \times 10^{18}$ atoms/cm³.

Figure 15C:
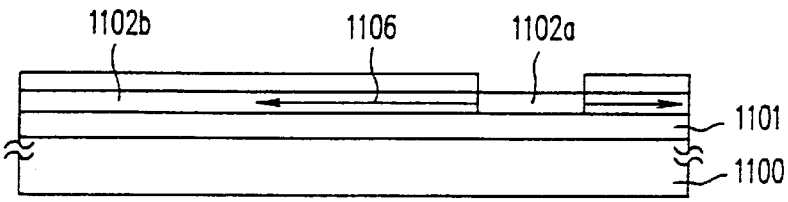

In the periphery of the crystalline silicon film 1102a corresponding to the opening 1104, as indicated with arrows 1106 in FIG. 15C, the crystal growth proceeds in a direction substantially perpendicular to the surface of the substrate 1100, thereby forming the laterally grown crystalline silicon film 1102b. A nickel concentration in the crystalline silicon film 1102b which is laterally grown is typically $2 \times 10^{17}$ atoms/cm³ which is a smaller value by about one digit as compared with that of the crystalline silicon film 1102a which is grown by directly introducing nickels. The lateral crystal growth range indicated with arrows 1106 is typically about 80 μm.

Next, after the mask layer 1103 is removed, a KrF excimer laser light (wavelength: 248 nm, pulse width: 20 ns) is radiated in order to improve the crystallinity of the crystalline silicon film 1102b. The radiation conditions of the laser light are as follows. A substrate temperature during radiation is in the range of 200 to 450° C., for example, 350° C. An energy density of the laser light is in the range of 200 to 400 mJ/cm², for example, 250 mJ/cm². Lasers other than the KrF lasers may also be used.

Figure 15D:
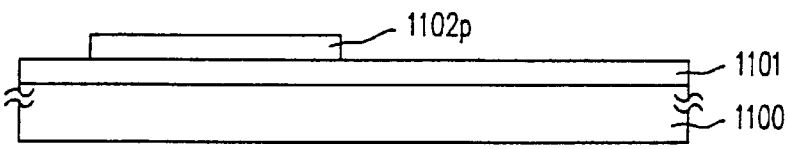

Next, as shown in FIG. 15D, patterning is performed on the crystalline silicon film 1102b so as to remove undesired portions, thereby separating elements from each other. With this process, an island region 1102p, which is formed from a crystalline silicon film serving as an active region (source/drain regions and a channel region) of a TFT, that is, a region on which a device is to be formed (see FIGS. 15D and 15E) in the subsequent process, is formed.

Figure 15E:
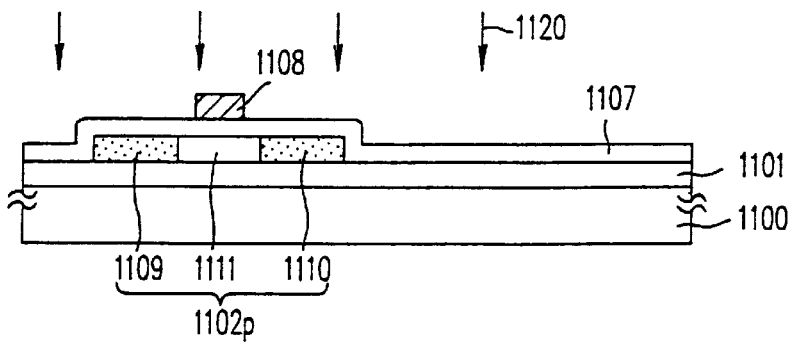

Next, as shown in FIG. 15E, a silicon oxide film is deposited to a thickness of 20 to 150 nm, for example, 100 nm as a gate insulating film 1107 (a silicon oxide film) so as to cover the island region 1102p. The gate insulating film (silicon oxide film) 1107 is formed by sputtering in an oxide atmosphere or a mixed atmosphere of oxygen and argon, using silicon oxide as a target member. A substrate temperature during sputtering is set in the range of 200 to 400° C., for example at 350° C. The ratio of argon to oxygen (argon/oxygen) in the atmosphere during sputtering is set to 0.5 or less, for example, 0.1 or less.

Thereafter, by sputtering, an aluminum film having a thickness of 400 nm is deposited. The aluminum film is patterned so as to form a gate electrode 1108.

Next, the region 1102p, on which a device is to be formed, is doped with boron serving as a p-type impurity by ion doping, using the gate electrode 1108 as a mask. Specifically, ion doping is conducted using diborane ($B_2H_6$) as a doping gas, under the conditions that an accelerating voltage is in the range of 40 to 80 kV, for example, 65 kV and a dose amount is in the range of $1 \times 10^{15}$ to $8 \times 10^{15}$ cm⁻², for example, $5 \times 10^{15}$ cm⁻². By this ion doping process, regions 1109 and 1110 doped with the impurities are to be source/drain regions of a TFT, and a region 1111, which is masked with the gate electrode 1108 so as to prevent the region from being doped with the impurities, is to be a channel region of a TFT in the subsequent process.

Next, annealing is performed by radiating a laser light 1120 so as to activate the doped impurities and, at the same time, to improve the crystallinity of the portion where crystallinity is deteriorated by the above ion doping process. For example, the KrF excimer laser (wavelength: 248 nm, pulse width: 20 ns) can be used, and the laser light having an energy density of 200 to 400 mJ/cm², preferably, 250 mJ/cm² is radiated. A sheet resistance of the thus formed regions 1109 and 1110 which are doped with boron acting as a p-type impurity is typically in the range of 500 to 900 Ω/□.

Figure 15F:
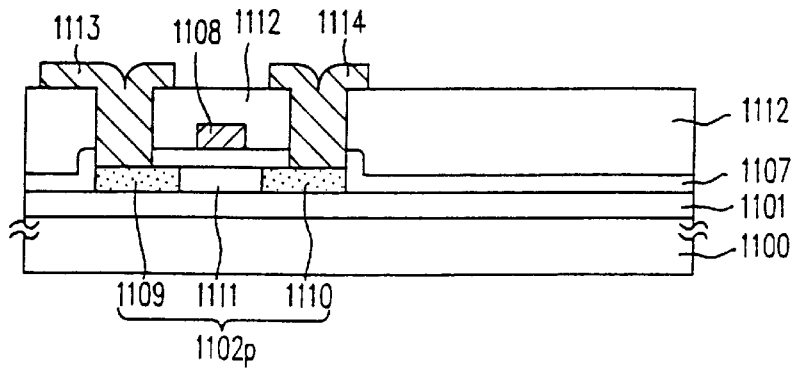

Next, as shown in FIG. 15F, a silicon oxide film having a thickness of about 600 nm is deposited as an interlayer insulating film 1112. The silicon oxide film (interlayer insulating film) 1112 is formed by decomposing and depositing TEOS and oxygen by plasma CVD, or, alternatively, by decomposing and depositing TEOS and ozone by low pressure CVD or normal pressure CVD. With this process, the excellent interlayer insulating film 1112, which can sufficiently cover the difference in levels of the surface of the substrate, is deposited.

Next, a contact hole is formed through the interlayer insulating film 1112. Electrodes/wirings 1113 and 1114 of a TFT formed of metal materials, for example, of multilayered films of titanium nitride and aluminum, are formed and connected to the source/drain regions 1109 and 1110. As the last step, then, annealing is performed in a hydrogen atmosphere of one atm at 350° C. for 30 minutes, thereby completing a TFT.

In the thus formed TFT in Example 11, the base coat film 1101 made of silicon oxide for preventing the diffusion of impurities from the substrate 1100 is formed on the glass substrate 1100, as can be seen in the cross-sectional view shown in FIG. 15F. The active region 1102p formed from a crystalline silicon film having the source/drain regions 1109 and 1110 and the channel region 1111 is formed on the base coat film 1101, and the gate insulating film 1107 made of silicon oxide is formed on the active region 1102p. The gate electrode 1108 formed from an aluminum film is formed on the gate insulating film 1107 so as to face the channel region 1111. The interlayer insulating film 1112 made of silicon oxide or silicon nitride is formed so as to cover the gate electrode 1108. The electrodes/wirings 1113 and 1114 of a TFT, which are formed of metal materials, for example, of double-layered films of titanium nitride and aluminum, are further formed on the interlayer insulating film 1112, and are electrically connected to the source/drain regions 1109 and 1110 through the contact hole which is formed through the gate insulating film 1107 and the interlayer insulating film 1112.

The thus fabricated TFT of Example 11 can be used in a peripheral driver circuitry, a switching element in a pixel region, or a thin film integrated circuit in which a CPU is constituted. In the case where the TFT of Example 11 is used as an element for switching a pixel electrode, one of the electrodes/wirings 1113 and 1114 is connected to an pixel electrode formed from a transparent conductive film such as ITO, and a signal is inputted from the other electrode/wiring. In the case where the TFT of Example 11 is used in a thin film integrated circuit, another contact hole is formed on the gate electrode 1108 and a necessary wiring connected to the gate electrode 1108 is formed.

The thus fabricated p-type TFT exhibits good characteristics such as a field-effect mobility in the range of 120 to 140 $cm^2$/Vs, an S value in the range of 0.3 to 0.5 V/figure, and a threshold voltage in the range of −2 to −3 V. The variation in characteristics among a number of TFTs formed on one and the same substrate 1100 is ±10% in terms of the field-effect mobility and ±5% or less in terms of the threshold voltage. Thus, a number of TFTs exhibiting a high level of uniformity and stability can be formed.

Figure 16B:
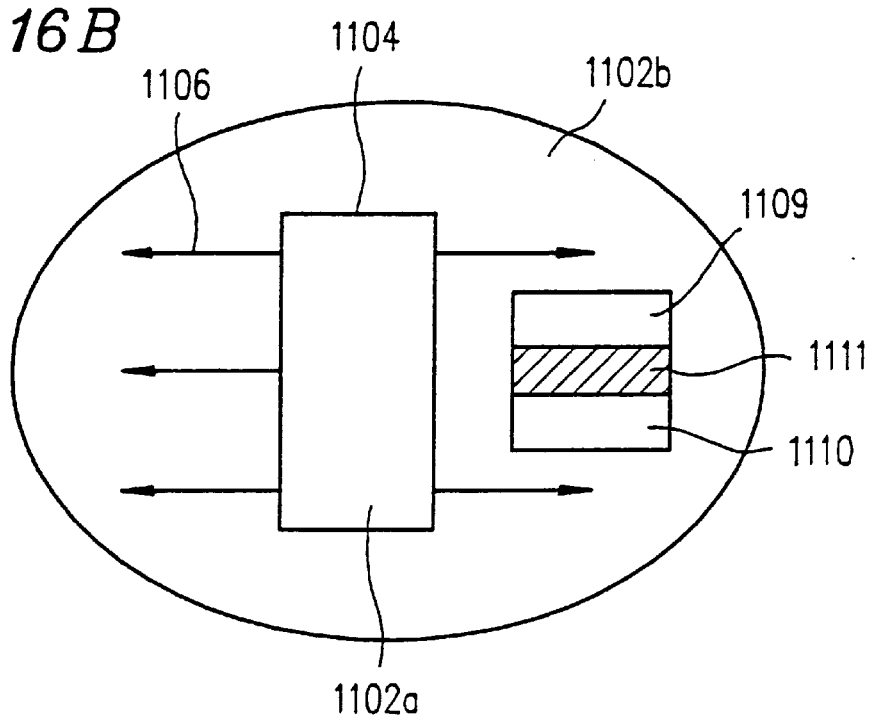

FIGS. 16A and 16B are top plan views showing the substrate on which a TFT is formed, and illustrate the positional arrangement between the position where a TFT is to be formed and the position of the opening 1104 provided for the mask layer 1103. A cross-sectional view cut along a line 15E–15E' in FIG. 16A corresponds to FIG. 15E.

In Example 11 described above, for forming a TFT in the crystalline silicon film 1102*b* obtained by the lateral crystal growth from the region 1102*a* which is crystallized by selectively introducing nickels, the source/drain regions 1109 and 1110 and the channel region 1111 are disposed with respect to the crystal growth directions indicated with the arrows 1106 as shown in FIG. 16A. With this arrangement, the carrier moving direction and the crystal growth directions 1106 accord with each other, and therefore, crystal grain boundaries do not exist against the carrier moving direction. Thus, a TFT having a high mobility is realized.

Alternatively, the source/drain regions 1109 and 1110 and the channel region 1111 may be placed with respect to the crystal growth directions 1116, as shown in FIG. 16B. With this arrangement, the carrier moving direction and the crystal growth directions 1106 cross each other. Thus, upon moving, the carriers traverse a number of crystal grain boundaries, resulting in increase in the resistance between the source and the drain. Although the mobility is lowered with the increase in the resistance, the trap density of the grain boundaries at the edges of the drain region which may degrade the characteristics during TFT operation is reduced. Therefore, it is possible to fabricate a TFT having a large ON/OFF ratio.

EXAMPLE 12

Also in Example 12 of the present invention, in order to introduce catalyst elements for accelerating crystallization of an amorphous silicon film, a thin film containing the catalyst elements is formed on the amorphous silicon film by vapor deposition. Hereinafter, a method for fabricating a device for fabricating a semiconductor in Example 12 will be described with reference to FIGS. 17A to 17E. In the following description, a circuit having CMOS structure including an n-type TFT and a p-type TFT constituted in a complementary form on a glass substrate, which is used in a peripheral driver circuitry of an active-matrix type liquid crystal display device and a general thin film integrated circuit, is described by using a method of Example 12.

Figure 17A:
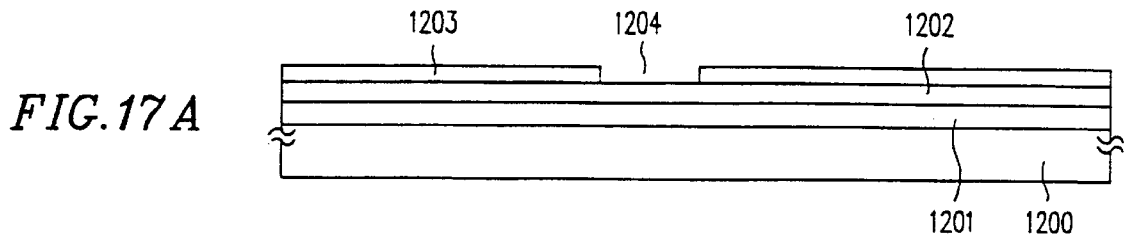
FIGS. 17A through 17E are cross-sectional views illustrating a method for fabricating a semiconductor device according to Example 12 of the present invention.

First, as shown in FIG. 17A, a base coat film 1201 made of silicon oxide having a thickness of about 100 nm is deposited on a glass substrate 1200 by, for example, sputtering. Next, by low-pressure CVD, an intrinsic (I-type) amorphous silicon film 1202 is deposited to a thickness of 25 to 100 nm, for example, to 50 nm.

Next, a mask layer 1203 is formed of an insulating thin film having a thickness of about 50 nm, which is formed from, for example, a silicon oxide film or a silicon nitride film. Furthermore, a predetermined region of the mask 1203 is selectively removed, and a slit-like opening 1204 is formed.

Figure 18:
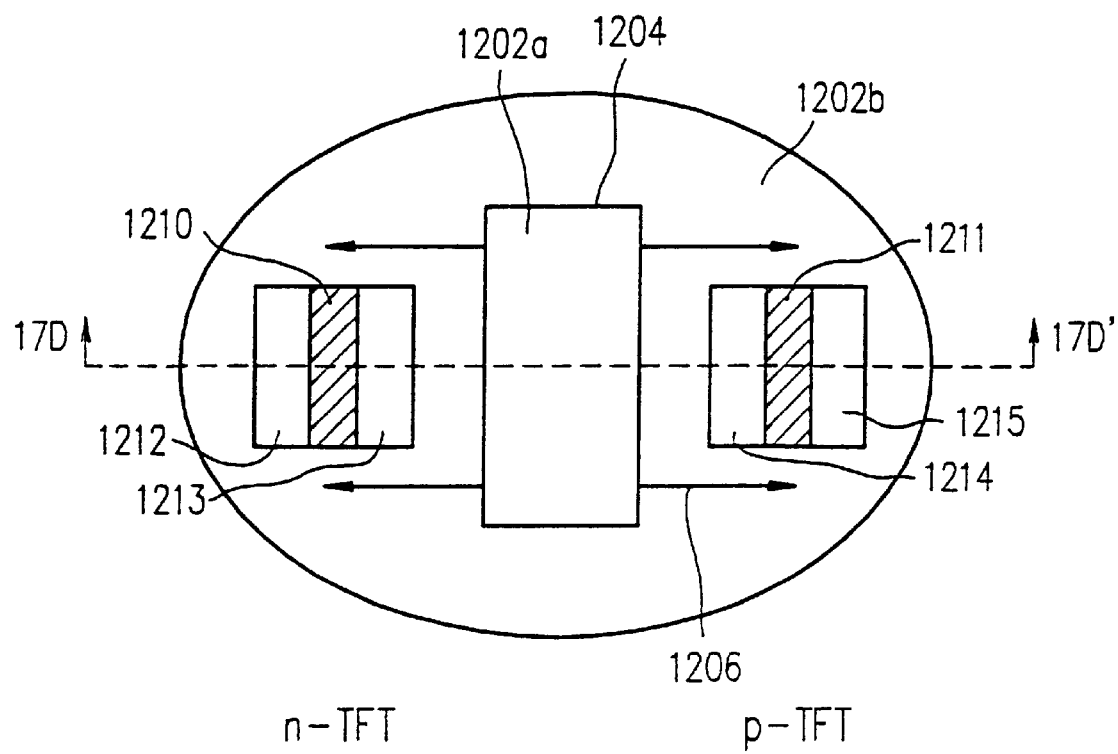
FIG. 18 is a top plan views illustrating a semiconductor substrate on which a TFT is formed according to Example 12 of the present invention.

FIG. 18 shows the upper surface of the substrate through which the opening 1204 is formed, whose cross-section is shown in FIG. 17A. The region of the amorphous silicon film 1203 corresponding to the opening 1204 is exposed, and the remaining region is masked.

Figure 17B:
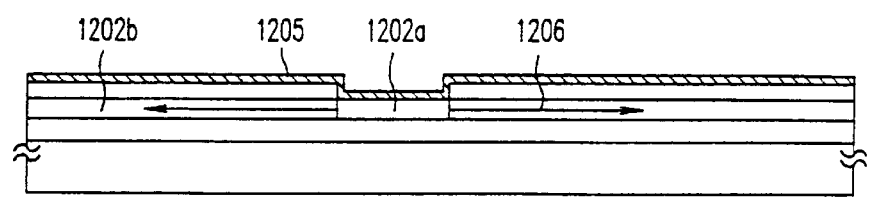

After the mask layer 1203 is formed, as shown in FIG. 17B, an extremely thin film 1205 made of nickel is formed by vacuum deposition. A surface density of nickels on the substrate is preferably in the range of $5 \times 10^{10}$ to $5 \times 10^{13}$ atoms/$cm^3$. As specific treatment conditions, for example, deposition is conducted for 5 seconds, with a degree of vacuum during deposition set to $1 \times 10^{-4}$ Pa and a distance between the deposition source and the substrate set to 60 cm. In this case, the surface density of nickels to be obtained is about $1 \times 10^{13}$ atoms/$cm^3$. The deposited nickel film 1205 is in contact with the amorphous silicon film 1202 in the opening 1204. A minute amount of nickels are selectively introduced into the region of the amorphous silicon film 1202 corresponding to the opening 1204.

Next, the substrate 1200, on which the above layers are successively deposited, is subjected to a heat treatment in a hydrogen reducing atmosphere or in an inert gas atmosphere so as to crystallize the amorphous silicon film 1202. Specifically, the heat treatment is conducted, for example, at 550° C. for 16 hours. With this heat treatment, the region of the amorphous silicon film 1202, into which a minute amount of nickels have been selectively introduced, is first crystallized in a direction perpendicular to the substrate 1200, thereby forming a crystalline silicon film 1202*a*. Furthermore, since nickels uniformly diffuse into the silicon film simultaneously with the crystallization, a nickel concentration in the crystalline silicon film 1202*a* is typically $2 \times 10^{18}$ atoms/$cm^3$.

In the periphery of the crystalline silicon film 1202*a* corresponding to the opening 1204, as indicated with arrows 1206 in FIG. 17B, the crystal growth proceeds in a direction substantially parallel to the surface of the substrate 1200, thereby forming a laterally grown crystalline silicon film 1202*b*. A nickel concentration in the crystalline silicon film 1202*b* which is laterally grown is typically $1 \times 10^{17}$ atoms/$cm^3$, which is a smaller value by about one digit, as compared with that of the crystalline silicon film 1202*a* which is grown by directly introducing nickels. The lateral crystal growth range indicated with arrows 1206 is typically about 80 μm.

Next, after the mask layer 1203 is removed, an XeCl excimer laser light (wavelength: 308 nm, pulse width: 40 ns) is radiated in order to improve the crystallinity of the crystalline silicon film 1202b. The radiation conditions of the laser light are as follows. A substrate temperature during irradiation is in the range of 200 to 450° C., for example, 400° C. An energy density of the laser light is in the range of 200 to 400 mJ/cm$^2$, for example, 300 mJ/cm$^2$.

Figure 17C:
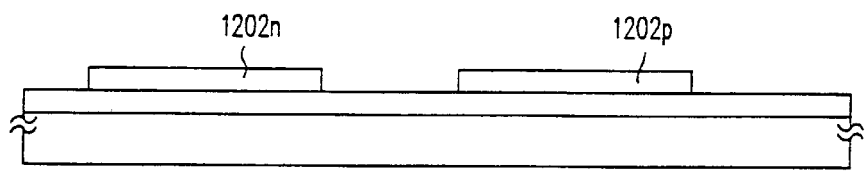

Next, as shown in FIG. 17C, patterning is performed on the crystalline silicon film 1202b so as to remove undesired portions, thereby separating elements from each other. With this process, island regions 1202n and 1202p formed from a crystalline silicon film serving as active regions (source/drain regions and channel regions) of TFTs, that is, regions on which devices are to be formed (see FIGS. 17D and 17E) in the subsequent process, are formed. The region 1202n is used for forming an n-type TFT, and the region 1202p is used for forming a p-type TFT.

Figure 17D:
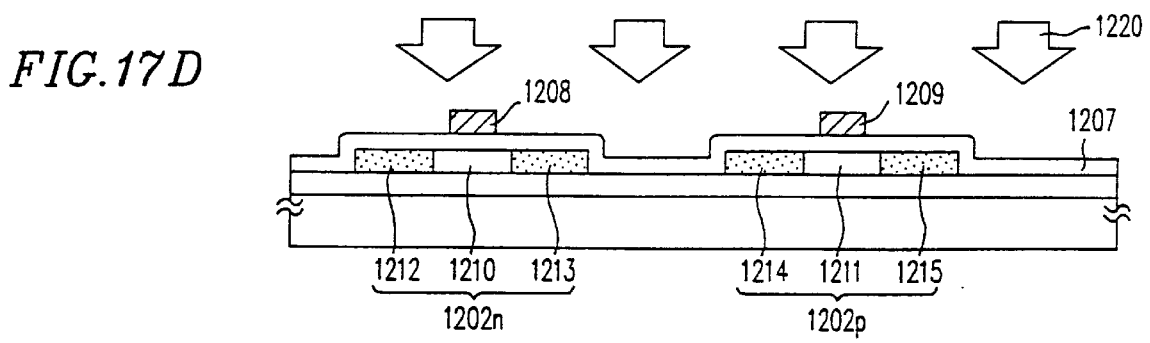

Next, as shown in FIG. 17D, a silicon oxide film is deposited to a thickness of 100 nm as a gate insulating film 1207 so as to cover the island regions 1202n and 1202p formed from crystalline silicon films. The gate insulating film (silicon oxide film) 1207 is formed by decomposing and depositing TEOS and oxygen by RF plasma CVD while setting a substrate temperature at 350° C.

Thereafter, an aluminum film (containing silicon at 0.1 to 2%) having a thickness in the range of 400 to 800 nm, for example, 600 nm is deposited by sputtering. Gate electrodes 1208 and 1209 are formed by patterning the obtained aluminum film.

Next, the regions 1202n and 1202p, on which devices are to be formed, are respectively doped with phosphorus serving as an n-type impurity and boron serving as a p-type impurity by ion doping, using the gate electrodes 1208 and 1209 as masks. Specifically, doping of phosphorus is performed using phosphine (PH$_3$) as a doping gas, under the conditions that an accelerating voltage is in the range of 60 to 90 kV, for example, 80 kV and a dose amount is in the range of $1\times10^{15}$ to $8\times10^{15}$ cm$^{-2}$, for example, $2\times10^{15}$ cm$^{-2}$. Doping of boron is performed using diborane (B$_2$H$_6$) as a doping gas, under the conditions that an accelerating voltage is in the range of 40 to 80 kV, for example, 65 kV and a dose amount is in the range of $1\times10^{15}$ to $8\times10^{15}$ cm$^{-2}$, for example, $5\times10^{15}$ cm$^{-2}$.

By this ion doping process, regions 1212 through 1215 doped with the impurities are to be source/drain regions of TFTs, and regions 1210 and 1211, which are masked with the gate electrodes 1208 and 1209 so as to prevent the region from being doped with the impurities, are to be channel regions of TFTs in the subsequent process. Upon doping the above n-type and p-type impurity elements, predetermined regions are selectively doped with the impurity elements of the respective conductivity types by covering the region which need not to be doped with impurities with an appropriately patterned photo resist, thereby forming n-type impurity regions 1212 and 1213 and p-type impurity regions 1214 and 1215. Then, an n-type TFT and a p-type TFT are formed by using the thus formed regions.

Next, annealing is performed by radiating a laser light 1220 so as to activate the doped impurities. For example, the XeCl excimer laser (wavelength: 308 nm, pulse width: 40 ns) can be used, and the laser light having an energy density of 250 mJ/cm$^2$ is radiated twice for one portion.

Figure 17E:
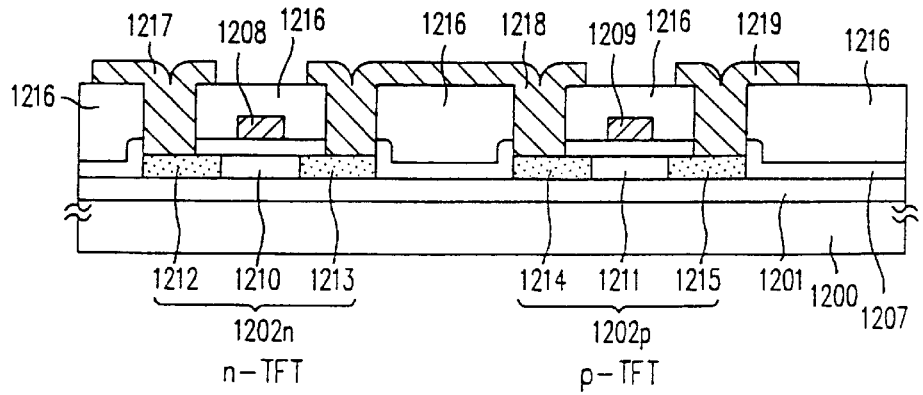

Next, as shown in FIG. 17E, a silicon oxide film having a thickness of about 600 nm is deposited as an interlayer insulating film 1216 by plasma CVD. A contact hole is formed through the interlayer insulating film 1216. Electrodes/wirings 1217 through 1219 of TFTs formed of metal materials, for example, of multi-layered films of titanium nitride and aluminum, are formed and connected to the source/drain regions 1212 through 1215. As the last step, then, annealing is performed in a hydrogen atmosphere of one atm at 350° C. for 30 minutes, thereby completing TFTs.

In the thus formed TFT in Example 12, the base coat film 1201 made of silicon oxide for preventing the diffusion of impurities from the substrate 1200 is formed on the glass substrate 1200, as can be seen in the cross-sectional view shown in FIG. 17E. The active region 1202n of the n-type TFT, which consists of the source/drain regions 1212 and 1213 and the channel region 1210, and the active region 1202p of the p-type TFT, which consists of the source/drain regions 1214 and 1215 and the channel region 1211, are formed in the crystallin silicon film formed on the base coat film 1201. The gate insulating film 1207 made of silicon oxide is formed on the active regions 1202n and 1202p. On the gate insulating film 1207, the gate electrodes 1208 and 1209 formed from aluminum films are formed so as to face the channel regions 1210 and 1211 of the n-type and p-type TFTs, respectively. The interlayer insulating film 1216 made of silicon oxide or silicon nitride is formed so as to cover the gate electrodes 1208 and 1209. The electrodes/wirings 1217 through 1219 of TFTs, which are formed of metal materials, for example, of double-layered films of titanium nitride and aluminum, are further formed on the interlayer insulating film 1216, and are electrically connected to the source/drain regions 1212 through 1215 through the contact hole formed in the gate insulating film 1207 and the interlayer insulating film 1216.

The thus fabricated circuit having CMOS structure exhibits good characteristics as follows. Regarding the n-type TFT, a field-effect mobility is in the range of 150 to 180 cm$^2$/Vs, and a threshold voltage of n-type TFT is in the range of 1.5 to 2 V. Regarding the p-type TFT, a field-effect mobility is in the range of 120 to 140 cm$^2$/Vs, and a threshold voltage of n-type TFT is in the range of –2 to –3 V. The variation in characteristics among a number of TFTs formed on one and the same substrate 1200 is ±12% in terms of the field-effect mobility and ±8% or less in terms of the threshold voltage. Thus, a number of TFTs excellent in the uniformness and stability in characteristics can be formed.

FIG. 18 is a top plan view showing the substrate on which TFTs are formed according to Example 12, and illustrates the positional arrangement between the positions where TFTs are formed and the position of the opening 1204 provided for the mask. A cross-sectional view cut along a line 17D–17D' in FIG. 18 corresponds FIG. 17D.

In Example 12 described above, for forming n-type and p-type TFTs in the crystalline silicon film 1202b obtained by the lateral crystal growth from the region 1202a which is crystallized by selectively introducing nickels, the source/drain regions 1212 through 1215 and the channel region 1210 and 1211 are disposed with respect to the crystal growth directions indicated with the arrows 1206 as shown in FIG. 18. With this arrangement, the carrier moving direction and the crystal growth directions 1206 accord with each other, and therefore, crystal grain boundaries do not exist against the moving direction of carriers. Thus, TFTs having a high mobility are realized.

Alternatively, the source/drain regions 1212 through 1215 and the channel region 1210 and 1211 may be placed so that the moving direction of carriers and the crystal growth directions 1206 cross each other. In this case, carriers traverse a number of crystal grain boundaries upon moving, resulting in increase in the resistance between the source regions and the drain regions. Although the mobility is lowered with the increase in the resistance, the trap density of the grain boundaries at the edges of the drain region, which may degrade the characteristics during the TFT operation, is reduced. Therefore, it is possible to fabricate TFTs having a large ON/OFF ratio.

As described above, in Examples 10 through 12 of the present invention, when the catalyst elements for accelerating crystallization of the amorphous silicon film, a thin film containing the catalyst elements is formed on the surface of the amorphous silicon film by vapor deposition. According to this method, the catalyst elements are introduced in contact with the surface of the amorphous silicon film, and therefore do not deeply enter the film as in the case of plasma treatment. Therefore, the catalyst elements existing in the amorphous silicon film are made to contribute to crystallization. Thus, in the case where the catalyst elements are introduced by using vapor deposition as in Examples 10 through 12, the catalyst elements are not precipitated even if a laser light or an intense light is radiated in the subsequent process.

Since the catalyst elements are introduced into the amorphous silicon film by forming the thin film containing the catalyst elements, the variation in the amount of catalyst elements introduced into the substrate can be reduced. Specifically, in a substrate having a dimension of 127 mm×127 mm, the variation in the catalyst elements introduced into the substrate is within ±5%. Furthermore, by using a larger deposition apparatus, the variation in the amount of catalyst elements to be introduced into a substrate having a larger area can be kept at a level almost equal to the above level. Thus, even if a substrate having a large area is used, it is possible to uniformly introduce the catalyst elements into the entire surface. As a result, a semiconductor device exhibiting a high level of uniformity and stability can be fabricated on a substrate having a large area.

It is desirable that a concentration of the catalyst elements introduced into the amorphous silicon film is sufficiently low. However, if the concentration is too low, the catalyst elements fail to function to accelerate the crystallization of the amorphous silicon film. The inventors of the present application found that the minimum concentration of the catalyst elements with which the crystallization occurs is $1\times10^{16}$ atoms/cm$^3$, and that the crystal growth due to catalyst elements does not occur with a concentration lower than the above one.

On the other hand, if a concentration of the catalyst elements is too high, the catalyst elements adversely affect a semiconductor device to be formed, in particular, a leak current in OFF region of TFT is increased. The reason therefor is considered to be that the catalyst elements form an impurity level in the silicon film and a tunnel current occurs through the impurity level. The inventors of the present application found that the catalyst elements with a concentration up to $1\times10^{19}$ atoms/cm$^3$ do not adversely affect a semiconductor element.

Thus, in order to make the catalyst elements effectively demonstrate the function of accelerating crystallization while inhibiting adverse effect on a semiconductor device to be formed, it is desirable that a concentration of the catalyst elements in the silicon film is in the range of $1\times10^{16}$ to $1\times10^{19}$ atoms/cm$^3$.

In order to introduce the catalyst elements with good controllability in the above range of the minute concentration, it is difficult to control the amount of catalyst elements by a time period for growing a film. In Examples 10 through 12 of the present invention, a minute amount of catalyst elements can be added by increasing the distance between the deposition source and the substrate. The deposition time is set to 5 seconds, taking application to the mass production process into consideration. As a result, a deposition amount (the amount of nickels to be introduced) is inversely proportional to the second power of the distance between the deposition source and the substrate. For example, in the case where the distance between the deposition source and the substrate is 20 cm, a nickel concentration in the surface of the substrate is $1\times10^{14}$ atoms/cm$^3$. If nickels corresponding to this concentration uniformly diffuse into the amorphous silicon film, a nickel concentration in the surface of the substrate is $1\times10^{19}$ atoms/cm$^3$.

Thus, when the distance between the deposition source and the substrate is set at 20 cm or more, it is possible to introduce the catalyst elements so that a concentration thereof in the amorphous silicon film is $1\times10^{19}$ atoms/cm$^3$ or less.

Providing the shielding plate between the deposition source and the substrate is effective to inhibit a large amount of deposition. In this case, a desired deposition amount can be realized by changing the shape of the shielding plate. In particular, by using a mesh-shaped shielding plate made of SUS, it is possible to introduce nickel into the amorphous silicon film at a $1\times10^{19}$ atoms/cm$^3$ or less with good controllability.

In Examples 10 through 12 described above, when nickels are introduced, an extremely thin film made of nickel is formed on the upper surface of the amorphous silicon film by vapor deposition. Alternatively, an extremely thin film made of nickel may be formed on the surface of the base coat film by vapor deposition before forming the amorphous silicon. Thus, in Examples 10 through 12, a minute amount of nickels may be introduced from either the upper face or the lower face of the amorphous silicon film, and therefore, the crystal growth due to nickel may occur from either surface.

EXAMPLE 13

In Example 13 of the present invention, when catalyst elements for accelerating the crystallization of an amorphous silicon film are introduced, a buffer layer, which functions so as to prevent the catalyst elements from diffusing, is formed on the amorphous silicon film, and the catalyst elements are diffused into the amorphous silicon film through the buffer layer. FIGS. 19A through 19E are cross-sectional views showing a method for fabricating a semiconductor device in Example 13.

Figure 19A:
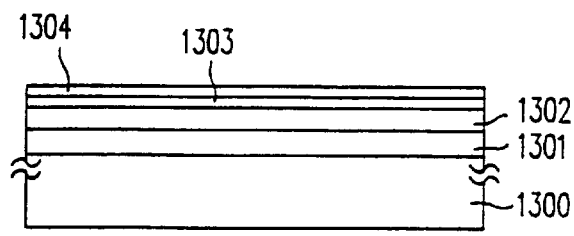
FIGS. 19A through 19E are cross-sectional views illustrating a method for fabricating a semiconductor device according to Example 13 of the present invention.

First, as shown in FIG. 19A, a base coat film 1301 made of silicon dioxide having a thickness of approximately 200 nm is deposited by using a sputtering apparatus onto a cleaned substrate 1300 having an insulating surface, for example, a cleaned glass substrate. Next, by low-pressure CVD or plasma CVD, an intrinsic (I-type) amorphous silicon film 1302 is deposited to a thickness of 25 to 100 nm, for example, to 80 nm.

Next, a surface of the amorphous silicon film 1302 is subjected to thin film oxidation, thereby forming a silicon oxide film 1303 acting as a buffer layer. As a method for forming the silicon oxide film, for example, after removing a native oxide film formed on the surface of the amorphous silicon film 1302 by washing with hydrofluoric acid, the surface of the amorphous silicon film 1302 is immersed into a mixture of a sulfuric acid and a hydrogen peroxide solution at about 80° C. for 10 minutes, thereby forming the silicon oxide film 1303.

A thickness of the thus formed silicon oxide film 1303 is typically about 1 to 2 nm. Although the thickness of the amorphous silicon film 1302 decreases due to formation of the silicon oxide film 1303, the decrease is within 1 nm in this example. Therefore, such a value can be negligible as compared with the initially set thickness.

Subsequently, a thin film 1304 made of nickel acting as catalyst elements is deposited onto the silicon oxide film 1303 by vacuum deposition. A suitable thickness of the nickel thin film 1304 is in the range of about 1 to 10 nm. If a thickness of the nickel thin film 1304 is approximately 1 nm, a sufficient amount of nickel for proceeding the crystallization of the amorphous silicon film 1302 is supplied. In Example 13, an amount of supply of nickel is controlled by not only the thickness of the nickel thin film 1304 but also the thickness of the silicon oxide film 1303 acting as a buffer layer.

Next, the whole substrate 1300, on which the base coat film 1301, the amorphous silicon film 1302, the silicon oxide film 1303 and the nickel thin film 1304 are successively formed, is subjected to a heat treatment at 520 to 580° C. for several to several tens of hours in an inert atmosphere, thereby crystallizing the amorphous silicon film 1302. Specifically, for example, the heat treatment is conducted at 550° C. for 8 hours.

During the heat treatment process, nickels diffuse from the nickel thin film 1304 to the silicon oxide film 1303 and are dispersed in an atomic form therein. Only part of dispersed nickels reach the surface of the amorphous silicon film 1302. As a result, nickels deposited on the surface of the amorphous silicon film 1302 act as crystal growth nuclei. The crystallization of the amorphous silicon film 1302 occurs in a direction perpendicular to the substrate 1300, resulting in a crystalline silicon film 1302a. Furthermore, since nickels uniformly diffuse into the silicon film simultaneously with the crystallization, a nickel concentration in the crystalline silicon film 1302a is typically $5\times10^{17}$ atoms/cm$^3$.

Figure 19B:
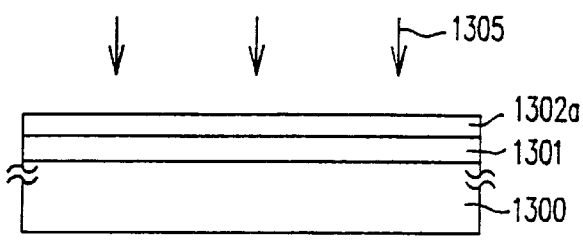

Next, after removing the silicon oxide film 1303 and the nickel thin film 1304, in order to improve crystallinity of the crystalline silicon film 1302a, an XeCl excimer laser light 1305 (wavelength: 308 nm, pulse width: 40 ns) is radiated as shown in FIG. 19B. The irradiation conditions of the laser light are: a substrate temperature during irradiation is in the range of 200 to 450° C., for example, 400° C.; and an energy density of the laser light is 200 to 400 mJ/cm$^2$, for example, 300 mJ/cm$^2$.

Figure 19C:
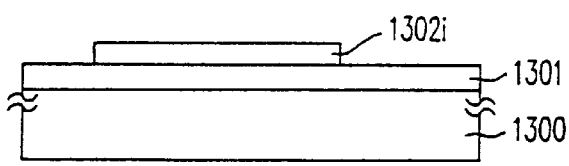

Next, as shown in FIG. 19C, the crystalline silicon film 1302a is patterned so as to remove undesired portions, thereby separating elements from each other. With this process, an island region 1302i formed from a crystalline silicon film to be an active region (source/drain regions and a channel region) of a TFT, that is, a region on which a device is to be formed (see FIG. 19D) in the subsequent process, is formed.

Figure 19D:
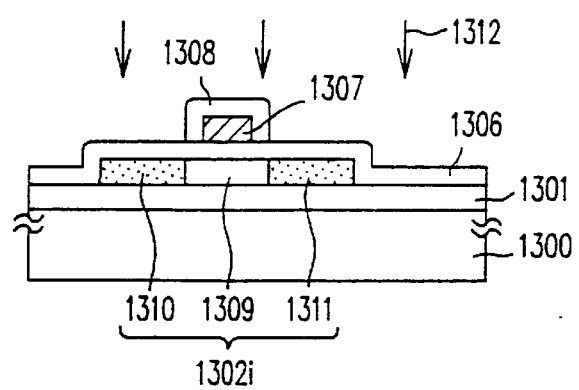

Next, as shown in FIG. 19D, a silicon oxide film having a thickness in the range of 20 to 150 nm, for example, 100 nm, which covers the island region 1302i formed from a crystalline silicon film, is deposited as a gate insulating film 1306. The gate insulating film (silicon oxide film) 1306 is formed by decomposing and depositing TEOS and oxygen by RF plasma CVD while setting a substrate temperature in the range of 150 to 600° C., preferably, in the range of 300 to 450° C. Alternatively, the gate insulating film 1306 is formed by decomposing and depositing TEOS and ozone by low pressure CVD or normal pressure CVD while setting a substrate temperature in the range of 350 to 600° C., preferably, in the range of 400 to 550° C.

Next, in order to improve bulk characteristics of the gate insulating film 1306 itself and interface characteristics between the crystalline silicon film 1302i and the gate insulating film 1306, annealing is performed in an inert gas atmosphere at a temperature in the range of 400 to 600° C. for 30 to 60 minutes. Thereafter, by sputtering, an aluminum film having a thickness in the range of 400 to 800 nm, for example, 600 nm, is deposited. The aluminum film is patterned so as to form a gate electrode 1307.

Next, the gate electrode 1307 is anodized so as to form an oxide layer 1308 thereon. The anodizing is carried out by immersing the substrate into, for example, an ethylene glycol solution containing tartaric acid at 1 to 5%, raising an applied voltage to 220 V while keeping a current constant and holding the substrate in such a state for an hour. A thickness of the obtained oxide film 1308 is typically 200 nm. The oxide film 1308 is used for forming an offset gate region in an ion doping process described below. Thus, by properly controlling parameters of the above anodizing process to control the thickness of the oxide layer 1308, it is possible to determine a length of the offset gate region.

Subsequently, the region 1302i, where a device is to be formed, is doped with phosphorus acting as an n-type impurity by ion doping, utilizing the gate electrode 1307 and the oxide layer 1308 formed thereon as masks. Specifically, in this case, phosphine (PH$_3$) is used as a doping gas, an accelerating voltage is in the range of 60 to 90 kV, for example, 80 kV, and a dose amount is in the range of $1\times10^{15}$ to $8\times10^{15}$ cm$^{-2}$, for example, $2\times10^{15}$ cm$^{-2}$. The regions 1310 and 1311, which are doped with the impurities by the ion doping process, are later to be source/drain regions of a TFT, and a region 1309 which is masked with the gate electrode 1307 and the oxide film 1308 so as to prevent the region from being doped with the impurities, is later to be a channel region of a TFT.

Next, as shown in FIG. 19D, annealing is performed by radiating a laser light 1312 so as to activate the doped impurities and, at the same time, to improve the crystallinity of the portion where crystallinity is deteriorated by the above ion doping process. For example, an XeCl excimer laser (wavelength: 308 nm, pulse width: 40 ns) can be used, and the light is radiated with an energy density of 150 to 400 mJ/cm$^2$, preferably, 200 to 250 mJ/cm$^2$. A sheet resistance of the thus formed regions 1310 and 1311, which are doped with phosphorus acting as an n-type impurity, is typically in the range of 200 to 800 Ω/□.

Figure 19E:
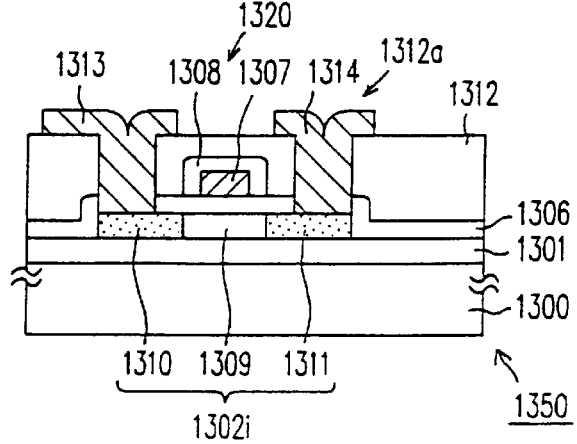

Next, as shown in FIG. 19E, a silicon oxide film or a silicon nitride film having a thickness of 600 nm is deposited as an interlayer insulating film 1312. In the case where the silicon oxide film is used, TEOS and oxygen are decomposed and deposited by plasma CVD. Alternatively, TEOS and ozone are decomposed and deposited by low pressure CVD or normal pressure CVD. With this process, the excellent interlayer insulating film 1312, which can sufficiently cover the difference in levels of the surface of the substrate, is deposited. Alternatively, when the interlayer insulating film 1312 is formed using a silicon nitride film deposited by plasma CVD using SiH$_4$ and NH$_3$ as material gases, it is possible to supply hydrogen atoms to the interface between the crystalline silicon film (active region) 1302i and the gate insulating film 1306. This has the effect of reducing unpaired bonds present in the crystalline silicon film 1302i, realizing the improvement in TFT characteristics.

Next, a contact hole is formed through the interlayer insulating film 1312. Electrodes/wirings 1313 and 1314 of a TFT are formed of metal materials, for example, of multi-layered films of titanium nitride and aluminum, and are connected to the source/drain regions 1310 and 1311. The titanium nitride film functions as a barrier layer for preventing aluminum from diffusing into the crystalline silicon layer 1302i.

As the last step, then, annealing is performed in a hydrogen atmosphere of one atm at 350° C. for 30 minutes, thereby completing an n-type TFT 1320.

In a semiconductor device 1350 having the thus formed n-type TFT 1320 in Example 13, the base coat film 1301 made of silicon oxide for preventing the diffusion of impurities from the substrate 1300 is formed on the glass substrate 1300, as can be seen in the cross-sectional view shown in FIG. 19E. The active region 1302i formed from a crystalline silicon film having the source/drain regions 1310 and 1311 and the channel region 1309 is formed on the base coat film 1301, and the gate insulating film 1306 made of silicon oxide is formed on the active region 1302i. The gate electrode 1307 formed from an aluminum film is formed so as to face the channel region 1309. On the surface of the gate electrode 1307, the oxide film 1308 formed by anodizing is provided. The interlayer insulating film 1312 made of silicon oxide and silicon nitride is formed so as to cover the oxide film 1308. The electrodes/wirings 1313 and 1314, which are formed of metal materials, for example, of double-layered films of titanium nitride and aluminum, are further formed on the interlayer insulating film 1312, and are electrically connected to the source/drain regions 1310 and 1311 through the contact hole 1312a formed through the gate insulating film 1306 and the interlayer insulating film 1312.

In the above description, the crystalline silicon film 1302i contains nickels as the catalyst elements for accelerating crystallization of the amorphous silicon film 1302 due to heat treatment. The crystal grains of the crystalline silicon film 1302i is formed from needle-like or column-like crystals in a substantial single crystalline state.

The thus fabricated TFT 1320 of Example 13 can be used in a peripheral driver circuitry, a switching element in a pixel region, or a thin film integrated circuit in which a CPU is constituted. In the case where the TFT 1320 of Example 13 is used as an element for switching a pixel electrode, one of the electrodes/wirings 1313 and 1314 is connected to an pixel electrode formed from a transparent conductive film such as ITO, and a signal is inputted from the other electrode/wiring. In the case where TFT of Example 13 is used in a thin film integrated circuit, another contact hole is formed on the gate electrode 1307, and a necessary wiring connected to the gate electrode 1307 is formed.

The thus fabricated n-type TFT 1320 exhibits good characteristics such as a field-effect mobility in the range of 120 to 150 cm$^2$/Vs, an S value in the range of 0.2 to 0.4 V/figure, and a threshold voltage in the range of 2 to 3 V. The variation in characteristics among a number of TFTs formed on one and the same substrate 1300 is ±12% in terms of the field-effect mobility, and ±8% or less in terms of the threshold voltage. Thus, a number of TFTs excellent in uniformness and stability in characteristics can be formed.

As described above, in Example 13, the active region 1302i formed on the surface of the insulating base coat film 1301 disposed on the substrate 1300 contains the catalyst elements for accelerating the crystallization of the amorphous silicon film 1302 due to heating. Thus, it is possible to further enhance the crystallinity of the crystalline silicon film 1302a obtained by crystallization of the amorphous silicon film, as compared with that of a crystalline silicon film obtained by general solid phase epitaxy.

Since the crystallization of the amorphous silicon film 1302 due to heating is accelerated by the catalyst elements, the crystalline silicon film 1302a of good quality is formed with good productivity. Furthermore, since the heating temperature required for the crystallization can be held to 600° C. or less, even inexpensive glass substrates having poor heat resistance can be used.

Since the laser light 1312 is radiated onto the active region 1302i which consists of the crystalline silicon film obtained by the heat treatment conducted on the amorphous silicon film 1302, it is possible to further improve the crystallinity and the field-effect of carriers in the active region 1302i.

Moreover, by setting a concentration of catalyst elements in the active region 1302i in the range of $1 \times 10^{15}$ to $1 \times 10^{19}$ atoms/cm$^3$, it is possible to use the catalyst elements effectively when the amorphous silicon film 1302 is crystallized.

In addition, in Example 13, the thin film 1304 containing the catalyst elements for accelerating the crystallization of the amorphous silicon film 1302 is formed on the amorphous silicon film 1302. By thermal diffusion from the thin film 1304, the catalyst elements are introduced into the amorphous silicon film 1302. Therefore, it is possible to reduce variation in the amount of catalyst elements to be added to the surface of the same substrate.

Furthermore, the buffer layer is provided between the amorphous silicon film 1302 and the thin film 1304 containing the catalyst elements, and the catalyst elements are diffused through the buffer layer 1303. Thus, most of the catalyst elements are trapped in the buffer layer 1303. As a result, it is possible to introduce the catalyst elements with a minimum necessary amount. Even if a concentration of the catalyst elements varies in the thin film 1304, the variation is moderated while the catalyst elements diffuse in the buffer layer 1303.

EXAMPLE 14

FIGS. 20A through 20F are cross-sectional views showing a method for fabricating a semiconductor device in Example 14. In the following description, a p-type TFT is formed on an insulating substrate such as a glass substrate.

Figure 20A:
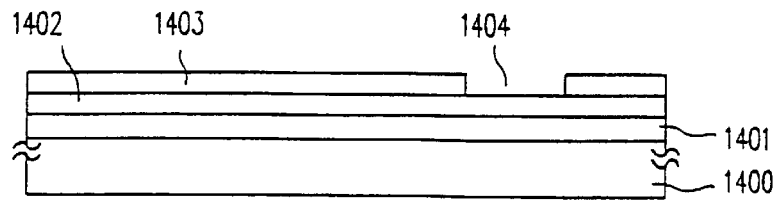
FIGS. 20A through 20F are cross-sectional views illustrating a method for fabricating a semiconductor device according to Example 14 of the present invention.

First, as shown in FIG. 20A, a base coat film 1401 made of silicon dioxide having a thickness of approximately 200 nm is deposited by using a sputtering apparatus onto a cleaned substrate 1400 having an insulating surface, for example, a cleaned glass substrate. Next, by low-pressure CVD or plasma CVD, an intrinsic (I-type) amorphous silicon film 1402 is deposited to a thickness of 25 to 100 nm, for example, to 80 nm.

Next, a mask layer 1403 made of a silicon oxide film, a silicon nitride film or the like is formed on the amorphous silicon film 1402. An opening 1404 is provided at a predetermined position of the mask layer 1403. The amorphus silicon film 1402 is exposed in a slit-like shape through the opening 1404, and the remaining portion is masked.

Figure 20B:
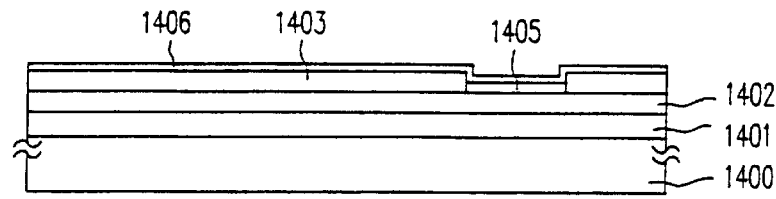

After forming the mask layer 1403 and the opening 1404, as shown in FIG. 20B, a silicon oxide film 1405 is formed on the surface of the amorphous silicon film 1402 exposed through the opening 1404. The silicon oxide film is formed under the same conditions as those in Example 13, using a mixture of a sulfuric acid and a hydrogen peroxide solution.

Subsequently, a thin film 1406 made of nickel acting as a catalyst element is deposited onto the mask layer 1403 and the silicon oxide film 1405 by, for example, vacuum deposition. A suitable thickness of the nickel thin film 1406 is in the range of about 1 to 10 nm. In Example 14, a thickness of the nickel thin film 1406 is 5 nm.

Next, the whole substrate 1400, on which the base coat film 1401, the amorphous silicon film 1402, the mask layer 1403, the silicon oxide film 1405 and the nickel thin film 1406 are successively formed, is subjected to a heat treatment in an inert atmosphere, thereby crystallizing the amorphous silicon film 1402. Specifically, for example, the heat treatment is conducted at 550° C. for 16 hours.

Figure 20C:
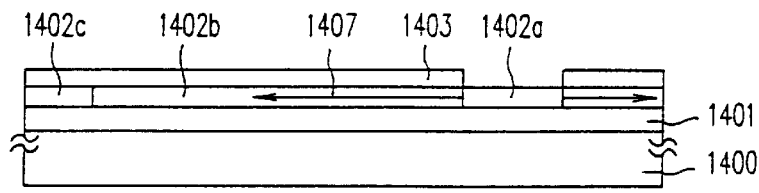
Figure 20D:
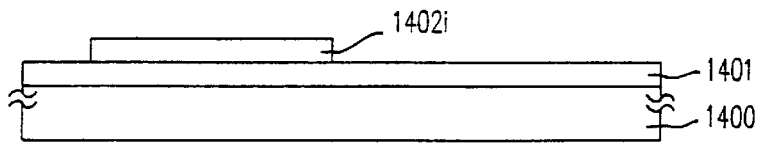

During the heat treatment process, nickels diffuse from the nickel thin film 1406 to the silicon oxide film 1405 and are dispersed in an atomic form therein. Only part of dispersed nickels reach the surface of the amorphous silicon film 1402. As a result, nickels deposited on the surface of the amorphous silicon film 1402 act as crystal growth nuclei. The crystallization of the amorphous silicon film 1402 occurs in a direction perpendicular to the substrate 1400, resulting in a crystalline silicon film 1402*a* as shown in FIG. 20C. Furthermore, since nickels uniformly diffuse into the silicon film simultaneously with the crystallization, a nickel concentration in the crystalline silicon film 1402*a* is typically $1 \times 10^{18}$ atoms/cm$^3$.

On the other hand, in the region other than the opening 1404, the diffusion of nickels is inhibited by the mask layer 1403, so that nickels can not reach the amorphous silicon film 1402 laying below the mask layer. However, in the periphery of the crystalline silicon film 1402*a* corresponding to the opening 1404, the crystal growth proceeds in a direction substantially parallel to the surface of the substrate 1400 as indicated with arrows 1407 in FIG. 20C, thereby forming a laterally grown crystalline silicon film 1402*b*. A nickel concentration in the laterally grown crystalline silicon film 1402*b* is typically $5 \times 10^{16}$ atoms/cm$^3$. This value is smaller by about one digit as compared with that of the crystalline silicon film (seed region) 1402*a* which is grown by directly introducing nickels. The lateral crystal growth range indicated with the arrows 1407 is typically about 80 $\mu$m.

Next, after removing the mask layer 1403, the silicon oxide film 1405 and the nickel thin film 1406, patterning is performed on the crystalline silicon film 1402*b* so as to remove undesired portions, thereby isolating elements from each other. With this process, an island region 1402*i* made from a crystalline silicon film, which is to be an active region (source/drain regions and a channel region) of a TFT, that is, a region on which a device is to be formed (see FIGS. 20E and 20F) in the subsequent process, is formed.

Figure 20E:
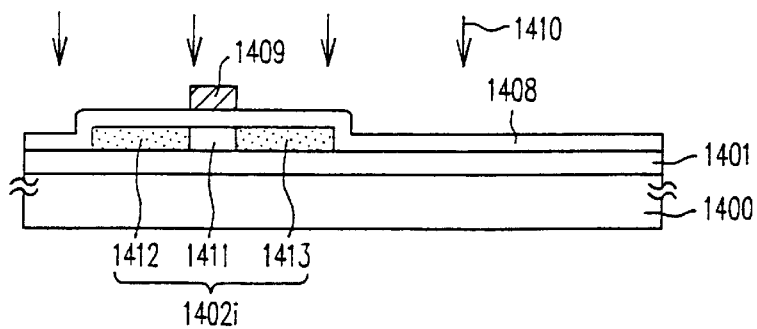

Next, as shown in FIG. 20E, a silicon oxide film is deposited to a thickness of 20 to 150 nm, for example, 100 nm as a gate insulating film 1408 so as to cover the island region 1402*i* made from a crystalline silicon film. The gate insulating film (silicon oxide film) 1408 is formed by sputtering in an oxide atmosphere or a mixed atmosphere of oxygen and argon, using silicon oxide as a target member. A substrate temperature during sputtering is set in the range of 200 to 400° C., for example at 350° C. The ratio of argon to oxygen (argon/oxygen) in the atmosphere during sputtering is set to 0.5 or less, for example, 0.1 or less.

Thereafter, an aluminum film having a thickness of 400 nm is deposited by sputtering, and a gate electrode 1409 is formed by patterning the aluminum film.

Next, the region 1402*i* on which a device is to be formed is doped with boron serving as a p-type impurity by ion doping, using the gate electrode 1409 as a mask. Specifically, ion doping is conducted using diborane ($B_2H_6$) as a doping gas, under the conditions that an accelerating voltage is in the range of 40 to 80 kV, for example, 65 kV and a dose amount is in the range of $1 \times 10^{15}$ to $8 \times 10^{15}$ cm$^{-2}$, for example, $5 \times 10^{15}$ cm$^{-2}$. By this ion doping process, regions 1412 and 1413 doped with the impurities are to be source/drain regions of a TFT, and a region 1411, which is masked with the gate electrode 1409 so as to prevent the region from being doped with the impurities, is to be a channel region of a TFT in the subsequent process.

Next, annealing is performed by radiating a laser light 1410 so as to activate the doped impurities and, at the same time, to improve the crystallinity of the portion where crystallinity is deteriorated by the above ion doping process. For example, a KrF excimer laser (wavelength: 248 nm, pulse width: 20 ns) can be used, and the laser light having an energy density of 200 to 400 mJ/cm$^2$, preferably, 250 mJ/cm$^2$, is radiated. A sheet resistance of the thus formed regions 1412 and 1413 which are doped with boron acting as a p-type impurity is typically in the range of 500 to 900 $\Omega/\square$.

Figure 20F:
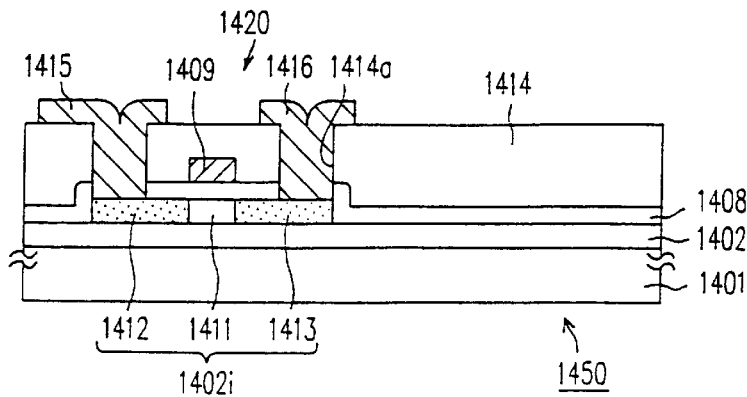

Next, as shown in FIG. 20F, a silicon oxide film having a thickness of about 600 nm is deposited as an interlayer insulating film 1414. The silicon oxide film (interlayer insulating film) 1414 is formed by decomposing and depositing TEOS and oxygen by plasma CVD, alternatively, by decomposing and depositing TEOS and ozone by low pressure CVD or normal pressure CVD. With this process, the excellent interlayer insulating film 1414, which can sufficiently cover the difference in levels of the surface of the substrate, is deposited.

Next, a contact hole 1414*a* is formed through the interlayer insulating film 1414. Electrodes/wirings 1415 and 1416 of a TFT, formed of metal materials, for example, of multi-layered films of titanium nitride and aluminum, are formed and connected to the source/drain regions 1412 and 1413. As the last step, then, annealing is performed in a hydrogen atmosphere of one atm at 350° C. for 30 minutes, thereby completing a p-type TFT 1420.

The thus fabricated TFT 1420 of Example 14 can be used in a peripheral driver circuitry of an active matrix type liquid crystal display device, a switching element in a pixel region, or a thin film integrated circuit in which a CPU is constituted. In the case where the TFT 1420 of Example 14 is used as an element for switching a pixel electrode, one of the electrodes/wirings 1415 and 1416 is connected to a pixel electrode formed from a transparent conductive film such as ITO, and a signal is inputted from the other electrode/wiring. In the case where TFT 1420 of Example 14 is used in a thin film integrated circuit such as CPU, another contact hole is formed on the gate electrode 1409 and a necessary wiring connected to the gate electrode 1409 is formed.

The thus fabricated p-type TFT 1420 exhibits good characteristics such as a field-effect mobility in the range of 35 to 50 cm$^2$/Vs, an S value in the range of 0.9 to 1.2 V/figure, and a threshold voltage in the range of −5 to −6 V. The variation in characteristics among a number of TFTs formed on one and the same substrate 1400 is ±10% in terms of the field-effect mobility and ±5% or less in terms of the threshold voltage. Thus, a number of TFTs excellent in the uniformness and stability in characteristics can be formed.

In Example 14, when the catalyst elements are introduced into the amorphous silicon film 1402, the catalyst elements are selectively diffused by using the mask layer 1403. The region of the amorphous silicon film 1402 corresponding to the opening 1404 is first selectively crystallized to form the seed region 1402a. If the heat treatment is further continued, crystal growth proceeds from the selectively crystallized seed region 1402a in a direction 1407 substantially parallel to the surface of the substrate 1400. As a result, the lateral crystal growth region 1402b is formed in the amorphous silicon film 1402. Therefore, in addition to the effects described above in connection with Example 13, the crystalline silicon region 1402b having remarkably good crystallinity as compared with that of the seed region 1402a, in which catalyst elements have been directly introduced, is obtained.

When TFTs are fabricated according to Example 14, as described above in connection with Examples 5, 6 and 11, it is possible to selectively fabricate TFTs having different characteristics by appropriately setting a carrier moving direction of TFTs and a lateral crystal growth direction.

EXAMPLE 15

A method for fabricating a semiconductor device in Example 15 will be described with reference to FIGS. 21A to 21E. In the following description, a circuit having a CMOS structure including an n-type TFT and a p-type TFT constituted in a complementary form on a glass substrate, which is used in a peripheral driver circuitry of an active-matrix type liquid crystal display device and a general thin film integrated circuit, is formed.

Figure 21A:
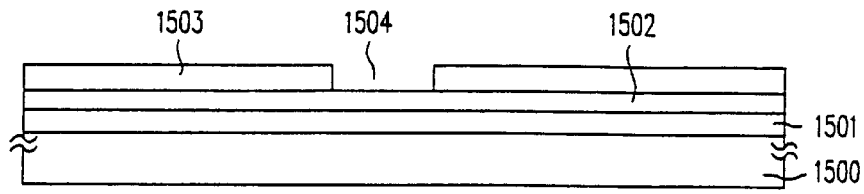
FIGS. 21A through 21E are cross-sectional views illustrating a method for fabricating a semiconductor device according to Example 15 of the present invention.

First, as shown in FIG. 21A, a base coat film 1501 made of silicon oxide having a thickness of about 100 nm is deposited on a glass substrate 1500 by, for example, sputtering. Next, by low-pressure CVD, an intrinsic (I-type) amorphous silicon film 1502 is deposited to a thickness of 25 to 100 nm, for example, to 50 nm.

Next, a mask layer 1503 is formed of an insulating thin film having a thickness of about 50 nm, which is formed of, for example, a silicon oxide film or a silicon nitride film. Furthermore, a predetermined region of the mask 1503 is selectively removed, and a slit-like opening 1504 is formed. The amorphous silicon film 1502 is exposed in the portion corresponding to the opening 1504, and the other region remains masked.

Figure 21B:
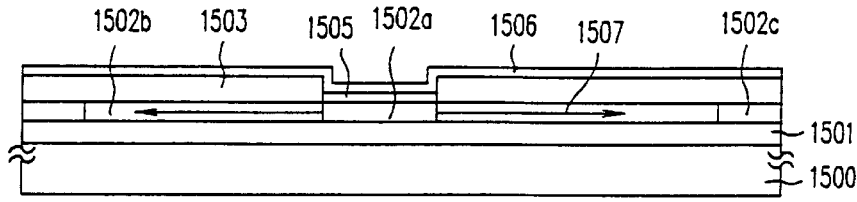

After the mask layer 1503 and the opening 1504 are formed, as shown in FIG. 21B, a silicon oxide film 1505 is formed on the surface of the amorphous silicon film 1502 which is exposed through the opening 1504. As a method for forming the silicon oxide film 1505, thermal oxidation, in which a heat treatment is conducted at about 600° C. while holding the substrate 1500 in a water vapor atmosphere, is used. When this method is used, a silicon oxide film 1505 having a thickness of about 3 nm is formed by the heat treatment for 30 minutes.

Sequentially, for example, by vapor deposition, a thin film 1506 made from nickel acting as a catalyst element is deposited on the mask layer 1503 and the silicon oxide film 1505. A suitable thickness of the nickel thin film 1506 is in the range of about 1 nm to 10 nm. For example, the thickness is 5 nm in this example.

Next, the substrate 1500, on which the base coat film 1501, the amorphous silicon film 1502, the mask layer 1503, the silicon oxide film 1505 and the nickel thin film 1506 are successively deposited, is subjected to a heat treatment in an inert atmosphere so as to crystallize the amorphous silicon film 1502, Specifically, the heat treatment is conducted, for example, at 550° C. for 16 hours.

With this heat treatment, in the region corresponding to the opening 1504, nickels diffuse from the nickel thin film 1506 into the silicon oxide film 1505 and are dispersed in an atomic form therein. Only part thereof reach the surface of the amorphous silicon film 1502. As a result, nickels deposited on the surface of the amorphous silicon film 1502 act as crystal growth nuclei. The crystallization of the amorphous silicon film 1502 occurs in a direction perpendicular to the substrate 1500, resulting in a crystalline silicon film 1502a. Furthermore, since nickels uniformly diffuse into the silicon film simultaneously with the crystallization, a nickel concentration in the crystalline silicon film 1502a is typically $5 \times 10^{17}$ atoms/cm$^3$.

On the other hand, in the region other than the opening 1504, the diffusion of nickels is inhibited by the mask layer 1503, so that nickels can not reach the amorphous silicon film 1502 laying below the mask layer. However, in the periphery of the crystalline silicon film 1502a corresponding to the opening 1504, the crystal growth proceeds in a direction substantially parallel to the surface of the substrate 1500 as indicated with arrows 1507 in FIG. 21B, thereby forming a laterally grown crystalline silicon film 1502b. A nickel concentration in the laterally grown crystalline silicon film 1502b is typically $1 \times 10^{16}$ atoms/cm$^3$. This value is smaller by about one digit as compared with that of the crystalline silicon film (seed region) 1502a which is grown by directly introducing nickels. The lateral crystal growth range indicated with the arrows 1507 is typically about 80 μm.

Next, after removing the mask layer 1503, the silicon oxide film 1505 and the nickel thin film 1506, an XeCl excimer laser light (wavelength: 308 nm, pulse width: 40 ns) is radiated in order to improve crystallinity of the crystalline silicon film 1502b. The laser light is radiated under the following conditions. A substrate temperature during radiation is in the range of 200 to 450° C., for example, 400° C., and an energy density of a laser light is in the range of 200 to 400 mJ/cm$^2$, for example, 300 mJ/cm$^2$.

Figure 21C:
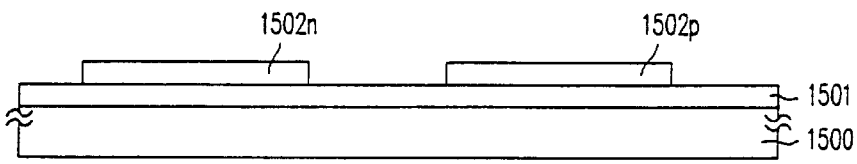

Next, as shown in FIG. 21C, the crystalline silicon film 1502b is patterned so as to remove undesired portions by etching, thereby separating elements from each other. With this process, island regions 1502n and 1502p made from crystalline silicon films, which are to be active regions (source/drain regions and channel regions) of TFTs, that is, regions on which devices are to be formed (see FIGS. 21D and 21E) in the subsequent process, are formed. The region 1502n is used for forming an n-type TFT, and the region 1502p is used for forming a p-type TFT.

Figure 21D:
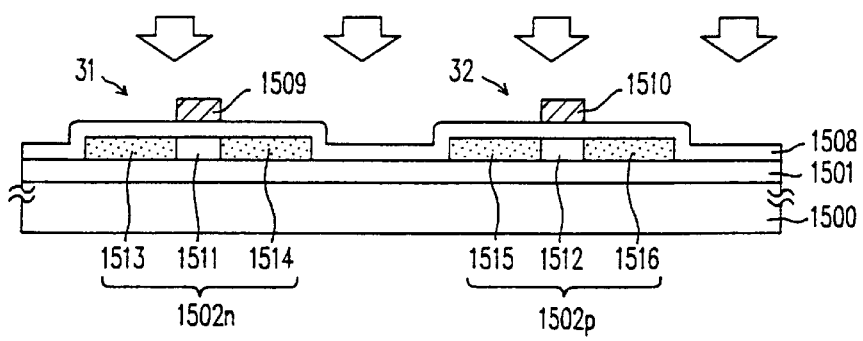

Next, as shown in FIG. 21D, a silicon oxide film is deposited to a thickness of 100 nm as a gate insulating film 1508 so as to cover the island regions 1502n and 1502p made of crystalline silicon films. The gate insulating film (silicon oxide film) 1508 is formed by decomposing and depositing TEOS and oxygen by RF plasma CVD while setting a substrate temperature at 350° C.

Thereafter, an aluminum film (containing silicon at 0.1 to 2%) having a thickness in the range of 400 to 800 nm, for example, 600 nm is deposited by sputtering, and gate electrodes 1509 and 1510 are formed by patterning the aluminum film.

Next, the regions 1502n and 1502p on which devices are to be formed are doped with phosphorus serving as an n-type impurity and boron serving as a p-type impurity by ion doping, using the gate electrodes 1509 and 1510 as a mask. Specifically, doping of phosphorus is conducted under the conditions that phosphine (PH$_3$) is used as a doping gas, an accelerating voltage is in the range of 60 to 90 k, for example, 80 kV, and a dose amount is in the range of $1 \times 10^{15}$ to $8 \times 10^{15}$ cm$^{-2}$, for example, $2 \times 10^{15}$ cm$^{-2}$. On the other hand, doping of boron is conducted under the conditions that diborane ($B_2H_6$) is used as a doping gas, an accelerating voltage is in the range of 40 to 80 kV, for example, 65 kV and a dose amount is in the range of $1 \times 10^{15}$ to $8 \times 10^{15}$ cm$^{-2}$, for example, $5 \times 10^{15}$ cm$^{-2}$.

By this ion doping process, regions 1513 through 1516 doped with the impurities are to be source/drain regions of TFTs, and regions 1511 and 1512, which are masked with the gate electrodes 1509 and 1510 so as to prevent the region from being doped with the impurities, is to be channel regions of TFTs in the subsequent process. Upon doping the above n-type and p-type impurity elements, predetermined regions are selectively doped with the impurity elements of the respective conductivity types by covering the region which need not to be doped with impurities with an appropriately patterned photo resist, thereby forming n-type impurity regions 1513 and 1514 and p-type impurity regions 1515 and 1516. Then, an n-type TFT and a p-type TFT are formed by using the thus formed regions.

Next, annealing is performed by radiating a laser light so as to activate the doped impurities. For example, an XeCl excimer laser (wavelength: 308 nm, pulse width: 40 ns) can be used, and the laser light having an energy density of 250 mJ/cm$^2$ is radiated twice for one portion.

Figure 21E:
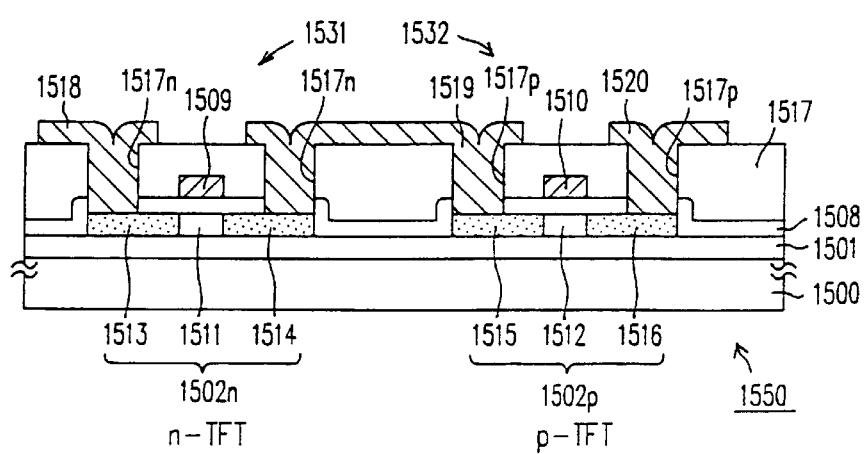

Next, as shown in FIG. 21E, a silicon oxide film having a thickness of about 600 nm is deposited as an interlayer insulating film 1517 by plasma CVD. Next, contact holes 1517n and 1517p are formed through the interlayer insulating film 1517. Electrodes/wirings 1518 through 1520 of TFTs formed of metal materials, for example, of multi-layered films of titanium nitride and aluminum, are formed and connected to the source/drain regions 1513 through 1516. As the last step, then, annealing is performed in a hydrogen atmosphere of one atm at 350° C. for 30 minutes, thereby completing an n-type TFT 1531 and a p-type TFT 1532.

In the thus fabricated semiconductor device 1550 of Example 15, as can be seen in its cross-sectional view shown in FIG. 21E, the n-type TFT 1531 and the p-type TFT 1532 are formed on the glass substrate 1550 through the insulating base coat film 1501 made from silicon oxide and the like. On the insulating base coat film 1501, the island regions 1502n and 1502p made of crystalline silicon films, which constitute the TFTs 1531 and 1532, respectively, are formed so as to be adjacent to each other. The central portion of the island regions 1502n and 1502p of crystalline silicon films are the n-type channel region 1511 and the p-type channel region 1512, respectively. On the other hand, the regions sandwiching the n-type channel region 1511 in the island region 1502n of crystalline silicon film are the n-type source/drain regions 1513 and 1514 of the n-type TFT 1531. Similarly, the regions sandwiching the p-type channel region 1512 in the island region 1502p of crystalline silicon film are the p-type source/drain regions 1515 and 1516 of the p-type TFT 1532.

On the n-type channel region 1511 and the p-type channel region 1512, aluminum gate electrodes 1509 and 1510 are disposed via the gate insulating film 1508. The entire surfaces of the TFTs 1531 and 1532 are covered with the interlayer insulating film 1517. In the interlayer insulating film 1517, the contact hole 1517n is formed in the region corresponding to the source/drain regions 1513 and 1514 of the n-type TFT 1531, and the contact hole 1517p is formed in the region corresponding to the source/drain regions 1515 and 1516 of the p-type TFT 1532. The source/drain regions 1513 and 1514 of the n-type TFT 1531 are connected to the electrodes/wirings 1518 and 1519 through the contact hole 1517n. Similarly, the source/drain regions 1515 and 1516 of the p-type TFT 1532 are connected to the electrodes/wirings 1519 and 1520 through the contact hole 1517p.

In Example 15, the island regions 1502n and 1502p are part of the crystalline silicon film 1502b which is laterally grown from the same region 1502a, in which the catalyst elements have been introduced.

In the thus fabricated circuit having a CMOS structure, the TFTs exhibit good characteristics as follows. The n-type TFT has a field-effect mobility in the range of 150 to 180 cm$^2$/Vs and a threshold voltage in the range of 1.5 to 2 V. On the other hand, the p-type TFT has a field-effect mobility in the range of 120 to 140 cm$^2$/Vs and a threshold voltage in the range of -2 to -3 V.

Also in Example 15 described above, the effects described in connection with Examples 13 and 14 can be obtained.

As described above, in Examples 13 to 15 of the present invention, when catalyst elements for accelerating crystallization of the amorphous silicon film are introduced, the catalyst elements are diffused into the amorphous silicon film through the buffer layer which having effect of inhibiting diffusion of the catalyst elements. Since the catalyst elements are introduced into the amorphous silicon film by growing a thin film containing catalyst elements, the variation in the introduction amount of the catalyst elements can be reduced, as compared with the case where a method for applying a solution, in which the catalyst elements are dissolved, or a compound is used. Specifically, in a substrate having a dimension of 127 mm×127 mm, variation in an introduction amount of catalyst elements in the substrate is within ±5%. At this point, if a thin film having a uniform thickness is formed, it is possible to reflect this uniformness to the uniformness of the introduced amount of catalyst elements. Furthermore, by using a larger deposition apparatus, variation in the amount of catalyst elements to be introduced into a substrate having a larger area can be kept at a level almost equal to the above level. Thus, even if a substrate having a large area is used, it is possible to uniformly introduce the catalyst elements into the entire surface. As a result, a semiconductor device excellent in uniformness and stability can be fabricated on a substrate having a large area.

In this case, the amount of the catalyst elements required in the present invention corresponds to such an extremely thin film (thickness: several nm or less) that it is invisible to the naked eye. The uniformness in the concentration of the catalyst elements in the substrate can be improved by forming the catalyst elements on the amorphous silicon film as a thin film and introducing the catalyst elements through the diffusion thereof from the thin film into the amorphous silicon film. By this process alone, however, it is difficult to control the amount of the catalyst elements to be introduced at a minute amount which is necessary and minimum amount for crystallization.

In order to solve this problem, in Examples 13 through 15, the catalyst elements are introduced through the buffer layer which serves to restrain the diffusion of the catalyst elements. Therefore, prior to reaching the amorphous silicon film, the catalyst elements supplied as a thin film first diffuse into the buffer layer. The buffer layer has a smaller diffusion coefficient with respect to the catalyst elements such as nickel than that of a silicon film. Thus, if the catalyst elements are excessively added to the surface of the buffer layer to some extent, most of the catalyst elements are trapped into the buffer layer during diffusion. Accordingly, it is possible to control the amount of the catalyst elements which are actually introduced into the amorphous silicon film at an extremely small amount. Moreover, if the concentration of the catalyst elements in the thin film formed on the surface of the buffer layer locally varies, the variation is moderated during the diffusion of the catalyst elements in the buffer layer. Furthermore, by diffusing the catalyst elements in the buffer layer, the catalyst elements reach the surface of the amorphous silicon film in a state where the catalyst elements are dispersed in an atomic form. As a result, all the catalyst elements to be introduced into the amorphous silicon film effectively show a function as catalysts for crystallization.

As described above, according to Examples 13 through 15, it is possible to uniformly introduce the necessary and minimum amount of the catalyst elements into the entire surface of the substrate. Even if a laser light or an intense light is radiated after crystallization due to heat treatment, the catalyst elements are not precipitated. Thus, it is possible to uniformly introduce the catalyst elements into a surface of a substrate having a large area. As a result, a semiconductor device having excellent uniformness and stability can be formed on a substrate having a large area.

As a buffer layer, it is desirable that a diffusion coefficient of the buffer layer with respect to the catalyst elements is at least one-tenth or less of that of the amorphous silicon. This is because the amount of catalyst elements to be introduced into the amorphous silicon film is determined, depending on the diffusion coefficient of the buffer layer.

Figure 22:
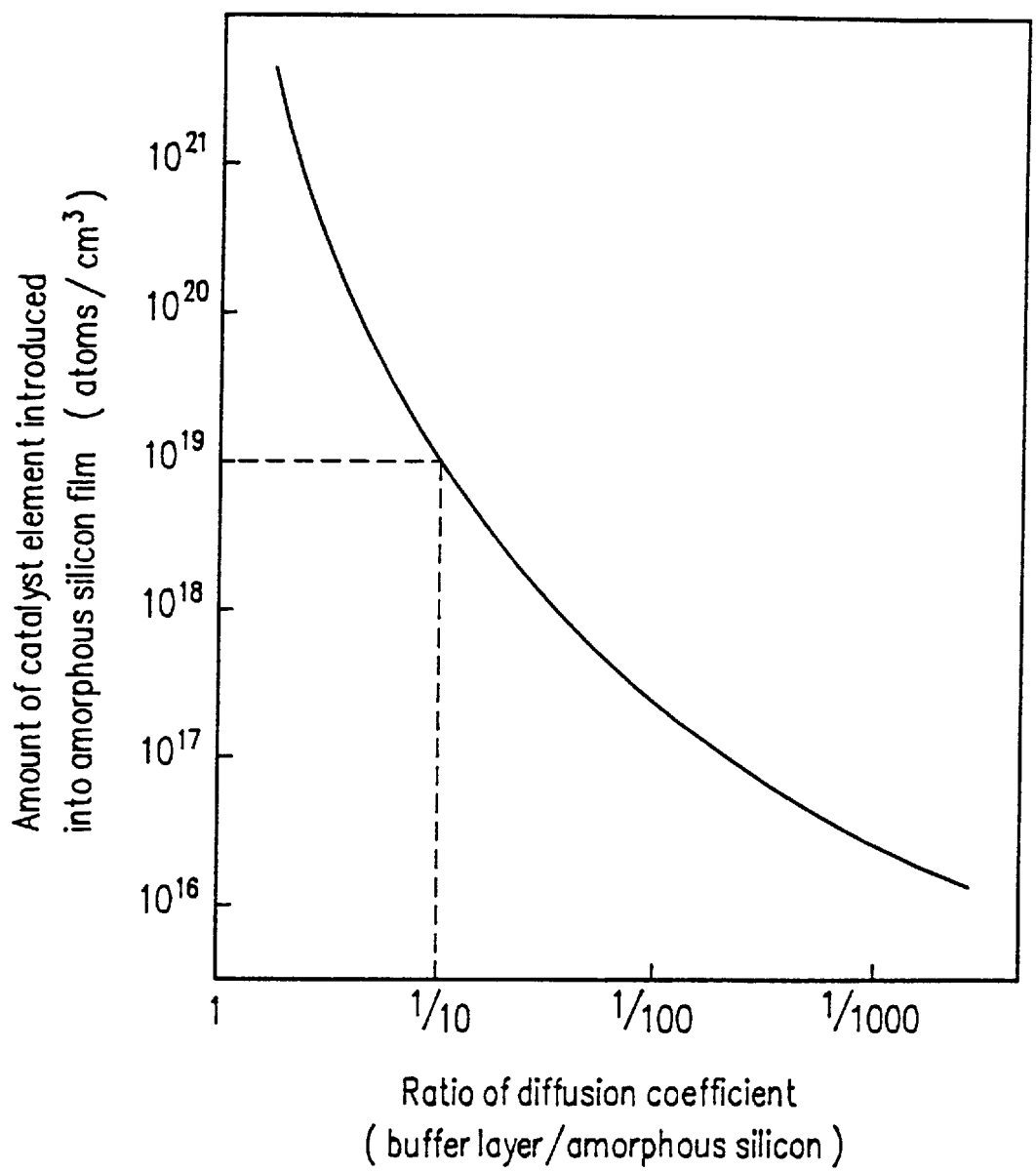
FIG. 22 is a graph showing a relationship between a diffusion coefficient ratio of a buffer layer to an amorphous silicon film and the amount of catalyst elements introduced into the amorphous silicon film.

FIG. 22 shows the relationship between a diffusion coefficient of the buffer layer and the amount of catalyst element to be introduced into the amorphous silicon film. The data shown in FIG. 22 is obtained in the case where excessive nickels are introduced onto the buffer layer as catalyst elements and heating is performed at 550° C. The horizontal axis represents the ratio of a diffusion coefficient of the buffer layer with respect to nickel to a diffusion coefficient of the amorphous silicon film with respect to nickel (buffer layer/amorphous silicon film). The vertical axis represents the amount of nickel introduced into the amorphous silicon film through the buffer layer.

In order to effectively function as the catalyst elements to accelerate crystallization while inhibiting adverse influences on the semiconductor device to be formed, as described above in connection with Examples 10 to 12, it is desirable that a concentration of the catalyst elements in the silicon film is in the range of $1 \times 10^{15}$ to $1 \times 10^{19}$ atoms/cm$^3$. As can be seen from FIG. 22, when the ratio of diffusion coefficients is about one-tenth or less, the amount of the catalyst elements to be introduced into the amorphous silicon film can be $10^{19}$ atoms/cm$^3$ or less. Thus, it is desirable that a diffusion coefficient of the buffer layer is one-tenth or less of that of the amorphous silicon film.

It is desired that the buffer layer has the diffusion coefficient as described above and does not adversely affect the amorphous silicon film which is to be an active region in the subsequent process. Specifically, a silicon oxide film or a silicon nitride film, which are made of the same silicon type materials as the crystalline silicon film, is preferred. Thus, in the case where a film made of these materials is used as a buffer layer, an optimum result can be obtained.

As a method for forming the silicon oxide film or the silicon nitride film serving as the buffer layer, for example, a deposition method which is generally used in a semiconductor technique such as a CVD method, sputtering or the like, can be used. However, considering the purpose to attain an extremely thin film having a thickness of about several nanometers as well as the fact that a uniform thickness is essential to uniformly introduce the catalyst elements, it is most desirable that the silicon oxide film or the silicon nitride film serving as the buffer layer is formed by thin film oxidation or thin film nitrization of the surface of the amorphous silicon film.

As a thin film oxidation method of the surface of the amorphous silicon film, thermal oxidation in which a surface is subjected to a heat treatment in an oxidation atmosphere such as oxygen or water vapor so as to be oxidized, or a liquid medicine oxidation in which a surface is oxidized by immersing the substrate into an oxidizing solution such as a mixture of a sulfuric acid and a hydrogen peroxide solution is applicable. The similar effect can be obtained with any method.

On the other hand, as a method for fabricating a thin film containing the catalyst elements, deposition techniques generally used in the semiconductor technology such as plating, sputtering, and further CVD for some kinds of catalyst elements, are applicable. However, the most preferable method is vacuum deposition. This method is preferred because it is desirable that the catalyst elements are present on the surface alone, making the amount of the catalyst elements introduced into the buffer layer as small as possible. However, this result can be attained with other methods by appropriately setting the deposition conditions. For example, when sputtering is applied, it is sufficient to conduct the sputtering with a low power.

In Examples 13 through 15 described above, when nickels are introduced, the buffer layer and the extremely thin film made of nickel are formed on the upper surface of the amorphous silicon film. Alternatively, before forming the amorphous silicon film, the extremely thin film made of nickel and the buffer layer may be formed on the surface of the base coat film. In other words, a minute amount of nickel may be introduced from either an upper face or lower face of the amorphous silicon, and therefore the crystal growth can be occur from either face.

EXAMPLE 16

Figure 23:
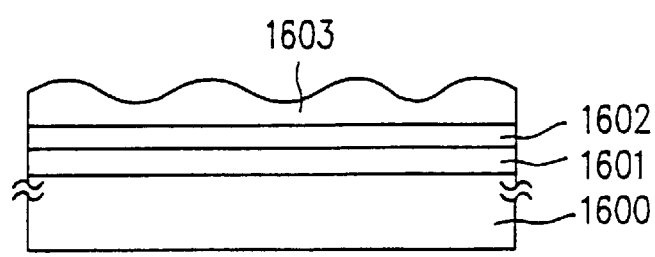
FIG. 23 is a cross-sectional view illustrating a method for fabricating a semiconductor device according to Example 16 of the present invention.

With reference to FIG. 23, a method for fabricating a device for fabricating a semiconductor in Example 16 of the present invention will be described. In Example 16, when catalyst elements are introduced into the amorphous silicon film, the catalyst elements dissolved in an alkaline solvent are held so as to be in contact with the amorphous silicon film, thereby diffusing the catalyst elements into the amorphous silicon film.

First, a base coat film 1601 made of silicon dioxide having a thickness of about 200 nm, which serves to prevent impurities from diffusing from the substrate 1600, is deposited on the glass substrate 1600 by, for example, sputtering. Next, by low-pressure CVD or plasma CVD, an intrinsic (I-type) amorphous silicon film 1602 is deposited to a thickness of 25 to 100 nm, for example, to 80 nm.

Next, the substrate 1600, on which the amorphous silicon film 1602 is formed, is dipped into a mixture 1603 of an aqueous ammonia and a hydrogen peroxide solution, in which a nickel salt is dissolved. Thereafter, overflow washing is conducted on the substrate 1600 with pure water, and then, spin drying is performed. As the nickel salt, for example, a nickel acetic acid is used, and a nickel concentration in the mixture 1603 is set to 10 ppm. The dipping is conducted, for example, 10 minutes. A pH value of the mixture 1603 is adjusted so as to be about 10. Under such conditions, nickels are introduced into the surface of the amorphous silicon film 1602 so that a surface density of nickels is about $3 \times 10^{12}$ atoms/cm$^2$.

Hereinafter, by performing the same processes as those described above as Example 13 with reference to FIGS. 19B through 19E, an n-type TFT equivalent to that in Example 13 can be obtained. Since the succeeding processes are the same as those in Example 13, the description thereof is herein omitted.

The thus fabricated n-type TFT exhibits good characteristics such as a field-effect mobility in the range of 120 to 150 cm$^2$/Vs, an S value in the range of 0.2 to 0.4 V/figure, and a threshold voltage in the range of 2 to 3 V. The variation in characteristics among a number of TFTs formed on the same substrate 1600 is ±12% in terms of the field-effect mobility and ±8% or less in terms of the threshold voltage. Thus, a number of TFTs exhibiting a high level of uniformity and stability can be formed.

In Example 16, an active region formed on the surface of the insulating base coat film 1601 provided on the substrate 1600 contains the catalyst elements which accelerate the crystallization of the amorphous silicon film 1602 due to heating. Therefore, the crystallinity of the crystalline silicon film obtained by crystallization of the amorphous silicon film can be further enhanced as compared with that of the amorphous silicon film obtained by general solid-phase growth method.

Since the crystallization of the amorphous silicon film 1602 due to heating is accelerated by the catalyst elements, the crystalline silicon film of high quality can be formed with good productivity. Moreover, since a heating temperature required for crystallization is limited to 600° C. or below, even inexpensive glass substrates having poor heat resistance can be used.

Moreover, since the laser light is radiated onto the active region formed of the crystalline silicon film obtained by performing the heat treatment on the amorphous silicon film 1602, the crystallinity is further improved so as to improve a field-effect mobility of carriers in the active region.

Furthermore, by setting a concentration of the catalyst elements in the active region in the range of $1 \times 10^{15}$ to $1 \times 10^{19}$ atoms/cm$^3$, it is possible to allow the catalyst elements to effectively function when the amorphous silicon film 1602 is crystallized.

In addition, in Example 16, the amorphous silicon film 1602 is exposed to an alkaline solvent 1605 containing the catalyst elements for accelerating the crystallization of the amorphous silicon film 1602 so as to introduce the catalyst elements from the alkaline solvent 1605 into the amorphous silicon film 1602 due to adsorption. Thus, the variation in the addition amount of the catalyst elements in one and the same substrate can be reduced.

EXAMPLE 17

Figure 24A:
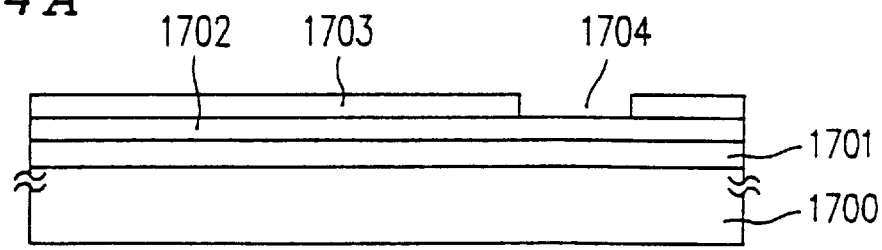
FIGS. 24A and 24B are cross-sectional views illustrating a method for fabricating a semiconductor device according to Example 17 of the present invention.
Figure 24B:
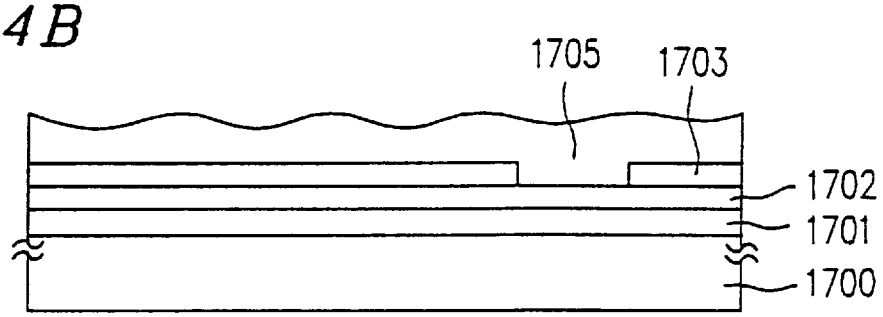

With reference to FIGS. 24A and 24B, a method for fabricating a semiconductor device in Example 17 of the present invention will be described. Also in Example 17, when catalyst elements are introduced into the amorphous silicon film, the catalyst elements dissolved in an alkaline solvent are held so as to be in contact with the amorphous silicon film, thereby diffusing the catalyst elements into the amorphous silicon film.

First, as shown in FIG. 24A, a base coat film 1701 made of silicon dioxide having a thickness of about 200 nm is deposited on the glass substrate 1700 by, for example, sputtering. Next, by low-pressure CVD or plasma CVD, an intrinsic (I-type) amorphous silicon film 1702 is deposited to a thickness of 25 to 100 nm, for example, to 80 nm.

Next, a mask layer 1703 made of a silicon oxide film, a silicon nitride film or the like is formed on the amorphous silicon film 1702. An opening 1704 is formed at a predetermined position of the mask layer 1703. The amorphous silicon film 1702 is exposed in a slit-like shape through the opening 1704, and the remaining portion remains masked.

After forming the mask layer 1703, as shown in FIG. 24B, the substrate 1700 is held so that an alkaline solution 1705, in which nickels serving as the catalyst elements are dissolved, is in contact with the surface of the amorphous silicon film 1702 which is exposed through the opening 1704. As the alkaline solution 1705, a solution obtained by dissolving a nickel nitrate into an aqueous ammonia whose pH value is about 12 is used. A minute amount of nickels is added by setting a nickel concentration in the solution to 50 ppm and dipping the substrate 1700 into the solution 1705 for 5 minutes. With this process, the part of the amorphous silicon film 1702, which is exposed through the opening 1704, is etched, resulting in the reduction of the thickness of the film to about 40 nm. However, since the etched part of the amorphous silicon film is not used as a region on which a device is to be formed in the example and is removed in the subsequent process, this does not cause a problem.

Hereinafter, by performing the same processes as those described above as Example 14 with reference to FIGS. 20C through 20F, a p-type TFT equivalent to that obtained in Example 14 can be obtained. Since the succeeding processes are the same as those in Example 14, the description thereof is herein omitted.

The thus fabricated p-type TFT exhibits good characteristics such as a field-effect mobility in the range of 35 to 50 cm$^2$/Vs, an S value in the range of 0.9 to 1.2 V/figure, and a threshold voltage in the range of −5 to −6 V. The variation in characteristics among a number of TFTs formed on the same substrate 1700 is ±10% in terms of the field-effect mobility and ±5% or less in terms of the threshold voltage. Thus, a number of TFTs exhibiting a high level of uniformity and stability can be formed.

In this example, when the catalyst elements are introduced into the amorphous silicon film 1702, the catalyst elements are selectively diffused by using the mask layer 1703. Therefore, the region of the amorphous silicon film 1702 corresponding to the opening 1704 is first selectively crystallized. If the heat treatment is further continued, the crystal growth proceeds from the selectively crystallized region in a direction substantially parallel to the surface of the substrate 1700, thereby forming a lateral crystal growth region in the amorphous silicon film 1702. Thus, in Example 17. in addition to the effect described above in connection with Example 16, the crystalline silicon region having remarkably excellent crystallinity as that of the region in which the catalyst elements are directly introduced.

When TFTs are formed according to Example 17, TFTs having different characteristics are selectively formed by appropriately setting moving directions of carriers of TFTs and lateral crystal growth directions, as described above in connection with Examples 5, 6, 11 and 14.

EXAMPLE 18

Figure 25A:
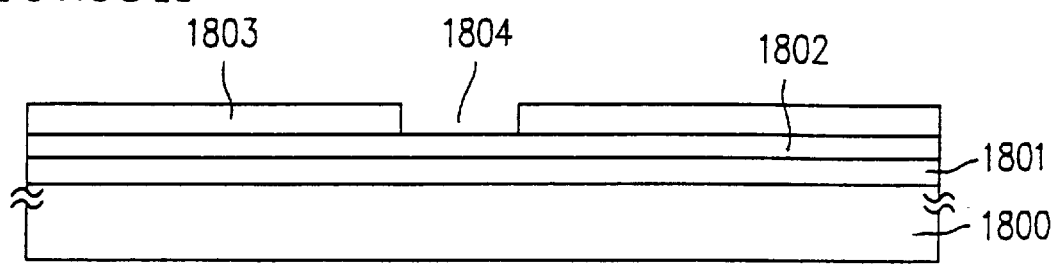
FIGS. 25A and 25B are cross-sectional views illustrating a method for fabricating a semiconductor device according to Example 18 of the present invention.
Figure 25B:
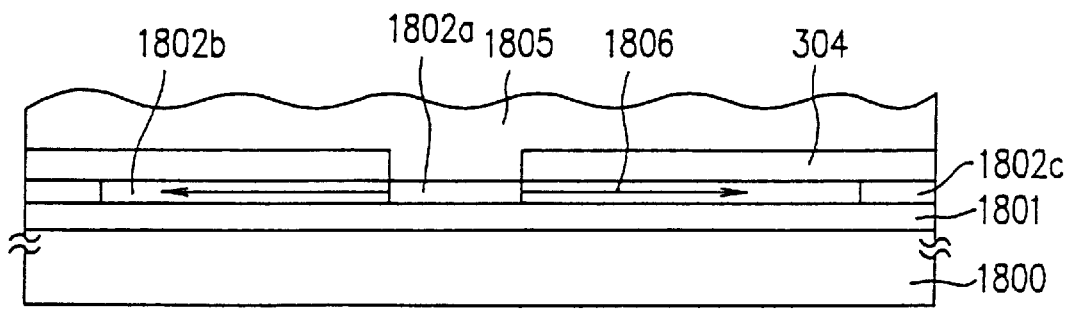

With reference to FIGS. 25A and 25B, a method for fabricating a device for fabricating a semiconductor in Example 18 will be described. Also in Example 18, when the catalyst elements are introduced into the amorphous silicon film, the catalyst elements dissolved in an alkaline solvent is held so as to be in contact with the amorphous silicon film, thereby diffusing the catalyst element into the amorphous silicon film. In the following description, a circuit having CMOS structure including an n-type TFT and a p-type TFT constituted in a complementary form on a glass substrate, which is used in a peripheral driver circuitry of an active-matrix type liquid crystal display device and a general thin film integrated circuit, is formed.

First, as shown in FIG. 25A, a base coat film 1801 made of silicon oxide having a thickness of about 100 nm is deposited on a glass substrate 1800 by, for example, sputtering. Next, by low-pressure CVD, an intrinsic (I-type) amorphous silicon film 1802 is deposited to a thickness of 25 to 100 nm, for example, to 50 nm.

Next, a mask layer 1803 is formed of an insulating thin film having a thickness of about 50 nm, which is formed of, for example, a silicon oxide film or a silicon nitride film. Furthermore, a predetermined region of the mask 1803 is selectively removed, and a slit-like opening 1804 is formed. The amorphous silicon film 1802 is exposed in the portion corresponding to the opening 1804, and the other region is masked.

After the mask layer 1803 is formed, as shown in FIG. 25B, the substrate 1800 is held so that an alkaline solution 1805, in which nickels serving as the catalyst elements are dissolved, is in contact with the surface of the amorphous silicon film 1802 which is exposed through the opening 1804. As the alkaline solution 1805, a solution obtained by dissolving a nickel nitrate into an aqueous ammonia whose pH value is about 10 is used. A minute amount of nickels is added by setting a nickel concentration in the solution to 20 ppm and dipping the substrate 1800 into the solution 1805 for 5 minutes. With this process, the part of the amorphous silicon film 1802, which is exposed through the opening 1804, is etched, resulting in the reduction of the thickness of the film to about 45 nm. However, since the etched part of the amorphous silicon film is not used as a region on which a device is to be formed in the example and is removed in the subsequent process, this does not cause a problem.

Next, the whole substrate 1800, on which the layers are successively formed, is subjected to a heat treatment in an inert atmosphere, thereby crystallizing the amorphous silicon film 1802. Specifically, the heat treatment is conducted at 550° C. for 16 hours.

During the heat treatment, in the region corresponding to the opening 1804, nickels introduced into the surface of the amorphous silicon film 1802 act as crystal growth nuclei. Thus, crystallization of the amorphous silicon film 1802 occurs in a direction perpendicular to the substrate 1800, resulting in a crystalline silicon film 1802a. Furthermore, since nickels uniformly diffuse into the silicon film simultaneously with the crystallization, a nickel concentration in the crystalline silicon film 1802a is typically $8 \times 10^{17}$ atoms/cm$^3$.

On the other hand, in the region other than the opening 1804, the diffusion of nickels is inhibited by the mask layer 1803, so that nickels can not reach the amorphous silicon film 1802 laying below the mask layer. However, in the periphery of the crystalline silicon film 1802a corresponding to the opening 1804, the crystal growth proceeds in a direction substantially parallel to the surface of the substrate 1800 as indicated with arrows 1806 in FIG. 25B, thereby forming a laterally grown crystalline silicon film 1802b. A nickel concentration in the laterally grown crystalline silicon film 1802b is typically $3 \times 10^{16}$ atoms/cm$^3$. This value is smaller by about one digit as compared with that of the crystalline silicon film (seed region) 1802a which is grown by direct introduction of nickels. The lateral crystal growth range indicated with the arrows 1806 is typically about 80 μm.

Hereinafter, by performing the same processes as those described above as Example 15 with reference to FIGS. 21C through 21E, a circuit having a CMOS structure equivalent to that obtained in Example 15 can be obtained. Since the succeeding processes are the same as those in Example 15, the description thereof is herein omitted.

In the thus fabricated circuit having a CMOS structure, TFTs exhibit good characteristics as follows. The n-type TFT has a field-effect mobility in the range of 150 to 180 cm$^2$/Vs and a threshold voltage in the range of 1.5 to 2 V. On the other hand, the p-type TFT has a field-effect mobility in the range of 100 to 120 cm$^2$/Vs and a threshold voltage in the range of −2 to −3 V.

Also in Example 18 described above, the effects as described in connection with Examples 16 and 17 can be obtained.

As described above, in Examples 16 through 18 of the present invention, when the catalyst elements are introduced into the amorphous silicon film, the catalyst elements dissolved in the alkaline solvent are held so as to be in contact with the amorphous silicon film, thereby diffusing the catalyst elements into the amorphous silicon film. By this process, the catalyst elements can be uniformly introduced at a low concentration into the amorphous silicon film, which never depends on a subsequent drying process. Thus, the methods of the examples differ from a method for applying a solution with a spinner. Accordingly, variation in the introduction amount of the catalyst elements in the substrate can be reduced. Specifically, in a substrate having a dimension of 127 mm×127 mm, the variation in the amount of catalyst elements introduced into the surface of the substrate is within ±5%.

In the methods of Examples 16 through 18, during introduction of catalyst elements, the catalyst elements are adsorbed onto the surface of the amorphous silicon film in an ionic state. Therefore, even if the surface is washed with pure water, the necessary amount of the catalyst elements is not removed. As a result, the introduction amount of the catalyst elements does not depend on the subsequent drying process. Therefore, without a spinner, a method for merely dipping the substrate on which an amorphous silicon film is formed into the alkaline solution in which the catalyst elements are dissolved can be applicable. By this method, even a substrate having such a large area that a side thereof exceeds 400 mm long can be readily treated. Thus, treatment can be carried out at low cost with a simple and easy process.

Moreover, since adsorption is utilized, in principle, the catalyst elements are present on the surface of the amorphous silicon film in a state close to a monoatomic layer. Therefore, variation in terms of microscale, which can be seen in a spin coat process, can be almost eliminated.

In the above methods, only the catalyst elements, which are adsorbed onto the surface of the amorphous silicon film contribute to crystal growth. As a result, all the catalyst elements which are introduced into the amorphous silicon film effectively demonstrate the function as catalysts for crystallization.

Furthermore, according to Examples 16 through 18, it is possible to uniformly introduce a necessary and minimum amount of the catalyst elements into the entire surface of the substrate. Even if a laser light or an intense light is radiated after the region is crystallized by heat treatment, the catalyst elements are not precipitated. Thus, it is possible to uniformly introduce the catalyst elements into a surface of a substrate having a large area. As a result, a semiconductor device having exhibiting a high level of uniformity and stability can be formed on the substrate having a large area.

The difference in an ionic state of the catalyst elements in the solution, between the case where the catalyst elements are dissolved into an alkaline solution and the case where the catalyst elements are dissolved into a neutral solution, relates to the mechanism of the above methods. Thus, in the case where the catalyst elements are dissolved in the alkaline solution, it is considered that the catalyst elements are in an unstable complex ionic state in which OH radicals are coordinated. In this state, the catalyst elements are likely to be adsorbed onto the surface of the amorphous silicon film, and are easily electrically connected with O and OH which are present on the Si surface. Thus, the introduction amount of catalyst elements greatly depends on a pH value of the solution. Specifically, when a pH value of the alkaline solvent, in which the catalyst elements are dissolved, is in the range of 8 to 14, more preferably, 9 to 12, the optimum effect can be obtained.

Figure 26:
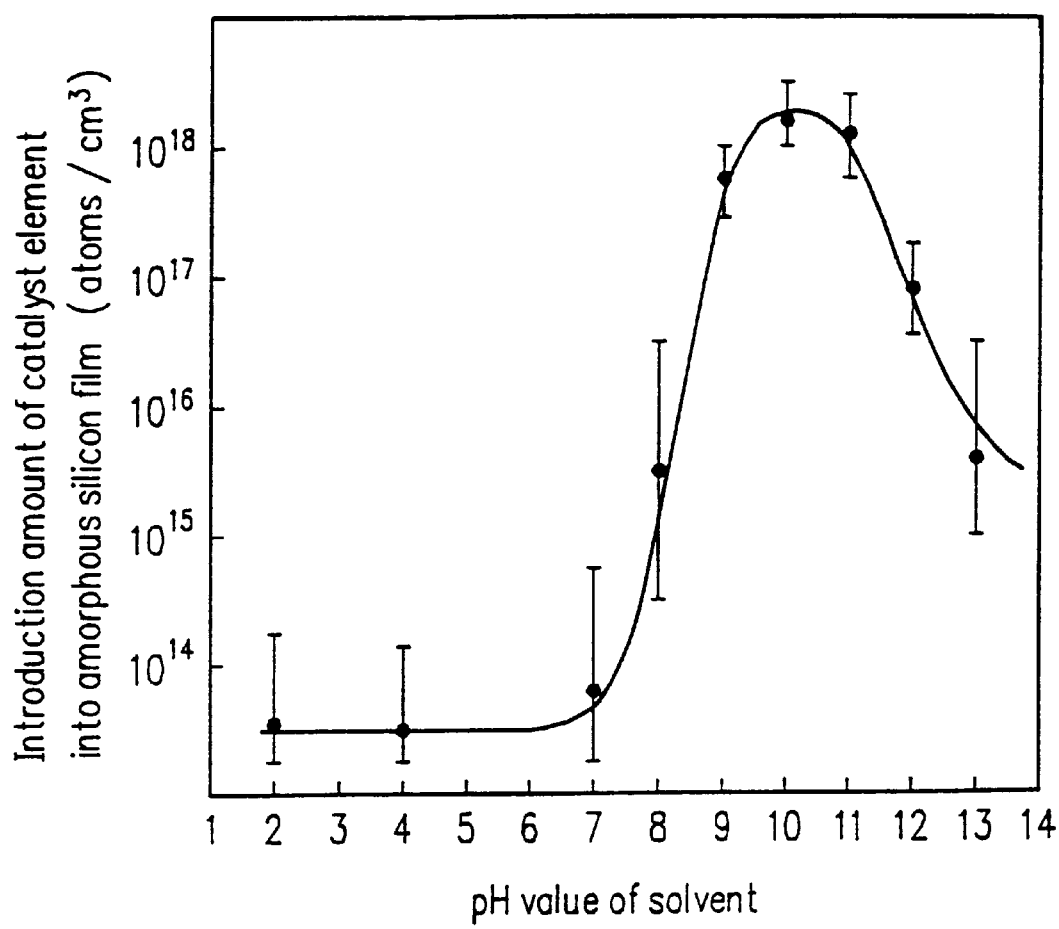
FIG. 26 is a graph showing a relationship between a pH value of a solvent in which catalyst elements are dissolved and the amount of catalyst elements introduced into an amorphous silicon film.

FIG. 26 shows the correlation between a pH value of the solvent, in which catalyst elements are dissolved, and the amount of the catalyst elements introduced into the amorphous silicon film. A graph of FIG. 26 shows the data obtained by dipping the amorphous silicon substrate into a solution, in which nickel salt is dissolved, having a nickel concentration of 25 ppm for 10 minutes, and subsequently washing the amorphous silicon with pure water. As can be seen from the graph, when a pH value of the solvent exceeds 8, the introduction amount of the catalyst elements increases. As a result, adsorption, which cannot be removed by the subsequent pure water washing process, occurs. Thus, for obtaining the effect of the present invention, an alkaline solution having a pH value of 8 or more.

When a pH value of the solvent is in the range of 9 to 12, as indicated by error bars at points of measurement, variation in the introduction amount of the catalyst elements in the substrate is within ±5%. When a plurality of semiconductor devices are fabricated on the substrate as in the case of an active matrix substrate, unevenness of the semiconductor devices leads to variation in operation characteristics thereof. Therefore, it is preferred that the uniformness in the introduction amount of catalyst elements is held to be within ±5%. Furthermore, reduction in the variation over the range of a pH value from 9 to 12 signifies that sufficient adsorption occurs, and therefore that stable treatment can be conducted.

Thus, it is preferred that a pH value of the alkaline solvent, in which the catalyst elements are dissolved, is in the range of 8 to 14, more preferably, in the range of 9 to 12.

As the alkaline solvent used in the above method, any solvents can be used without any disadvantages insofar as a pH value is within the above range. However, in view of influence on the semiconductor material, it is desirable to use an inorganic alkali, in particular, an aqueous ammonia.

Moreover, the alkaline solution has etching effect with respect to the amorphous silicon film. Thus, it is necessary to previously set a thickness of the amorphous silicon film at a value larger than a desired value in consideration of reduction in a thickness due to etching. In order to prevent the amorphous silicon film from being etched, it is effective to use a mixture of an aqueous ammonia and a hydrogen peroxide solution. In this case, since the hydrogen peroxide solution oxidizes the surface of the silicon film, it is possible to prevent etching reaction due to the alkaline solution.

In the case of plasma treatment, it is necessary to conduct the introduction treatment of the catalyst elements into the amorphous silicon film after forming a pattern of the mask layer for selectively introducing the catalyst elements. However, in the methods according to Examples 16 through 18, there is no influence due to the difference in levels of the pattern as can be seen in the spin application method. Thus, it is possible to conduct uniform and stable treatment on the surface, on which the pattern has already been formed.

In order to allow the catalyst elements to effectively function for accelerating crystallization while inhibiting adverse effects on the semiconductor device to be formed, a concentration of the catalyst elements in the silicon film is desirably in the range of $1 \times 10^{15}$ to $1 \times 10^{19}$ atoms/cm$^3$, which has already been described in connection with Examples 10 through 12.

EXAMPLE 19

Figure 27:
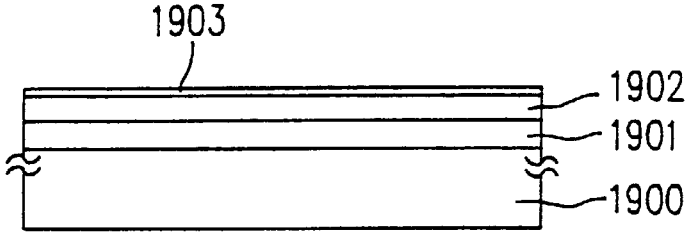
FIG. 27 is a cross-sectional view illustrating a method for fabricating a semiconductor device according to Example 19 of the present invention.

With reference to FIG. 27, a method for fabricating a semiconductor device in Example 19 of the present invention will be described. In Example 19, when catalyst elements are introduced into an amorphous silicon film, plating is conducted on a surface of the amorphous silicon film.

First, a base coat film 1901 made of silicon dioxide having a thickness of about 200 nm, which serves to prevent impurities from diffusing from a substrate 1900, is deposited by using a sputtering apparatus on the cleaned substrate 1900 having an insulating surface, for example, a cleaned glass substrate. Next, by low-pressure CVD or plasma CVD, an intrinsic (I-type) amorphous silicon film 1902 is deposited to a thickness of 25 to 100 nm, for example, to 80 nm.

Next, the substrate 1900, on which the amorphous silicon film 1902 is formed, is dipped into a plating solution containing nickels serving as catalyst elements. Thereafter, overflow washing is conducted on the substrate with pure water, and then, spin drying is performed. A temperature of the plating solution is set to 60° C. A nickel concentration in the plating solution is adjusted so that a plating rate of nickels to the amorphous silicon film 1902 is set to 2 nm/minute. When the plating is started, there is an interim period to some degree. However, by conducting the plating for 15 seconds under the above conditions, a nickel plated layer 1903 having a surface density of about $7 \times 10^{12}$ atoms/cm$^2$ is formed on the surface of the amorphous silicon film 1902.

Hereinafter, by performing the same processes as those described above as Example 13 with reference to FIGS. 19B through 19E, an n-type TFT equivalent to that obtained in Example 13 can be obtained. Since the succeeding processes are the same as those in Example 13, the description thereof is herein omitted.

The thus fabricated n-type TFT exhibits good characteristics such as a field-effect mobility in the range of 120 to 150 cm$^2$/Vs, an S value in the range of 0.2 to 0.4 V/figure, and a threshold voltage in the range of 2 to 3 V. The variation in characteristics among a number of TFTs formed on one and the same substrate 1900 is ±12% in terms of the field-effect mobility and ±8% or less in terms of the threshold voltage. Thus, a number of TFTs exhibiting a high level of uniformity and stability can be formed.

In Example 19, an active region formed on the surface of the insulating base coat film 1901 provided on the substrate 1900 contains the catalyst elements which accelerate the crystallization of the amorphous silicon film 1902 due to heating. Therefore, the crystallinity of the crystalline silicon film obtained by crystallization of the amorphous silicon film can be further enhanced as compared with that of the amorphous silicon film obtained by a general solid-phase growth method.

Since the crystallization of the amorphous silicon film 1902 due to heating is accelerated by the catalyst elements, the crystalline silicon film of high quality can be formed with good productivity. Moreover, since a heating temperature required for crystallization is limited to 600° C. or below, even inexpensive glass substrates having poor heat resistance can be used.

Moreover, since the laser light is radiated onto the active region formed of the crystalline silicon film obtained by performing the heat treatment on the amorphous silicon film 1902, the crystallinity is further improved so as to improve a field-effect mobility of carriers in the active region.

Furthermore, by setting a concentration of the catalyst elements in the active region in the range of $1 \times 10^{15}$ to $1 \times 10^{19}$ atoms/cm$^3$, it is possible to allow the catalyst elements to effectively function when the amorphous silicon film 1902 is crystallized.

In addition, in Example 19, the catalyst elements for accelerating the crystallization of the amorphous silicon film 1902 are introduced into the amorphous silicon film 1902 by plating. Equipment required for the treatment is a plating treatment vessel alone.

Since the plating is performed with a solution, the amount of catalyst elements introduced into the amorphous silicon film 1902 are controlled with high accuracy to be extremely small by a concentration, a temperature, a pH value and the like of the plating solution.

During the plating, the catalyst elements adhere to the amorphous silicon film 1902 in the plating solution so as to form the thin film plated layer 1903. Therefore, the catalyst elements are not removed from the amorphous silicon film in the subsequent washing process. Hence, the problem in a solution application method for adding the catalyst elements to the surface of the amorphous silicon film by application of the solution, that is, unevenness in the amount of introduced catalyst elements due to the irregularly dried solution, can be prevented from occurring.

As a result, the catalyst elements can be uniformly introduced into the amorphous silicon film over the entire substrate while holding the amount of the catalyst elements to a necessary and minimum amount.

Furthermore, the catalyst elements may be plated onto the amorphous silicon film by electroless plating in which the amorphous silicon film 1902 functions as catalysts of reaction. In that case, the catalyst elements are present, in principle, uniformly on the surface of the amorphous silicon film due to catalyst effect of the amorphous silicon film. Therefore, variation in terms of microscale in the amount of the introduced catalyst elements, which is likely to be generated by remaining drops of water in the drying process during spin coat, can be almost eliminated.

Furthermore, by setting a plating rate to 2 nm/minute, a substantial plating time required to form a plated layer having a thickness of 1 nm or less can be set to about 5 seconds, which is desirable value in view of reproducibility and stability of plating. As a result, it is possible to introduce the catalyst elements at an extremely low concentration with good controllability.

EXAMPLE 20

Figure 28A:
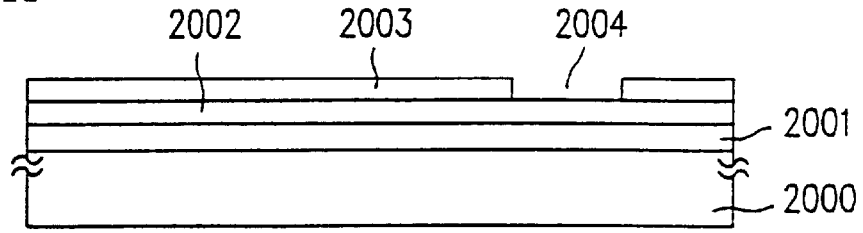
FIGS. 28A and 28B are cross-sectional views illustrating a method for fabricating a semiconductor device according to Example 20 of the present invention.
Figure 28B:
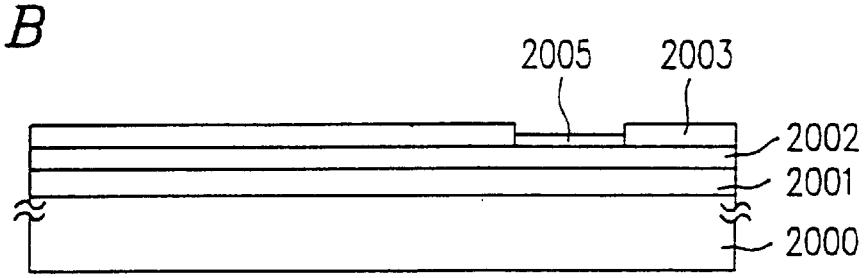

With reference to FIGS. 28A and 28B, a method for fabricating a semiconductor in Example 20 of the present invention will be described. Also in Example 20, when catalyst elements are introduced into an amorphous silicon film, plating is conducted on a surface of the amorphous silicon film.

First, as shown in FIG. 28A, a base coat film 2001 made of silicon dioxide having a thickness of about 200 nm is deposited by using a sputtering apparatus on a cleaned substrate 2000 having an insulating surface, for example, a cleaned glass substrate. Next, by low-pressure CVD or plasma CVD, an intrinsic (I-type) amorphous silicon film 2002 is deposited to a thickness of 25 to 100 nm, for example, to 80 nm.

Next, a mask layer 2003 made of a silicon oxide film, a silicon nitride film or the like is formed on the amorphous silicon film 2002. An opening 2004 is formed at a predetermined position of the mask layer 2003. The amorphous silicon film 2002 is exposed in a slit-like shape through the opening 2004, and the remaining portion remains masked.

After forming the mask layer 2003, as shown in FIG. 28B, the surface of the amorphous silicon film 2002, which is exposed through the opening 2004, is exposed to an electroless plating solution containing nickels serving as catalyst elements. In Example 20, as the electroless plating solution of nickel, a mixture of "NiBORON 5M" and "NiBORON 5B" is used ("NiBORON 5M" and "NiBORON 5B" are the general trade designations of WORLD METAL Co., Ltd. for a Ni plating solution containing a minute amount of boron). By changing a ratio of the solution of NiBORON 5M to the solution of NiBORON 5B in the electroless plating solution, it is possible to adjust a plating rate while controlling a nickel concentration in the solution. In this example, a ratio of plating solution is adjusted so that a plating rate can be 2 nm/min under the condition that a temperature of the plating solution during treatment is in the range of 40 to 50° C. and a pH value is 7.5 to 9.5. By conducting the plating for about 30 seconds under the above conditions, as shown in FIG. 28B, a nickel layer 2005 having a surface density of about $2 \times 10^{13}$ atoms/cm$^2$ is formed only on the region where the surface of the amorphous silicon film 2002 is exposed.

Hereinafter, by performing the same processes as those described above as Example 14 with reference to FIGS. 20C through 20F, a p-type TFT equivalent to that obtained in Example 14 can be obtained. Since the succeeding processes are the same as those in Example 14, the description thereof is herein omitted.

The thus fabricated p-type TFT exhibits good characteristics such as a field-effect mobility in the range of 35 to 50 cm$^2$/Vs, an S value in the range of 0.9 to 1.2 V/figure, and a threshold voltage in the range of −5 to −6 V. The variation in characteristics among a number of TFTs formed on the same substrate 2000 is ±10% in terms of the field-effect mobility and ±5% or less in terms of the threshold voltage. Thus, a number of TFTs exhibiting a high level of uniformity and stability can be formed.

In this example, when the catalyst elements are introduced into the amorphous silicon film 2002, the catalyst elements are selectively diffused by using the mask layer 2003. Therefore, the region of the amorphous silicon film 2002 corresponding to the opening 2004 is first crystallized in a selective manner. If the heat treatment is further continued, the crystal growth proceeds from the selectively crystallized region in a direction substantially parallel to the surface of the substrate 2000, thereby forming a lateral crystal growth region in the amorphous silicon film 2002. Thus, in this example, in addition to the advantages as previously described in connection with Example 19, an additional advantage of obtaining the crystalline silicon region having remarkably excellent crystallinity, as compared with that of the region in which the catalyst elements are directly introduced, is attained.

Furthermore, during the plating, the catalyst elements adhere to the amorphous silicon film in the form of the thin film plated layer which is not removed when a photo resist is removed. Thus, in a process for selectively adding the catalyst elements into the amorphous silicon film, it is possible to easily fabricate a mask layer for the selective introduction of the catalyst elements by using the photo resist, with which treatment such as patterning can be easily performed.

When TFTs are formed according to this example, TFTs having different characteristics are selectively formed by appropriately setting the carrier moving directions of the TFTs and the lateral crystal growth directions, as described above in connection with Examples 5, 6, 11, 14 and 17.

EXAMPLE 21

Figure 29A:
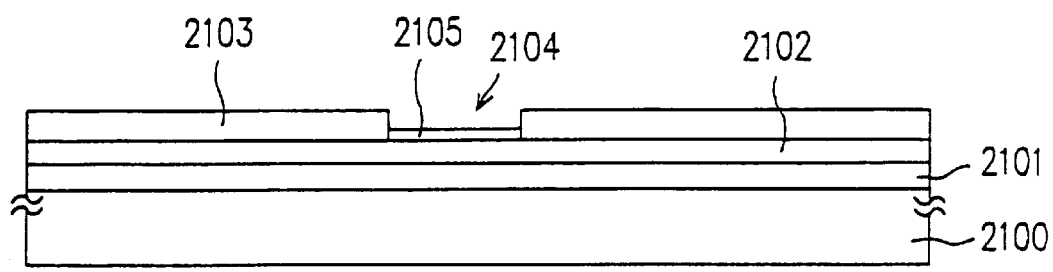
FIGS. 29A and 29B are cross-sectional views illustrating a method for fabricating a semiconductor device according to Example 21 of the present invention.
Figure 29B:
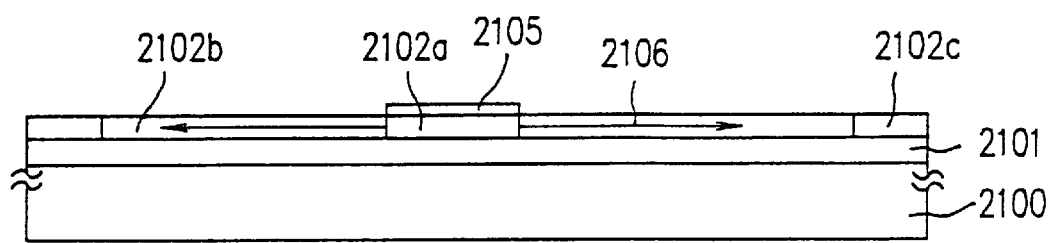

With reference to FIGS. 29A and 29B, a method for fabricating a semiconductor device in Example 21 of the present invention will be described. Also in Example 21, when catalyst elements are introduced into an amorphous silicon film, a surface of the amorphous silicon film is subject to plating. In the following description, a circuit having CMOS structure including an n-type TFT and a p-type TFT constituted in a complementary form on a glass substrate, which is used in a peripheral driver circuitry of an active-matrix type liquid crystal display device and a general thin film integrated circuit, is formed.

First, as shown in FIG. 29A, a base coat film 2101 made of silicon oxide having a thickness of about 100 nm is deposited on a glass substrate 2100 by, for example, sputtering. Next, by low-pressure CVD, an intrinsic (I-type) amorphous silicon film 2102 is deposited to a thickness of 25 to 100 nm, for example, to 50 nm.

Next, a mask layer 2103 having an opening 2104 at a predetermined position is formed by patterning a photosensitive resin material (photo resist). The region of the amorphous silicon film 2102 corresponding to the opening 2104 is exposed, and the remaining region is masked.

After forming the mask layer 2103, as shown in FIG. 29B, the surface of the amorphous silicon film 2102, which is exposed through the opening 2104, is exposed to an electroless plating solution containing nickels serving as catalyst elements. In this example, as the electroless plating solution of nickel, a mixture of "NiBORON 5M" and "NiBORON 5B" is used ("NiBORON 5M" and "NiBORON 5B" are the general trade designations of WORLD METAL Co., Ltd.). By changing a ratio of the solution of NiBORON 5M to the solution of NiBORON 5B in the electroless plating solution, it is possible to adjust a plating rate while controlling a nickel concentration in the solution. In this example, a ratio of plating solution is adjusted so that a plating rate can be 1 nm/min under the condition that a temperature of the plating solution during treatment is in the range of 40 to 50° C. and a pH value is 7.5 to 9.5. By conducting the plating for about 30 seconds under the above conditions, a nickel layer 2105 having a surface density of about $2 \times 10^{12}$ atoms/cm$^2$ is formed only on the region where the surface of the amorphous silicon film 2102 is exposed.

Thereafter, the mask layer 2103 is removed. The nickel plated layer 2105 formed on the surface of the amorphous silicon film 2102 remains unremoved.

Next, the substrate 2100, on which the respective layers are successively formed, is subjected to a heat treatment in an inert atmosphere so as to crystallize the amorphous silicon film 2102. Specifically, the heat treatment is conducted, for example, at 550° C. for 16 hours.

During the heat treatment, in the region of the amorphous silicon on which the nickel plated layer 2105 is formed so as to correspond to the opening 2104, nickels introduced into the surface of the amorphous silicon film 2102 serve as crystal nuclei. As a result, the amorphous silicon film 2102 is first crystallized in a direction perpendicular to the substrate 2100, thereby forming a crystalline silicon film 2102$a$. Furthermore, since nickels are uniformly diffused into the silicon film simultaneously with the crystallization, a nickel concentration in the amorphous silicon film 2102$a$ is typically $8 \times 10^{17}$ atoms/cm$^3$.

On the other hand, in the periphery of the crystalline silicon film 2102$a$ corresponding to the opening 2104, the crystal growth proceeds in a direction substantially parallel to the surface of the substrate 2100 as indicated with arrows 2106 in FIG. 29B, thereby forming a laterally grown crystalline silicon film 2102$b$. A nickel concentration in the laterally grown crystalline silicon film 2102$b$ is typically $3 \times 10^{16}$ atoms/cm$^3$. This value is smaller by about one digit as compared with that of the crystalline silicon film (seed region) 2102$a$ which is grown by direct introduction of nickels. The lateral crystal growth range indicated with the arrows 2106 is typically about 80 $\mu$m.

Hereinafter, by performing the same processes as those described above as Example 15 with reference to FIGS. 21C through 21E, a circuit having a CMOS structure equivalent to that obtained in Example 15 can be obtained. Since the succeeding processes are the same as those in Example 15, the description thereof is herein omitted.

In the thus fabricated circuit having a CMOS structure, TFTs exhibit good characteristics as follows. The n-type TFT has a field-effect mobility in the range of 150 to 180 cm$^2$/Vs and a threshold voltage in the range of 1.5 to 2 V. On the other hand, the p-type TFT has a field-effect mobility in the range of 120 to 140 cm$^2$/Vs and a threshold voltage in the range of –2 to –3 V.

Also in Example 21 described above, in addition to the advantages described in connection with Examples 19 and 20, it is possible to easily fabricate a mask layer for the selective introduction of the catalyst elements using the photo resist, with which treatment such as patterning can be easily performed, in the process for selectively adding the catalyst elements in the amorphous silicon film.

As described above, in Examples 19 through 21 of the present invention, when the catalyst elements are introduced into the amorphous silicon film, plating is conducted on the surface of the amorphous silicon film. Although this method is for forming a thin film, it is possible to introduce the catalyst elements only into the surface of the amorphous silicon film without using large-scale equipment having a vacuum device or the like. Furthermore, since this treatment uses a solution, it is possible to appropriately control the amount of the catalyst elements by controlling a concentration, a temperature, a pH value and the like of the plating solution, so that the catalyst elements are uniformly introduced at a low concentration. Furthermore, variation in the introduction amount of the catalyst elements in the substrate can be reduced. Specifically, the variation in the introduction amount of the catalyst elements in the substrate is within ±5% for the substrate of the size of 127 mm×127 mm.

In Examples 19 through 21, since the catalyst elements are fundamentally introduced by solution treatment, the introduction amount can be controlled by controlling the concentration of the catalyst elements in the solution. Furthermore, it is possible to conduct such solution treatment with simple equipment such as a treatment vessel.

In addition, since the catalyst elements are actually formed into a thin film on the surface of the amorphous silicon film, the catalyst elements which are present on the surface of the amorphous silicon film are not removed even if the surface is washed with pure water in the subsequent process. Thus, since the catalyst elements plated onto the amorphous silicon film is not affected by the subsequent process, the introduction amount of the catalyst elements does not depend on the drying process after application of the solution. In this point, the solution application method of the above examples differs from a conventional solution application method.

Since a method for introducing the catalyst elements using plating does not include the step using a spinner, uniformity of the introduction amount of the catalyst elements does not depend on the spinner operation. Therefore, even a substrate having such a large area that a length of a side thereof exceeds 400 mm long can be easily treated. As a result, the treatment can be conducted at low cost with a simple and easy process.

Furthermore, by plating the catalyst elements onto the surface of the amorphous silicon film, the catalyst elements are introduced only into the surface of the amorphous silicon. As a result, all the catalyst elements introduced into the amorphous silicon film effectively display the function as catalysts for crystallization.

When electroless plating in which the surface of the amorphous silicon film acts as a reaction catalyst is used, the catalyst effect of the surface of the amorphous silicon film is utilized. Hence, the catalyst elements are uniformly present, in principle, on the surface of the amorphous silicon film. As a result, the variation in terms of micro scale, which can be seen in the spin coat process, can be almost eliminated.

Furthermore, according to Examples 19 through 21, it is possible to uniformly introduce a necessary and minute amount of the catalyst elements into the entire surface of the substrate. Moreover, even if a laser light or an intense light is radiated after crystallization due to heat treatment, the catalyst elements are not precipitated. Thus, even if a substrate has a large area, the catalyst elements can be uniformly introduced into the entire surface thereof. As a result, a semiconductor device exhibiting a high level of uniformity and stability can be formed on a substrate having a large area.

In the case where the catalyst elements for accelerating crystallization are selectively introduced into the amorphous silicon film so as to cause crystal growth in a lateral direction from the region in which the catalyst elements have been introduced, it is particularly effective to use electroless plating for the following reason. In the electroless plating, plating is conducted by utilizing the catalyst effect of the surface of the amorphous silicon film as described above. Therefore, the electroless plating enables selective plating only of an exposed area of the amorphous silicon film. As a result, the catalyst elements are never introduced onto the silicon oxide which is used as the mask layer for selectively introducing the catalyst elements into the amorphous silicon film. Therefore, unlike a conventional technique, the catalyst elements introduced into the surface of the silicon oxide film do not pass through the silicon oxide film functioning as the mask layer to crystallize an undesired region of the amorphous silicon film.

Furthermore, as a material of the mask layer for selective plating, a photosensitive resin material (photo resist) which can be easily formed may be used instead of the silicon oxide film used in the above examples.

In a conventional technique, it is impossible to use a photo resist as the mask layer for the following reason. Since the photo resist does not have sufficient heat resistance, it can not endure a heat treatment for crystal growth. Therefore, in the case where the mask layer is formed of a photo resist in the conventional technique, it is necessary to remove the photo resist, followed by a heat treatment for crystallization, after selectively introducing the catalyst elements. However, when a conventional method is used in which a solution is applied, the catalyst elements added to the surface of the amorphous silicon film are also removed during the step of removing the photo resist. Therefore, in the solution application method which is the most effective to introduce the catalyst elements among conventional methods, the photo resist can not be used as the mask layer. Thus, instead of the photo resist, the silicon oxide film is used as the mask layer. Then, a heat treatment for crystallization is conducted while leaving the mask layer unremoved after adding the catalyst elements.

On the other hand, in Examples 19 through 21, the catalyst elements are plated onto the amorphous silicon film, and therefore, the catalyst elements are actually formed into a metal thin film on the surface of the amorphous silicon film. Thus, even if the photo resist alone is used as the mask layer and the photo resist is removed after the introduction of the catalyst elements before the crystallization treatment, the introduced catalyst elements are not removed together with the mask layer. Hence, it is possible to cause crystal growth thereafter. Consequently, processes such as deposition of the silicon oxide film and etching, which are required to form the mask layer in a conventional solution application method, can be omitted in the examples. Simplification of the fabrication process and reduction in cost of devices to be fabricated are more advantageously attempted as compared with conventional methods.

The amount of catalyst elements required to crystallize the amorphous silicon film corresponds to a metal film in a thin film state having a thickness of 1 nm or less. The film is so thin that it cannot be recognized as a film with the naked eye. In order to form such a thin film corresponding to an extremely minute amount of the catalyst elements by plating, it is desirable that a plating rate, that is, a thickness range of a plating layer growing for one minute, is set at 3 nm/minute or less for the following reason. In consideration of reproducibility and stability of plating, it is desired that a substantial treatment time is 5 seconds or more. In order to set a growth range of the plating film at 1 nm or less, in particular, in the range of 0.2 to 0.5 nm, for 5 seconds, a plating rate is required to be 3 nm/min or less. Although a plating rate value depends on a temperature and a Ph value of a plating solution, it can be easily adjusted mainly by varying a concentration of the catalyst elements in a plating solution. Moreover, by setting a plating rate at 3 nm/min or less, it is possible to introduce the catalyst elements at an extremely low concentration with good controllability.

As described above, in order to allow the catalyst element to effectively function for accelerating crystallization while restraining adverse influences on a semiconductor device to be formed, it is desirable that a concentration of the catalyst elements in the silicon film is in the range of $1 \times 10^{15}$ to $1 \times 10^{19}$ atoms/cm$^3$.

Hereinafter, feature of the methods for fabricating semiconductor devices, which are common to Examples 10 through 21 of the present invention described above, will be described.

When a heat treatment is conducted after selectively introducing the catalyst elements for accelerating crystallization into a predetermined region of the amorphous silicon film, crystal growth occurs from the introduced region in a lateral direction (a direction substantially parallel to the surface of the substrate). In the lateral crystal growth region, needle-like or column-like crystals exist, in which crystal growth directions are oriented to one direction (a lateral direction). On the other hand, in the region into which the catalyst elements have been directly introduced, crystal nuclei are generated in a random manner. Therefore, the former lateral crystal growth region has remarkable crystallinity as compared with that of the latter region into which the catalyst elements have been introduced. When a laser light or an intense light is radiated onto the lateral crystal growth region, crystal grain boundaries between needle-like or column-like crystals are selectively treated, thereby obtaining a crystalline silicon film in a state almost close to a single crystalline state.

Moreover, since crystallization of the amorphous silicon film due to heating is accelerated by the catalyst elements, a crystalline silicon film of high quality can be formed with high productivity. Furthermore, since a heating temperature required for crystallization is held at 600° C. or below, even inexpensive glass substrates having poor heat resistance can be used.

When a deposition method as in Examples 10 through 12, a diffusion method through a buffer layer as in Examples 13 through 15, a diffusion method from an alkaline solution as in Examples 16 through 18, or plating as in Examples 19 through 21 is used as a method for introducing the catalyst elements, it is possible to effectively promote lateral crystal growth. In the lateral crystal growth, the catalyst elements contributing to crystallization are present at the tips of the needle-like or column-like crystals, that is, the tips of the regions where crystals are in the process of growing. In other words, since the catalyst elements effectively function for crystallization, the catalyst elements are present only in the regions where the crystals are under growing and are scarcely present in the lateral crystal growth regions where the crystallization is complete. Specifically, in the case where nickel is used as a catalyst element, a nickel concentration inside the lateral crystal growth region is typically in the range of $1 \times 10^{18}$ to $5 \times 10^{18}$ atoms/cm$^3$ when an introduction method utilizing a plasma treatment is used. On the other hand, when the above method is used, a nickel concentration inside the lateral crystal growth region is typically in the range of $1 \times 10^{16}$ to $5 \times 10^{16}$ atoms/cm$^3$, which is reduced by about two digits.

In the above description, nickel is used as the catalyst element for accelerating the crystallization of the amorphous silicon film. However, a similar result can be obtained by using any one of the elements selected from a group which consists of Ni, Co, Pd, Pt, Fe, Cu, Ag, Au, In, Sn, P, As and Sb, or a combination of a plurality of the elements. These elements show a sufficient catalytic effect at a minute amount ($1 \times 10^{16}$ atoms/cm$^3$ or more) and do not adversely affect operational characteristics of a semiconductor device to be formed.

In the above description, as a method for improving crystallinity of the crystallized silicon film, the heat treatment is performed using an excimer laser, which is a pulsed laser. Alternatively, the same process can be accomplished by using other lasers (for example, a continuous wave Ar laser). Furthermore, instead of using a laser light, other techniques such as RTA (rapid thermal annealing) or RTP (rapid thermal processing) may be employed in which a workpiece is heated to high temperatures of 1000 to 1200° C. (silicon monitor temperatures) in a very short period of time using an infrared or flash lamp that provides an intense light equivalent in intensity to lasers.

The TFTs, which are formed according to respective examples, can be used not only for driver circuits and pixel portions of an active matrix type liquid crystal display device but also for elements constituting a CPU on the same substrate.

The above examples of the invention have been described assuming application of the invention to an active-matrix substrate for a liquid-crystal display. However, it will be appreciated that the semiconductor device described therein can be used in other applications as well, such as a close-contact type image sensor, a driver-monolithic thermal head, a driver-monolithic optical write device or display device using organic electroluminescent (EL) elements as light-emitting elements, and a three-dimensional IC. By utilizing the present invention for these applications, high-performance characteristics of the semiconductor devices such as a fast response, a high resolution, etc., can be achieved. Furthermore, the invention can be applied to semiconductor processes in general, not only for TFTs described in the foregoing examples but also for the whole semiconductor processes including MOS transistors and electrostatic induction transistors that use crystalline semiconductors as elements.

According to the above description, by using the crystalline silicon film formed on the substrate having the insulating surface as an active region, a semiconductor device having high-quality TFTs with uniform and stable characteristics can be formed on a large substrate in a simple and easy fabrication process. In particular, when the method of the present invention is applied to the fabrication of a liquid-crystal display device, uniformity in the characteristics of pixel switching TFTs required for an active-matrix substrate can be achieved, as well as the high performance characteristics required for TFTs constituting a peripheral driver circuitry. As a result, a driver monolithic active-matrix section (display section) can be realized in which active matrix circuitry and peripheral driver circuitry are formed on the same substrate, leading to reduced module size, increased performance, and reduced cost.

Furthermore, in the above description of Examples 1 through 21, the present invention is described, taking the case where a silicon film is used as a semiconductor film to be subjected to a crystallization treatment as an example. However, the present invention is applicable to a semiconductor film made of other materials. In such a case, the same effects as those described in connection with Examples 1 through 21 can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device, comprising the steps of:
   (a) forming an amorphous semiconductor film on a substrate having an insulating surface;
   (b) forming a predetermined layer containing a catalyst element for accelerating crystallization of the amorphous semiconductor film, on at least a portion of a surface of the amorphous semiconductor film; and (c) conducting a heat treatment so as to introduce the catalyst element into the amorphous semiconductor film in a diffused manner and to polycrystallize at least a portion of the amorphous semiconductor film, wherein the predetermined layer is a photosensitive material layer containing the catalyst element formed in an island pattern on the surface of the amorphous semiconductor film, and the catalyst element is selectively introduced from the island of the photosensitive material layer in the step (c).

2. A method according to claim 1, further comprising, after the step (b), the step of forming an island region by patterning the predetermined layer, wherein the catalyst element is selectively introduced from the island region of the predetermined layer in the step (c).

3. A method according to claim 1, wherein the predetermined layer is an insulating film which is formed by a spin-on-glass technique.

4. A method according to claim 1, wherein the predetermined layer is an insulating film which is formed by a sputtering technique.

5. A method according to claim 1, wherein the predetermined layer is an insulating film which is formed by an electron beam deposition technique.

6. A method according to claim 1, wherein the predetermined layer is an insulating film which is formed by an electrodeposition technique.

7. A method according to claim 1, wherein a concentration of the catalyst element in the predetermined layer is in a range of $1 \times 10^{18}$ to $1 \times 10^{20}$ atoms/cm$^3$.

8. A method according to claim 1, wherein the amorphous semiconductor film is an amorphous silicon film.

9. A method according to claim 1, wherein the catalyst element is at least one element selected from a group consisting of Ni, Co, Pd, Pt, Fe, Cu, Ag, Au, In, Sn, P, As and Sb.

10. A method according to claim 1, further comprising the step of forming a semiconductor device on the crystalline semiconductor film, at least a portion of which is polycrystallized, so that a carrier moving direction is substantially parallel to a crystal growth direction of the amorphous semiconductor film.

11. A method according to claim 1, further comprising the step of forming a semiconductor device on the crystalline semiconductor film, at least a portion of which is polycrystallized, so that a carrier moving direction is substantially perpendicular to a crystal growth direction of the amorphous semiconductor film.

12. A method according to claim 1, further comprising the step of forming a thin film transistor utilizing the crystalline semiconductor film, at least a portion of which is polycrystallized, as an active region.

13. A method of fabricating a semiconductor device, comprising the steps of:

(a) forming an amorphous semiconductor film on a substrate having an insulating surface;

(b) supplying a catalyst element for accelerating crystallization of the amorphous semiconductor film to at least a portion of a surface of the amorphous semiconductor film;

(c) conducting a heat treatment so as to introduce the supplied catalyst element into the amorphous semiconductor film in a diffused manner and to polycrystallize at least a portion of the amorphous semiconductor film; and wherein the step (b) further comprises the step of forming a photosensitive material containing the catalyst element in an island pattern on the surface of the amorphous semiconductor film, and the catalyst element is selectively introduced from the islandized photosensitive material in the step (c).

14. A method for fabricating a semiconductor device, comprising the steps of:

(a) forming an amorphous semiconductor film on a substrate having an insulating surface;

(b) depositing a thin film containing a catalyst element for accelerating the amorphous semiconductor film so that the thin film is in contact with at least a portion of one of an upper surface and a lower surface of the amorphous semiconductor film;

(c) conducting a heat treatment so as to introduce the catalyst element from the thin film into the amorphous semiconductor film in a diffused manner and to crystallize at least a portion of the amorphous semiconductor film;

(d) radiating a laser light or an intense light on the crystallized semiconductor film so as to improve crystallinity thereof;

(e) forming a semiconductor device using the crystallized semiconductor film as an active region;

wherein the catalyst element is at least one element selected from a group consisting of Ni, Co, Pd, Pt, Fe, Cu, Ag, Au, In, Sn, P, As and Sb, and wherein a distance between a deposition source containing the catalyst element and the substrate is set to 20 cm or more in the step (b).

15. A method according to claim 14, wherein the thin film is in contact with a predetermined region of the amorphous semiconductor film by selective deposition in the step (b), and crystal growth proceeds in a direction substantially parallel to the surface of the substrate in a periphery of the predetermined region of the amorphous semiconductor film in the step (c), thereby forming a lateral crystal growth region.

16. A method according to claim 14, wherein the deposition is performed while providing a shielding plate between a deposition source containing the catalyst element and the substrate in the step (b), the shielding plate preventing a large amount of the catalyst element from being deposited on the substrate.

* * * * *

UNITED STATES PATENT AND TRADEMARK OFFICE
CERTIFICATE OF CORRECTION

PATENT NO. : 6,162,667
DATED : December 19, 2000
INVENTOR(S) : Funai et al.

It is certified that error appears in the above-identified patent and that said Letters Patent is hereby corrected as shown below:

<u>Title page,</u>
Item [75], delete "Masashi Maekawa".

Signed and Sealed this

Fifth Day of February, 2002

Attest:

JAMES E. ROGAN
*Attesting Officer*     *Director of the United States Patent and Trademark Office*